United States Patent
Jackson et al.

(10) Patent No.: US 11,677,410 B2
(45) Date of Patent: Jun. 13, 2023

(54) SPUR REDUCTION FOR ANALOG-TO-DIGITAL CONVERTERS

(71) Applicant: PRECISION RECEIVERS INCORPORATED, Cross Junction, VA (US)

(72) Inventors: Paul K. W. Jackson, Cross Junction, VA (US); William O'Reilly, Waukesha, WI (US)

(73) Assignee: Precision Receivers Incorporated, Cross Junction, VA (US)

( * ) Notice: Subject to any disclaimer, the term of this patent is extended or adjusted under 35 U.S.C. 154(b) by 128 days.

(21) Appl. No.: 17/310,099

(22) PCT Filed: Jan. 17, 2020

(86) PCT No.: PCT/US2020/014198
§ 371 (c)(1),
(2) Date: Jul. 16, 2021

(87) PCT Pub. No.: WO2020/150670
PCT Pub. Date: Jul. 23, 2020

(65) Prior Publication Data
US 2022/0149855 A1    May 12, 2022

Related U.S. Application Data

(60) Provisional application No. 62/873,970, filed on Jul. 14, 2019, provisional application No. 62/794,413, filed on Jan. 18, 2019.

(51) Int. Cl.
*H03M 1/06* (2006.01)
*H03M 1/08* (2006.01)

(52) U.S. Cl.
CPC .................................. *H03M 1/08* (2013.01)

(58) Field of Classification Search
CPC ............. H03M 1/0626; H03M 1/1215; H03M 1/0624; H03M 1/0836; H03M 1/0629;
(Continued)

(56) References Cited

U.S. PATENT DOCUMENTS

| | | |
|---|---|---|
| 3,573,817 A | 4/1971 | Akers |
| 5,598,440 A | 1/1997 | Domagala |

(Continued)

FOREIGN PATENT DOCUMENTS

| | | |
|---|---|---|
| WO | 2016186998 A1 | 11/2016 |
| WO | 2020058980 A1 | 3/2020 |

OTHER PUBLICATIONS

PCT/US2020/014198, International Search Report and Written Opinion dated Apr. 29, 2020, 13 pages.
(Continued)

*Primary Examiner* — Linh V Nguyen
(74) *Attorney, Agent, or Firm* — Kilpatrick Townsend & Stockton LLP

(57) ABSTRACT

Methods, systems, computer-readable media, and apparatuses for spurious information reduction in a data signal are presented. One example of such an apparatus includes a data converter including a plurality of analog-to-digital converters (ADCs) and configured to produce a plurality of sampled signals, a normalizer configured to obtain a plurality of common-bandwidth signals from at least the plurality of sampled signals, and a common-mode filter configured to produce a digital output signal based on the plurality of common-bandwidth signals.

23 Claims, 27 Drawing Sheets

(58) Field of Classification Search
CPC .... H03M 1/1033; H03M 1/121; H03M 1/126; H03M 1/1285; H04B 1/0025; H04B 7/0617; H04B 7/028; H04B 7/086; H04B 7/088; H04B 7/26; H04L 27/0002; H04L 27/265; H04L 27/2651; H04L 27/38; H04L 7/0062

See application file for complete search history.

(56) References Cited

U.S. PATENT DOCUMENTS

| | | | |
|---|---|---|---|
| 5,912,927 | A | 6/1999 | Smith et al. |
| 6,351,238 | B1 * | 2/2002 | Kishigami ................ G01S 3/74 342/417 |
| 6,894,630 | B1 * | 5/2005 | Massie ................ H03M 1/0626 341/118 |
| 6,917,328 | B2 | 7/2005 | Rabinowiz et al. |
| 7,119,724 | B1 * | 10/2006 | Asami ................ H03M 1/0626 341/120 |
| 7,250,885 | B1 | 7/2007 | Nairn |
| 7,253,755 | B1 | 8/2007 | Fette |
| 7,460,615 | B2 | 12/2008 | Kunysz et al. |
| 7,593,494 | B1 | 9/2009 | Ghobrial et al. |
| 7,599,977 | B2 | 10/2009 | Ammar |
| 7,830,987 | B2 | 11/2010 | Bhoja et al. |
| 8,743,914 | B1 * | 6/2014 | Jensen ................... H04B 7/086 370/537 |
| 8,744,021 | B1 | 6/2014 | Gurney et al. |
| 9,007,251 | B2 * | 4/2015 | Perthold ............. H03M 1/0678 341/118 |
| 9,191,043 | B1 * | 11/2015 | Zhang ................ H03H 17/0273 |
| 9,252,891 | B2 | 2/2016 | Youngblood et al. |
| 9,313,072 | B2 * | 4/2016 | Katabi ...................... H04B 1/16 |
| 9,401,726 | B2 | 7/2016 | Ragab et al. |
| 9,501,087 | B1 | 11/2016 | Koeth et al. |
| 9,584,147 | B2 | 2/2017 | Glibbery et al. |
| 10,090,847 | B1 | 10/2018 | Robinson et al. |
| 10,145,872 | B2 | 12/2018 | Crooks |
| 10,367,674 | B2 * | 7/2019 | Bolstad ................ H04B 1/0025 |
| 10,735,010 | B1 * | 8/2020 | Faig ...................... H04L 7/0062 |
| 10,914,809 | B2 * | 2/2021 | Nelson ...................... G01S 3/48 |
| 2001/0025291 | A1 | 9/2001 | Leyonhjelm et al. |
| 2001/0050987 | A1 | 12/2001 | Yeap et al. |
| 2005/0003785 | A1 | 1/2005 | Jackson et al. |
| 2009/0239551 | A1 * | 9/2009 | Woodsum ................ H04B 7/26 342/377 |
| 2009/0322578 | A1 | 12/2009 | Petrovic |
| 2010/0202566 | A1 | 8/2010 | Fudge et al. |
| 2011/0134334 | A1 | 6/2011 | Stevenson |
| 2011/0227784 | A1 | 9/2011 | Beasley et al. |
| 2013/0207822 | A1 | 8/2013 | Snelgrove |
| 2015/0303984 | A1 | 10/2015 | Braithwaite |
| 2017/0134030 | A1 | 5/2017 | Mofidi et al. |
| 2017/0336450 | A1 * | 11/2017 | Cornic ................. G01R 23/167 |
| 2019/0020367 | A1 | 1/2019 | Crawford et al. |
| 2019/0113552 | A1 | 4/2019 | Crooks |

OTHER PUBLICATIONS

B. Brannon. Sampled Systems and the Effects of Clock Phase Noise and Jitter. Application Note AN-756, Analog Devices, 2004, 12 pages.

B. Brannon. Understand the effects of clock jitter and phase noise on sampled systems. EDN, Dec. 7, 2004, 6 pages.

M. E. Domínguez-Jiménez et al. Analysis and Design of Multirate Synchronous Sampling Schemes for Sparse Multiband Signals. 20th European Signal Processing Conference (EUSIPCO 2012), Bucharest, RO, Aug. 27-31, 2012, EURASIP, ISSN 2076-1465, 5 pages.

M. Fleyer et al. Multirate Synchronous Sampling of Sparse Multiband Signals. arXiv:0806.0579v1 [cs.IT], Jun. 3, 2008, 23 pages. Available Oct. 6, 2021 at https://arxiv.org/pdf/0806.0579.

M. Fleyer et al. Multirate Synchronous Sampling of Sparse Multiband Signals. IEEE Transactions on Signal Processing, vol. 58, No. 3, Mar. 2010, pp. 1144-1156.

K. Hocke et al. Gap filling and noise reduction of unevenly sampled data by means of the Lomb-Scargle periodogram. Atmos. Chem. Phys. Discuss., 8, pp. 4603-4623, 2008.

C. Lévy-Leduc et al. Frequency Estimation Based on the Cumulated Lomb-Scargle Periodogram. 23 pages. Available Oct. 6, 2021 at https://citeseerx.ist.psu.edu/viewdoc/download?doi=10.1.1.329.6253&rep=rep1&type=pdf.

X. Lin. Spurs Analysis in the RF Sampling ADC. Application Report SLAA824, Texas Instruments Inc., Feb. 2018, 9 pages.

H. Liu. ADS82x ADC with non-uniform sampling clock. Analog Applications Journal, Texas Instruments Incorporated, 4Q 2003, 7 pages.

C. Luo. Non-Uniform Sampling: Algorithms and Architectures. Ph.D. thesis, Georgia Inst. of Tech., 2012, 156 pages.

T. Neu. Impact of sampling-clock spurs on ADC performance. Analog Applications Journal, Texas Instruments Incorporated, 3Q 2009, 11 pages.

PCT/US2020/014198, "International Preliminary Report on Patentability", dated Jul. 29, 2021, 13 pages.

K. Rehfeld et al. Comparison of correlation analysis techniques for irregularly sampled time series. Nonlin. Processes Geophys., 18, pp. 389-404, 2011.

S. Traoré et al. Adaptive Multi-Coset Sampler. 4th Workshop of Cost Action IC0902 Cognitive Radio and Networking for Cooperative Coexistence of Heterogeneous Wireless Networks, Rome, Italy, Oct. 9-11, 2013, 44 pages.

J.T. VanderPlas et al. Periodograms for Multiband Astronomical Time Series. arXiv:1502.01344v1 [astro-ph.IM] Feb. 4, 2015, 34 pages.

J.T. VanderPlas. Understanding the Lomb-Scargle Periodogram. arXiv:1703.09824v1 [astro-ph.IM] Mar. 28, 2017, 55 pages.

R.J. Vega et al. Clock Jitter Effects on the Performance of ADC Devices. 2013, 6 pages.

D. Wang. Effects of Clock Spur on High-Speed DAC Performance. Application Report SLAA565A, Texas Instruments Inc., May 2015, 13 pages.

EP20741867.4, "Extended European Search Report", dated Sep. 14, 2022, 10 pages.

PCT/US2021/042119, "International Search Report and Written Opinion", dated Oct. 20, 2021, 15 pages.

Rosenthal et al., "Multi-Rate Asynchronous Sampling of Sparse Multi-Band Signals", Arxiv.org, arXiv:0807.1222v1, Cornell University Library, Jul. 8, 2008, 16 pages.

Tzou et al., "Low Cost Sparse Multiband Signal Characterization Using Asynchronous Multi-Rate Sampling: Algorithms and Hardware", Journal of Electronic Testing, vol. 31, No. 1, Jan. 30, 2015, pp. 85-98.

* cited by examiner

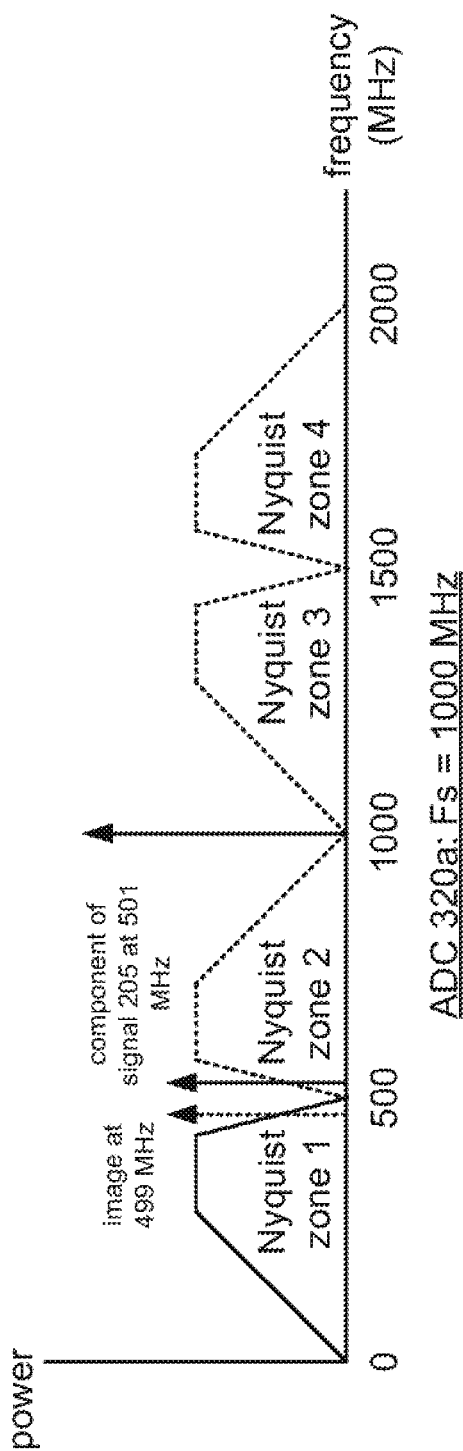
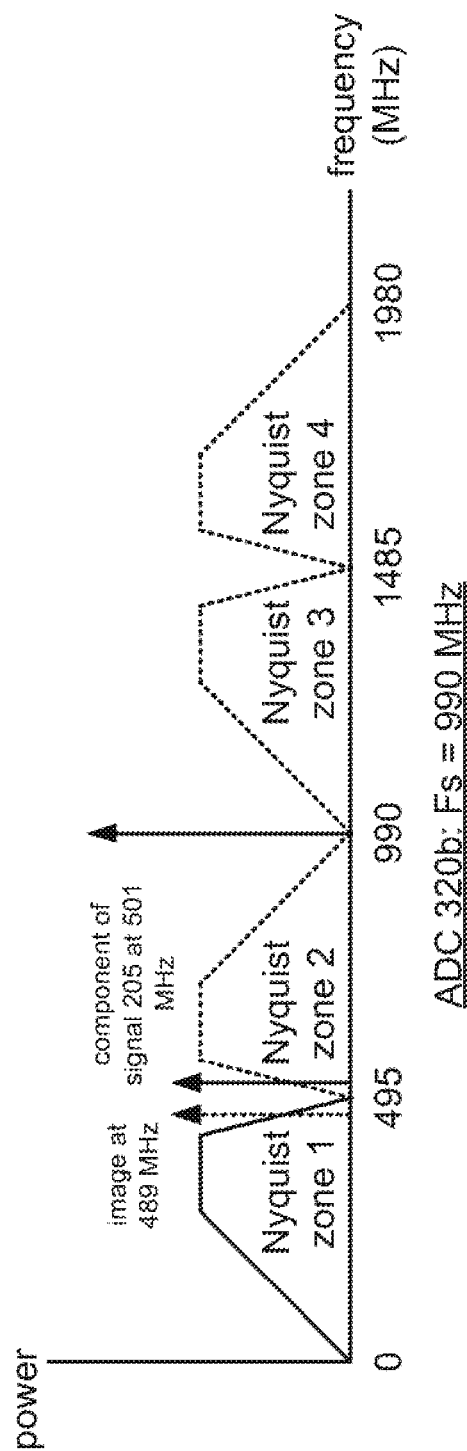
FIG. 15A
FIG. 15B

Nyquist zone 2

| Frequency component of data signal 205 | Corresponding output of ADC 320a (Fs = 500 MHz) | Corresponding output of ADC 320b (Fs = 495 MHz) | Corresponding output of ADC 320b (shifted by +10 MHz) |
|---|---|---|---|
| 495 MHz | 495 MHz | 495 MHz | 505 MHz |
| 500 MHz | 500 MHz | 490 MHz | 500 MHz |
| 501 MHz | 499 MHz | 489 MHz | 499 MHz |
| 990 MHz | 10 MHz | 0 MHz | 10 MHz |
| 1000 MHz | 0 MHz | 10 MHz | 20 MHz |

FIG. 16A

Nyquist zone 3

| Frequency component of data signal 205 | Corresponding output of ADC 320a (Fs = 500 MHz) | Corresponding output of ADC 320b (Fs = 495 MHz) | Corresponding output of ADC 320a (shifted by +10 MHz) |
|---|---|---|---|
| 990 MHz | 10 MHz | 0 MHz | 20 MHz |
| 1000 MHz | 0 MHz | 10 MHz | 10 MHz |
| 1485 MHz | 485 MHz | 495 MHz | 495 MHz |
| 1500 MHz | 500 MHz | 480 MHz | 505 MHz |

FIG. 16B

Nyquist zone 4

| Frequency component of data signal 205 | Corresponding output of ADC 320a (Fs = 500 MHz) | Corresponding output of ADC 320b (Fs = 495 MHz) | Corresponding output of ADC 320b (shifted by +20 MHz) |
|---|---|---|---|
| 1485 MHz | 485 MHz | 495 MHz | 515 MHz |
| 1500 MHz | 500 MHz | 480 MHz | 500 MHz |
| 1980 MHz | 20 MHz | 0 MHz | 20 MHz |
| 2000 MHz | 0 MHz | 20 MHz | 40 MHz |

FIG. 16C

Nyquist zone 5

| Frequency component of data signal 205 | Corresponding output of ADC 320a (Fs = 500 MHz) | Corresponding output of ADC 320b (Fs = 495 MHz) | Corresponding output of ADC 320a (shifted by +20 MHz) |
|---|---|---|---|
| 1980 MHz | 20 MHz | 0 MHz | 40 MHz |
| 2000 MHz | 0 MHz | 20 MHz | 20 MHz |
| 2475 MHz | 475 MHz | 495 MHz | 495 MHz |
| 2500 MHz | 500 MHz | 470 MHz | 520 MHz |

FIG. 16D

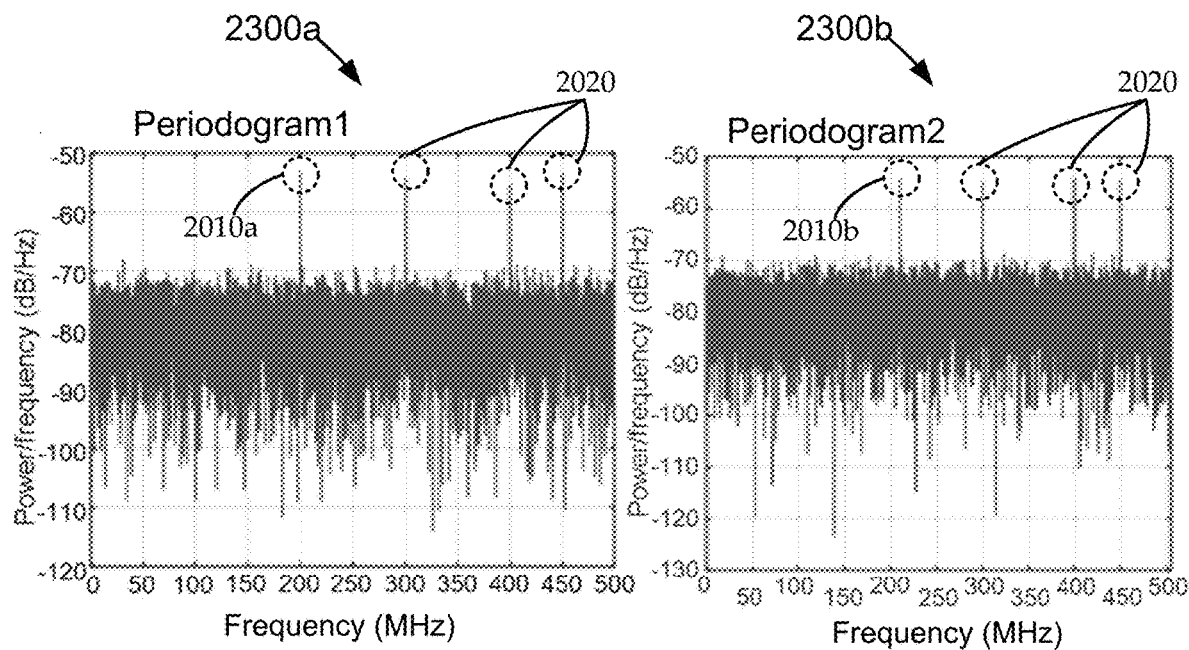
FIG. 23A
FIG. 23B
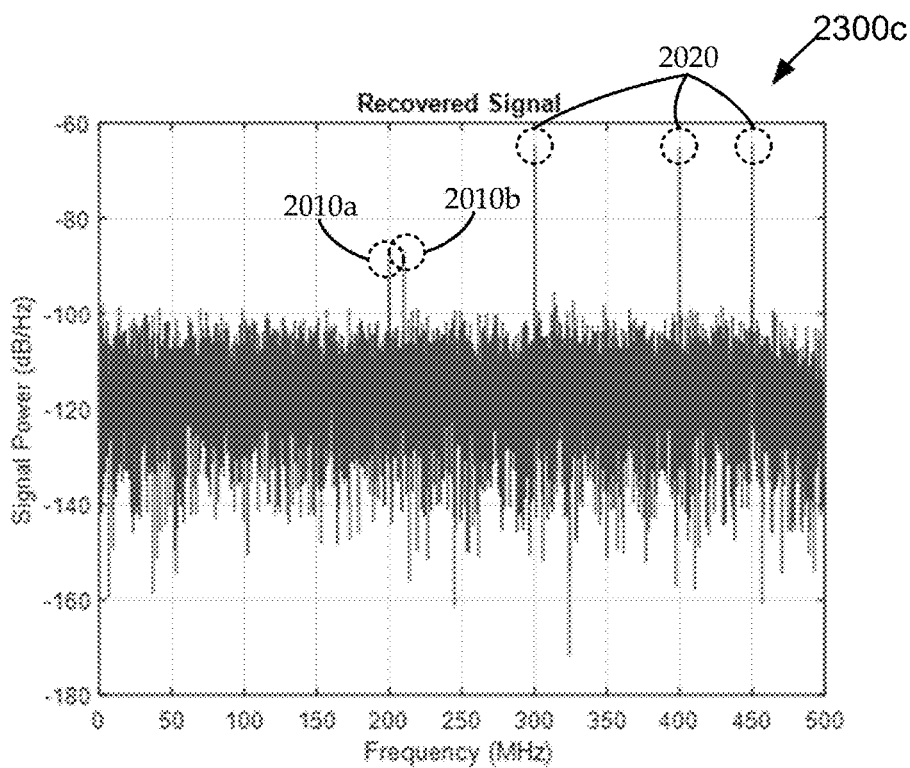
FIG. 23C

SPUR REDUCTION FOR ANALOG-TO-DIGITAL CONVERTERS

CROSS-REFERENCE TO RELATED APPLICATIONS

The present application is a U.S. National Stage of International Application No. PCT/US2020/014198, entitled "SPUR REDUCTION FOR ANALOG-TO-DIGITAL CONVERTERS," filed Jan. 17, 2020, and claims priority to U.S. Provisional Pat. Appl. No. 62/794,413, entitled "SPUR REDUCTION FOR ANALOG-TO-DIGITAL CONVERTERS," filed Jan. 18, 2019 and assigned to the assignee hereof, and the contents of which are incorporated herein by reference. The present application for Patent also claims priority to U.S. Provisional Pat. Appl. No. 62/873,970, entitled "SPUR REDUCTION FOR ANALOG-TO-DIGITAL CONVERTERS," filed Jul. 14, 2019 and assigned to the assignee hereof, and the contents of which are incorporated herein by reference.

FIELD

Embodiments relate to analog-to-digital converter circuits, and, more particularly, to novel techniques for spur reduction in analog-to-digital converter circuits.

BACKGROUND

The digital age has permeated modern life so pervasively that it is now difficult to think of an electronic device which does not utilize a digital solution. Analog to digital converters (ADC) are important to the majority of these systems, as they are used to convert analog signals into digital signals to facilitate digital processing of the signals. The analog input to an ADC is typically the output of an analog sensor (for example, an antenna, microphone, etc.) after appropriate analog amplification and analog filtering. The ADC is then used to convert the sensor data for use by a digital logical core or other processing unit (including, e.g., optical processing). Many products using ADCs have a plethora of adequate ADCs from which to choose.

High-performance ADCs are useful and practical to many fields, including in communication systems. For example, wideband communications system utilized for high data rates typically require very-high-performance ADCs, wideband surveillance systems often use cutting-edge ADCs, and radar systems often require very high sample rates and large numbers of bits for high dynamic range. Some other applications that rely on high-speed ADCs include software-definable radios (SDRs), base stations for cellular telephony or data transmission, video, display electronics, set-top boxes, digital cameras, DVDs, enhanced-definition and high-definition television including the transmission of such 2D or 3D (or more) images or signals, electronic warfare (EW) systems, laboratory and scientific test equipment and instrumentation (e.g., digital oscilloscopes and spectrum analyzers), medical patient monitoring and imaging devices (e.g., X-rays, MRI machines, CT machines, ultrasound systems, etc.), and so on.

As digital system requirements advance, the performance of the system tends to surpass the performance of the ADCs in the system such that, in these systems, the ADC effectively becomes the limiting factor in the system performance and can restrict design approaches to mitigate errors stemming from the ADCs. In some higher-performance systems, ADCs may not even perform adequately enough to realize a digital solution to system requirements. The performance limitations of ADCs often relate to their somewhat predictable but as-yet unavoidable spurious nature. For example, ADCs often output spurious frequency information (called "spurs"), which can impact the performance of the ADC by, for example, limiting dynamic range. As such, one important specification for an ADC is spurious-free dynamic range (SFDR), a measurement of the effect of spurs on performance. For example, the SFDR of a particular ADC can drive how many bits of dynamic range are available to a particular application, such as for a desired level of accuracy, stability, reliability or other metric of quality.

BRIEF SUMMARY

A method for spurious information reduction in a data signal according to a general configuration comprises receiving, by each of a plurality of analog-to-digital converters (ADCs), a corresponding one of a plurality of instances of an analog input signal. This method also comprises generating, by each of the plurality of ADCs and responsive to the receiving, a corresponding one of a plurality of sampled signals, wherein the generating comprises sampling a first of the plurality of instances of the analog input signal by a first of the plurality of ADCs at a first sampling rate to generate a first of the plurality of sampled signals, and sampling a second of the plurality of instances of the analog input signal by a second of the plurality of ADCs at a second sampling rate that is different than the first sampling rate to generate a second of the plurality of sampled signals. This method also comprises normalizing at least one signal that is based on at least one of the plurality of sampled signals to obtain, from at least the plurality of sampled signals, a plurality of common-bandwidth signals, wherein each of the plurality of common-bandwidth signals is based on at least a corresponding one of the plurality of sampled signals and comprises an ordered sequence of values. In some implementations, each value of the ordered sequence of values of a first of the plurality of common-bandwidth signals represents a same interval of a domain of the analog input signal (e.g., a time interval of a time domain, or a frequency interval of a frequency domain) as a corresponding value of the ordered sequence of values of a second of the plurality of common-bandwidth signals. This method also comprises producing a digital output signal by applying common-mode filtering to the plurality of common-bandwidth signals. Computer-readable storage media comprising code which, when executed by at least one processor, causes the at least one processor to perform such a method are also disclosed. Apparatus comprising a memory configured to store computer-executable instructions and a processor coupled to the memory and configured to execute the computer-executable instructions to perform such operations (e.g., generating a plurality of sampled signals, normalizing at least one signal to obtain a plurality of common-bandwidth signals, producing a digital output signal) are also disclosed.

An apparatus for spurious information reduction in a data signal according to a general configuration comprises a data converter, a normalizer, and a common-mode filter. In this apparatus, the data converter includes a plurality of analog-to-digital converters (ADCs), each of the plurality of ADCs being arranged to receive a corresponding one of a plurality of instances of an analog input signal, wherein each of the plurality of ADCs is configured to generate a corresponding one of a plurality of sampled signals, and wherein a first of the plurality of ADCs is configured to generate the corresponding one of the plurality of sampled signals by sampling a first of the plurality of instances of the analog input signal at a first sampling rate, and wherein a second of the plurality of ADCs is configured to generate the corresponding one of the plurality of sampled signals by sampling a second of the plurality of instances of the analog input signal at a second sampling rate that is different than the first sampling rate. In this apparatus, the normalizer is configured to normalize at least one signal that is based on at least one of the plurality of sampled signals to obtain, from at least the plurality of sampled signals, a plurality of common-bandwidth signals, wherein each of the plurality of common-bandwidth signals is based on at least a corresponding one of the plurality of sampled signals and comprises an ordered sequence of values. In some implementations, each value of the ordered sequence of values of a first of the plurality of common-bandwidth signals represents a same interval of a domain of the analog input signal as a corresponding value of the ordered sequence of values of a second of the plurality of common-bandwidth signals. In this apparatus, the common-mode filter is configured to produce a digital output signal by applying common-mode filtering to the plurality of common-bandwidth signals.

BRIEF DESCRIPTION OF THE DRAWINGS

FIGS. 15A, 15B, and 16A-D illustrate an example of Nyquist filtering, according to various embodiments.

FIG. 23A shows a plot 1200a of a frequency-domain representation of a first digital input signal.

FIG. 23B shows a plot 1200b of a frequency-domain representation of a second digital input signal.

FIG. 23C shows a plot 1200c of a frequency-domain representation of an output of common mode filter subsystem 230 of FIG. 10A, according to various embodiments.

DESCRIPTION

The performance of analog-to-digital converters (ADCs) can often be limited because of the tendency of ADCs to introduce spurious frequency information (called "spurs"). These spurs may often impact the dynamic range, or performance, of the ADC. The difference in magnitude (e.g., gain or maximum signal) between the desired output frequency and the highest-magnitude spur is often referred to as the spurious-free dynamic range (SFDR) of the ADC. A lower SFDR suggests that the ADC has lower dynamic range due to spurs, which indicates lower performance. Various approaches have been used to increase the performance of ADCs. For example, a conventional approach commutates two, three, or more ADCs during the phases of the clock cycles to increase (e.g., to double or quadruple) the data rate. Another conventional approach interleaves the voltages of two ADCs. However, these and other conventional approaches, such as dithering, have tended not to provide needed or required spur reduction, and in some instances they may even increase the number of spurs created.

Figure 1A:
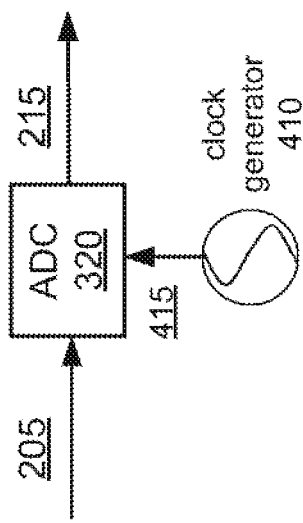
FIG. 1A shows a block diagram of a conventional arrangement of an ADC arranged to sample an analog data signal.
Figure 1B:
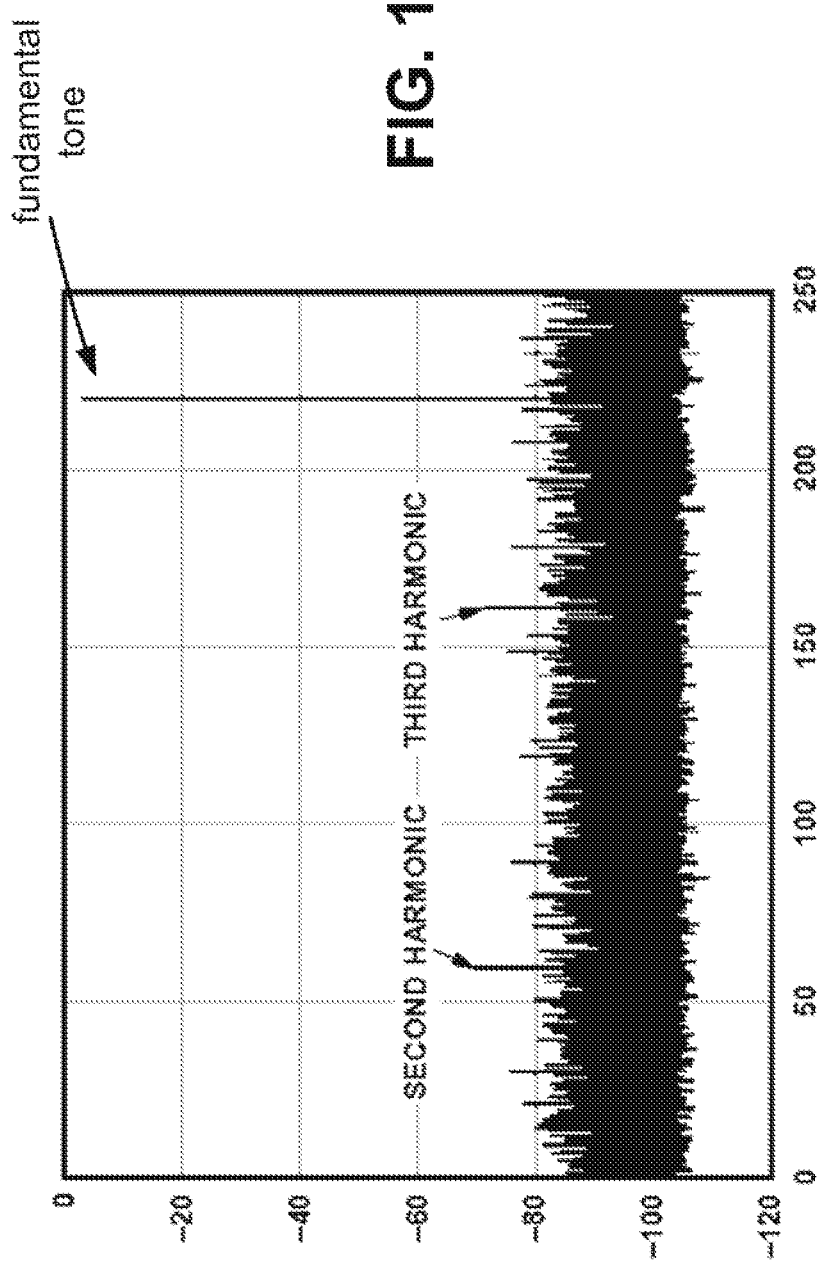
FIG. 1B shows a plot of a frequency analysis output computed from the output of an ADC as shown in FIG. 1A.

FIG. 1A shows a block diagram of a conventional arrangement of an ADC 320 arranged to sample an analog data signal 205, according to a clock signal 415 provided by clock generator 410, to produce a digital input signal 415. As one example, an input signal of 230.3 MHz is applied to a conventional ADC having a clock frequency of 500 MHz. A frequency analysis (e.g. Fourier analysis) output computed from the output of the ADC is shown in FIG. 1B as a plot of frequency (horizontal axis) versus amplitude (vertical axis). As shown, the output includes the fundamental tone at 230.3 MHz, as well as spurs at the second and third harmonics (in addition to other noise). Note that due to aliasing, the second and third harmonics (whose actual frequencies are 460.6 and 690.9 MHz, respectively) are seen as images below the fundamental frequency, as they alias or "fold" over the Nyquist frequency (i.e., 250 MHz) as determined by the clock frequency.

In ADCs, there tends to be a mathematical relationship between spurious responses and clock rate. For example, spurs will tend to be created at particular frequencies that relate to the clock rate (e.g., at harmonics or aliases of harmonics). Embodiments described herein include novel techniques for reducing spurs in an ADC. Some of these embodiments clock two or more ADCs at different clock frequencies that are derived from a common clock base (e.g., the output of an OCXO (oven-controlled crystal oscillator), TCXO (temperature-controlled crystal oscillator), or other stable oscillator) and are thus phase-coherent. For example, an input signal can be routed (e.g., split or divided) to two such ADCs (i.e., such that the two ADCs sample the same signal) and the outputs of the two ADCs can be compared (e.g., to logically or algorithmically block spurs related to the ADCs' own clocks and possibly to block other noise that is uncorrelated between the ADC outputs and non-continuous-wave). The range of embodiments also includes instances in which the different clock frequencies are not phase-coherent.

It may be desirable to select the ADC clock frequencies so that the frequencies of their harmonics (and aliased images of their harmonics or spur web) are unlikely to overlap (e.g., to avoid energy at spurs which coincide in frequency among the ADC outputs). For example, one or both ADC clock frequencies may be (but not limited to) a prime number (or near prime number) relationship. In one example, one ADC is clocked at 1000 MHz and the other ADC is clocked at 993 MHz. Various techniques can be used to determine whether a signal (e.g., a particular frequency component) is present on the output of only one of the ADCs, or on the outputs of both ADCs. For any signal present on the output of only one of the ADCs, implementations can assume that the signal was not present on the input to the ADCs, and was therefore likely generated inside the ADC. Such a signal can be considered "system-induced noise," which may include one or more of spurs, quantization errors, non-linearity, gain and/or offset errors, interleave spurs, etc. Implementations can omit such system-induced noise, and can pass through to the system output only those signals detected to be present on the outputs of both ADCs. The inventors have adopted the term "common-mode acceptance" to describe such behavior, as discussed in more detail below.

Figure 2:
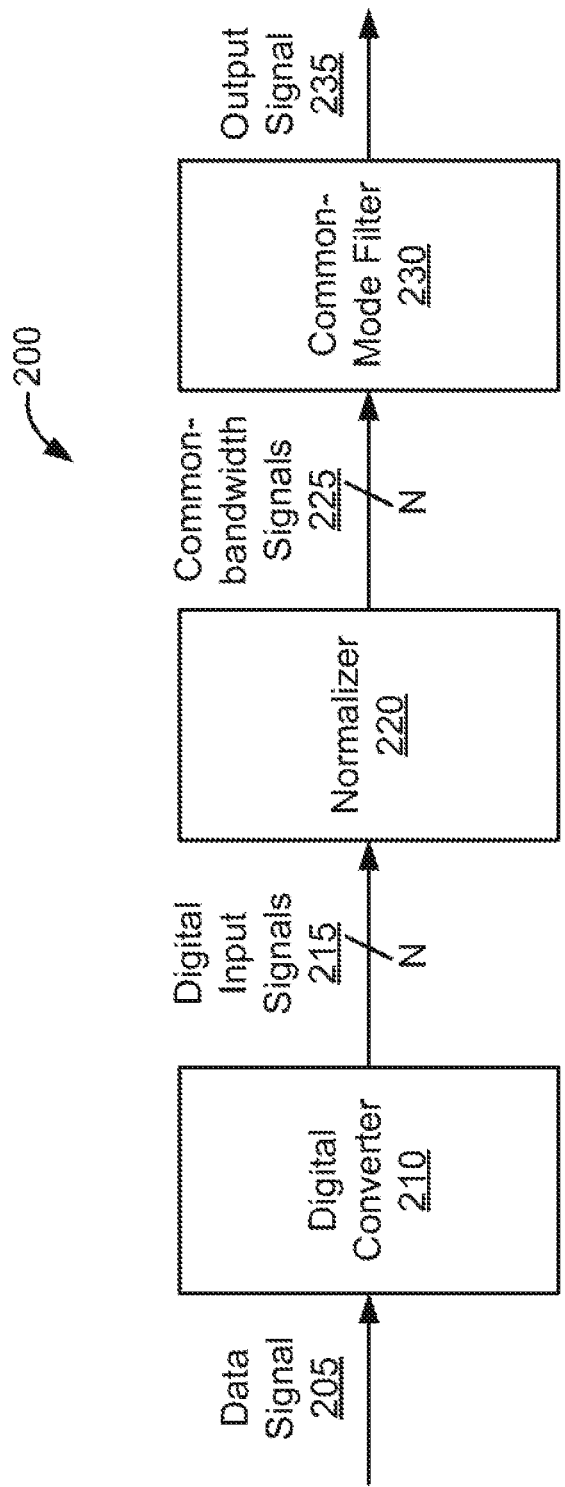
FIG. 2 shows a block diagram of an illustrative spurious information reduction system 200, according to various embodiments.

FIG. 2 shows a block diagram of an illustrative spurious information reduction system 200, according to various embodiments. As illustrated, the spurious information reduction system 200 includes a digital converter subsystem 210, a normalizer subsystem 220, and a common mode filter subsystem 230. Embodiments of the digital converter subsystem 210 include any suitable means for converting a data signal 205 (e.g., an analog input signal) into multiple digital input signals 215, such that each of the digital input signals 215 has a same frequency-encoded data profile and a different respective frequency-encoded noise profile. For example, as described herein, all the digital input signals 215 encode the same data from the data signal 205, but generation of each digital input signal 215 introduces different spurious information. In one example, a single device (e.g., a field-programmable gate array (FPGA) or other configurable logic, an application-specific integrated circuit (ASIC), etc.) includes normalizer subsystem 220 and common mode filter subsystem 230. In other examples, digital converter subsystem 210, normalizer subsystem 220, and common mode filter subsystem 230 are implemented on a common substrate or within the same chip.

Embodiments of the normalizer subsystem 220 include any suitable means for computing common-bandwidth signals 225 from the digital input signals 215 by normalizing the digital input signals 225 to have a common bandwidth. As described herein, the normalizer subsystem 220 typically receives N digital input signals 215 (N representing a positive integer greater than one), and the normalizer subsystem 220 typically outputs N common-bandwidth signals 225 corresponding to the N digital input signals 215. Embodiments of the common mode filter subsystem 230 include any suitable means for producing a digital output signal 235 by applying common-mode filtering (e.g., including any of the CMA approaches described herein) to the common-bandwidth signals 225. As described herein, the digital output signal 235 is produced to include the frequency-encoded data profile (i.e., to substantially preserve the data from the data signal 205) with an appreciable reduction in magnitude of spurious information with respect to the digital input signals 215. For example, the digital input signals 215 have corresponding input signal-to-noise ratios, and the digital output signal 235 has an output signal-to-noise ratio that is above all the input signal-to-noise ratios.

Figure 3A:
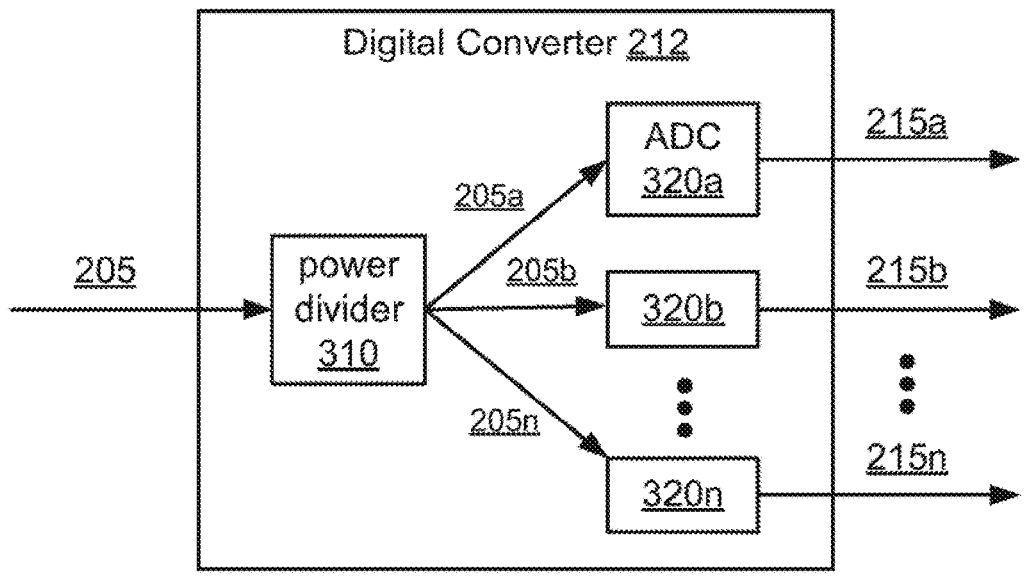
FIGS. 3A and 3B show block diagrams of illustrative implementations of digital converter subsystem 210, according to various embodiments.
Figure 3B:
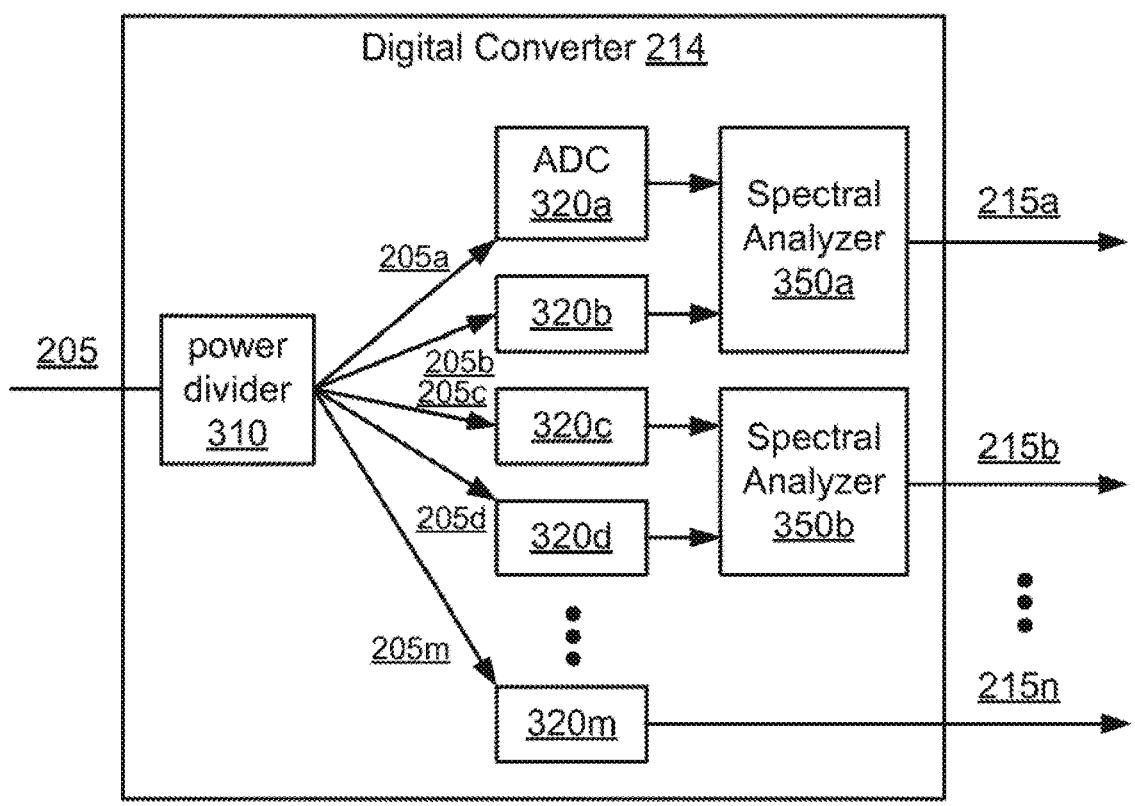

FIGS. 3A and 3B show block diagrams of illustrative implementations of digital converter subsystem 210, according to various embodiments. Turning first to FIG. 3A, an implementation 212 of the digital converter subsystem 210 is illustrated as including a power divider 310 (e.g., a power splitter), which may be active or passive, and multiple analog to digital converters (ADCs) 320a-n. An analog data signal 205 is received at an input to the power divider 310, and the power divider 310 effectively makes N substantially identical instances of the data signal 205. Each instance of the data signal 205 is coupled with the input of a corresponding one of the ADCs 320a-n. It is assumed herein that the data is frequency-encoded in the analog data signal 205, such as in a frequency-modulated (FM) radiofrequency (RF) signal. As such, frequency components of the data signal 205 typically represent data and noise, with the data-related components assumed to be at an appreciably higher magnitude than the noise-related components. In some cases, a delay or other phase adjustment may be applied to one or more of digital input signals 215 and/or one or more of common-bandwidth signals 225 to compensate for electrical length differences among ADCs 320a-n and/or the input signal paths to ADCs 320a-n.

Each of N ADCs 320a-n converts its one of N instances 205a-n of the data signal 205 into a corresponding one of N digital input signals 215a-n. The ADCs 320a-n may all be implemented using a common architecture type (e.g., flash, successive-approximation (SAR), sigma-delta, pipelined, commutated, interleaved, folding, counting, and/or integrating), or one or more of the ADCs 320a-n may be implemented using a different architecture type than the other ADCs. The conversion by each ADC 320 involves the ADC 320 sampling its instance of the data signal 205 according to a sampling rate. The terms "sampling rate," "sampling frequency," and "clock frequency" are used interchangeably herein (e.g., referring to the frequency of the clock used to trigger sampling by the ADC 320, etc.), and the terms "sample period" and "clock period" are also used interchangeably (e.g., referring to the inverse of the sampling frequency). When an ADC 320 performs its analog to digital conversion, it typically introduces spurious information (referred to as "spurs") as an artifact of the sampling. The spurious information typically manifests at frequencies relating to the sampling frequency, such as at harmonics of the sampling frequency. Thus, each ADC 320 generates its digital input signal 215 to have frequency components representing data from the data signal 205, noise from the data signal 205, spurious information introduced by the ADC 320, and other noise introduced by the ADC 320. While it can be assumed that the noise-related components are at an appreciably lower magnitude than the data-related components, the spur-related components can, at times, be at magnitudes appreciably higher than the noise-related components (possibly at similar magnitudes to the data-related components or even at much higher magnitudes).

Embodiments of the digital converter subsystem 210 clock each (or at least some) of the ADCs 320a-n using different respective clock frequencies (resulting in different sampling frequencies). For example, a first ADC 320a is clocked at a first clock frequency, and a second ADC 320b is clocked at a second clock frequency that is different from the first clock frequency. In some embodiments, the respective clock frequencies are derived from a common clock base (e.g., from the same crystal source). In some embodiments, the respective clock frequencies are mutually phase-coherent. In other embodiments, some or all of the respective clock frequencies may lack mutual phase-coherence. Because at least some of the different ADCs 320a-n are clocked with different clock frequencies, they tend to introduce respective spurious information at different frequencies. Thus, the digital input signals 215a-n from all of the ADCs 320a-n will tend to include the same data-related frequency components, but will tend to include at least some differences in respective frequency components relating to noise and spurious information.

Figure 4:
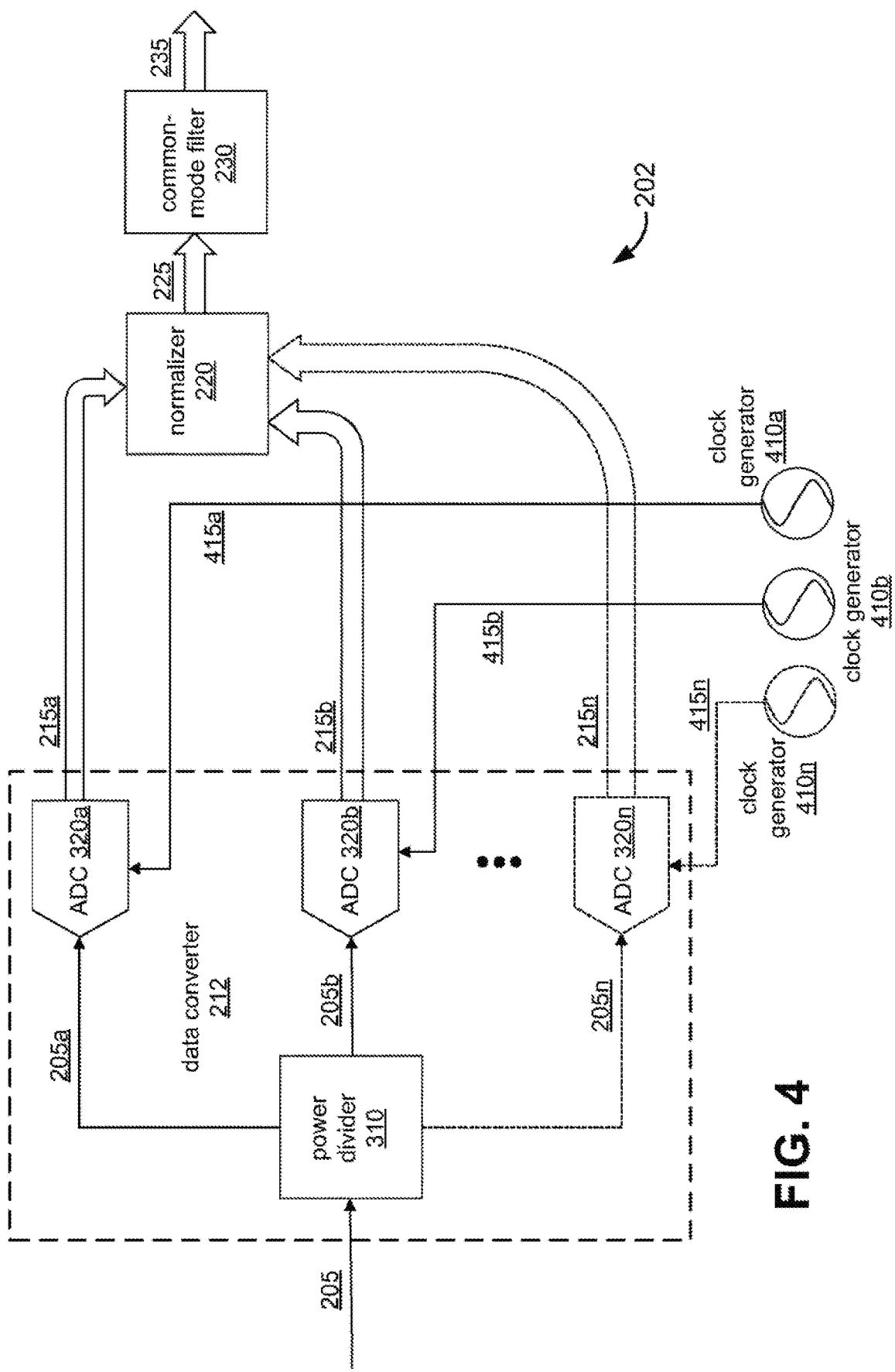
FIG. 4 shows a block diagram of an illustrative implementation 202 of system 200, according to various embodiments.

FIG. 4 shows a block diagram of an illustrative implementation 202 of system 200, according to various embodiments, that includes data converter 212. As illustrated, a signal input 205 is split to multiple ADCs 320a-n by power divider 310 (e.g., a power splitter), which may be active or passive, or another appropriate signal duplicating technique. Each ADC 320 is clocked by its own clock signal among clock signals 415a-n, each produced by a corresponding one of clock generators 410a-n (e.g., oscillators and/or synthesizers). The digital input signals 215a-n are processed by normalizer 220 and common-mode filter 230 (which may be implemented separately or together, e.g., by an FPGA (field-programmable gate array) or other suitable digital or optical processing component) to generate the spur-reduced output signal 235. In another implementation of system 202, it is possible for the width in bits of output signal 235 to be greater or less than the width of each of common-bandwidth signals 225.

Figure 5A:
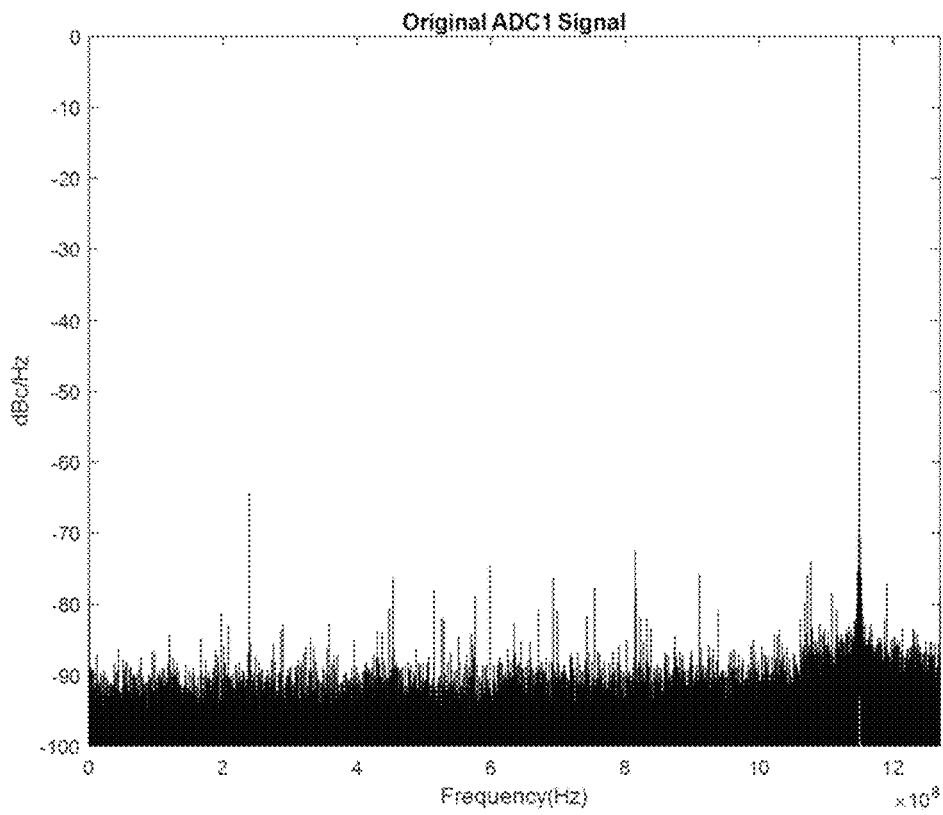
FIG. 5A shows a frequency domain output of a first ADC of a two-ADC implementation of system 202.
Figure 5B:
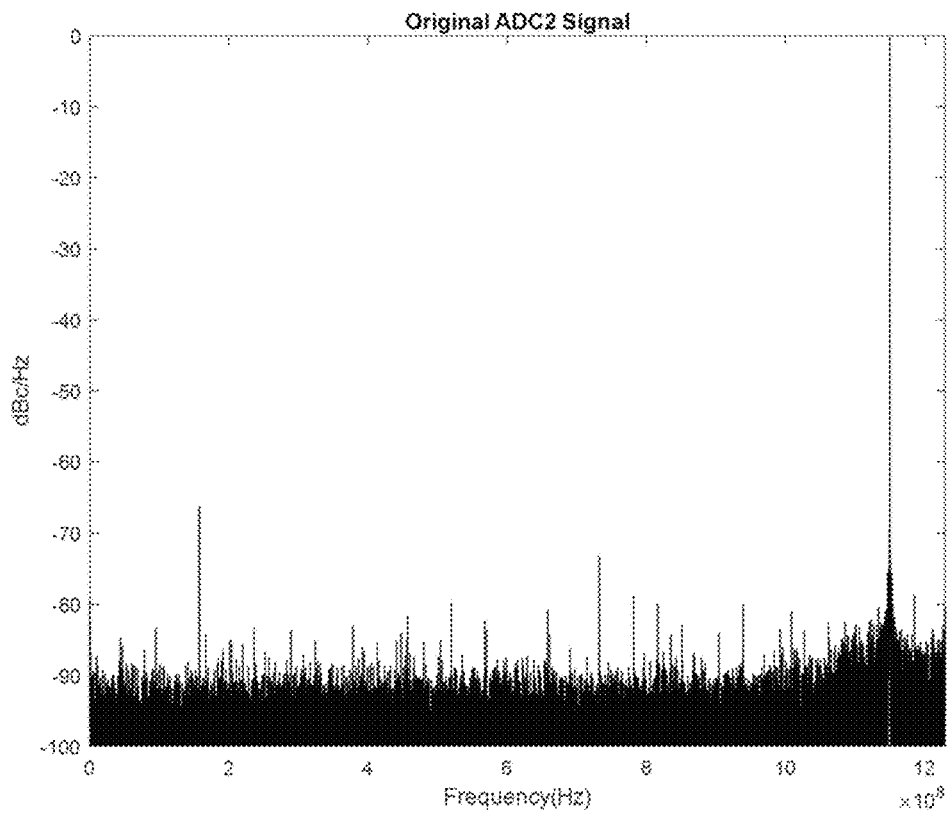
FIG. 5B shows a fast Fourier transform (FFT) output of a second ADC of a two-ADC implementation of system 202.
Figure 6:
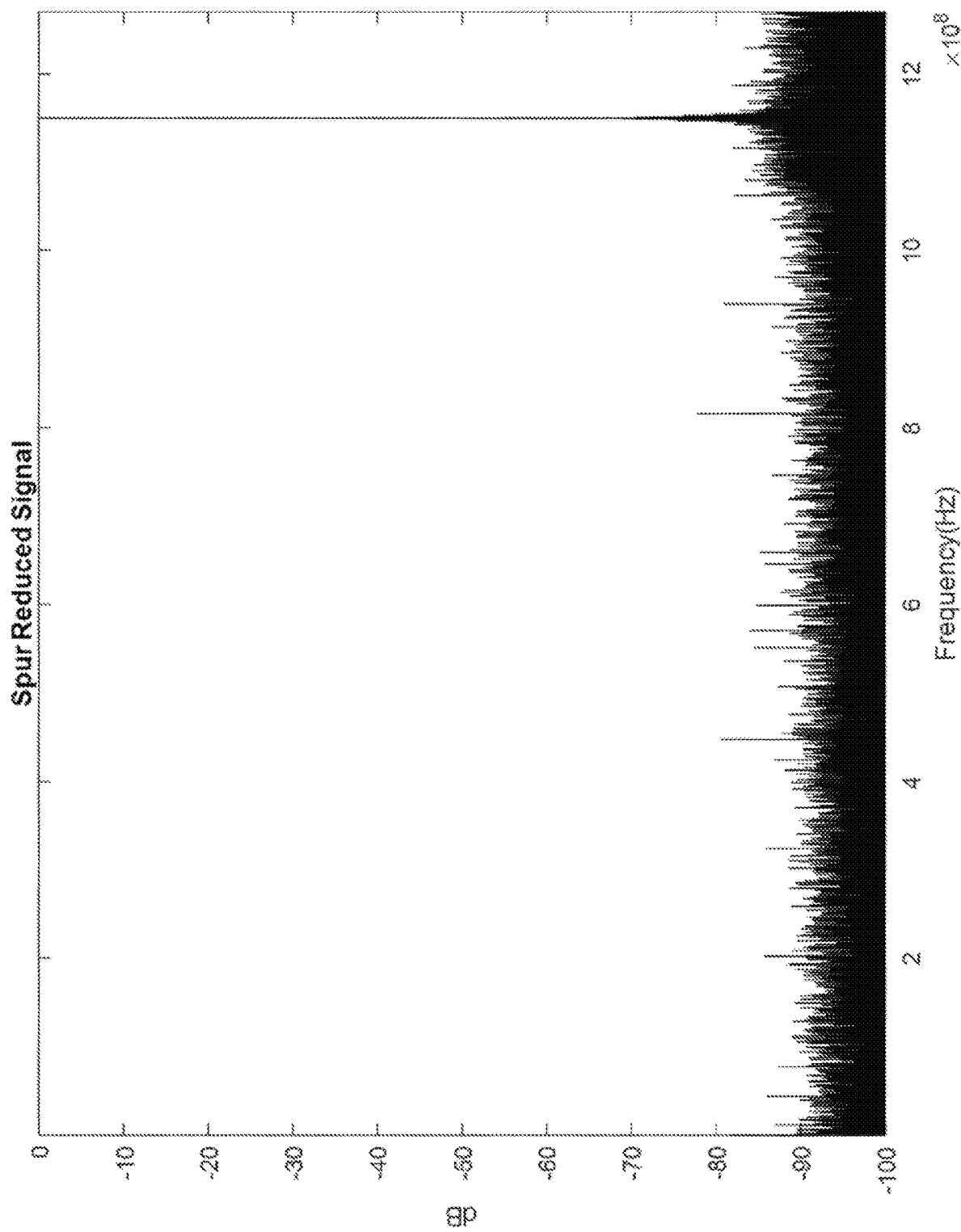
FIG. 6 shows an FFT output of a recovered signal.

For the sake of illustration, FIG. 5A shows a frequency domain output (frequency in Hz×10⁸ vs. relative signal strength in dBc/Hz) of a first ADC 320a of a two-ADC implementation of system 202 being driven at a first clock frequency of 2539.48 MHz and having an input signal with a signal component at 1150 MHz, and FIG. 5B shows a fast Fourier transform (FFT) output of a second ADC 320b of the same two-ADC implementation of system 202 being driven at a second clock frequency of 2457.6 MHz and having the same input signal (e.g., as provided by power divider 310). The two ADCs 320a,b each have an SFDR of approximately 65 dB (64.43 and 66.22 dB, respectively). Because the two clock frequencies are different (and the corresponding Nyquist frequencies are different), the harmonically related spurs appear at different frequencies for the two ADCs. By only passing or accepting components of the output signals that are shared or in common to both ADC outputs (i.e., which would include the fundamental frequency, but not any of the spurs), the SFDR can be appreciably increased. For example, FIG. 6 shows an FFT output (frequency in Hz×10⁸ vs. relative signal strength in dB) of the recovered signal (as measured in a laboratory setup), using the ADCs described by FIGS. 5A and 5B and arranged as described in FIG. 4. As shown, the recovered signal has an SFDR of 77.8 dB, with much of the spur-related noise being removed.

Figure 7:
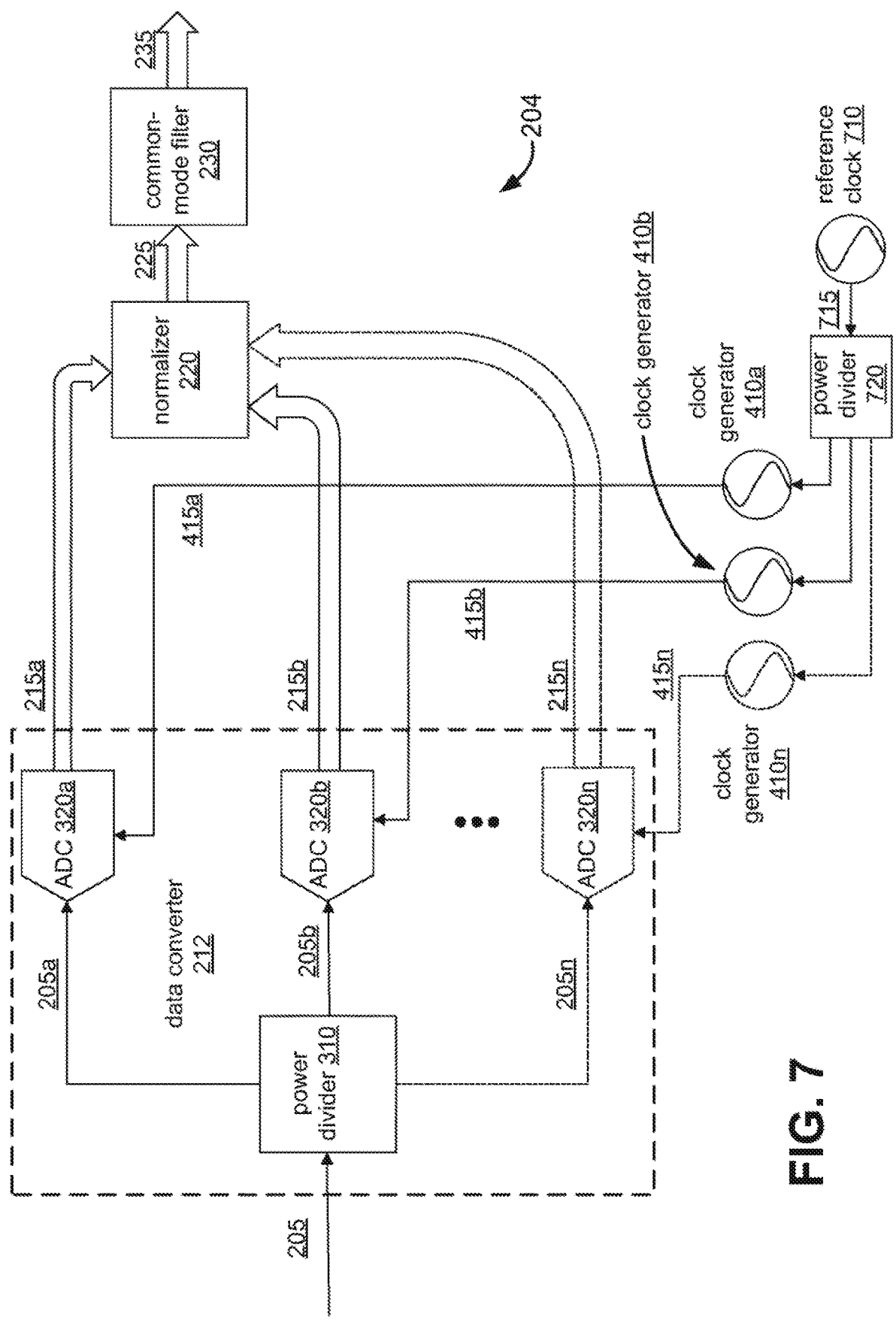
FIG. 7 shows a block diagram of an illustrative implementation 204 of system 202, according to various embodiments.

FIG. 7 shows a block diagram of an illustrative implementation 204 of system 202, according to various embodiments, that includes a reference clock 710 configured to produce a reference clock signal 715. Reference clock 710 may be implemented, for example, as an OCXO (oven-controlled crystal oscillator), TCXO (temperature-controlled crystal oscillator), another form of crystal oscillator, or another stable oscillator. System 204 also includes a power divider 720 (e.g., a power splitter), which may be active or passive, that is arranged to provide a corresponding one of n substantially identical instances of reference clock signal 715 to each of clock generators 410a-n. Each of clock generators 410a-n may be implemented, for example, as a direct analog synthesizer (also called a mix-filter-divide architecture); a direct digital synthesizer (DDS); or an indirect digital synthesizer (e.g., including a phase-locked-loop or PLL), such as an integer-N synthesizer, a fractional-N synthesizer, a digiphase synthesizer, etc. Because the clock signals 415a-n in this implementation are derived from the same reference clock 715, they may be expected to be mutually phase-coherent. Two clock signals may be considered to be phase-coherent when the phase difference between the two signals at a first point in time is the same (within a tolerance p) as the phase difference between the two signals at a second point in time, when the time interval between the first and second points is equal to the least common multiple of the clock periods of the two signals. The tolerance p may have a value of, for example, 100, 80, 60, 50, 40, 30, 25, 20, ten, eight, six, or five milliradians.

As shown above, digital converter 210 may be implemented to include a power divider or other means for making a substantially identical instance of the data signal 205 for each of the ADCs 320a-n. Alternatively or additionally, digital converter 210 may be implemented such that different instances of data signal 205 for corresponding ones of ADCs 320a-n are obtained from feeds of different respective antennas or antenna elements.

Figure 8:
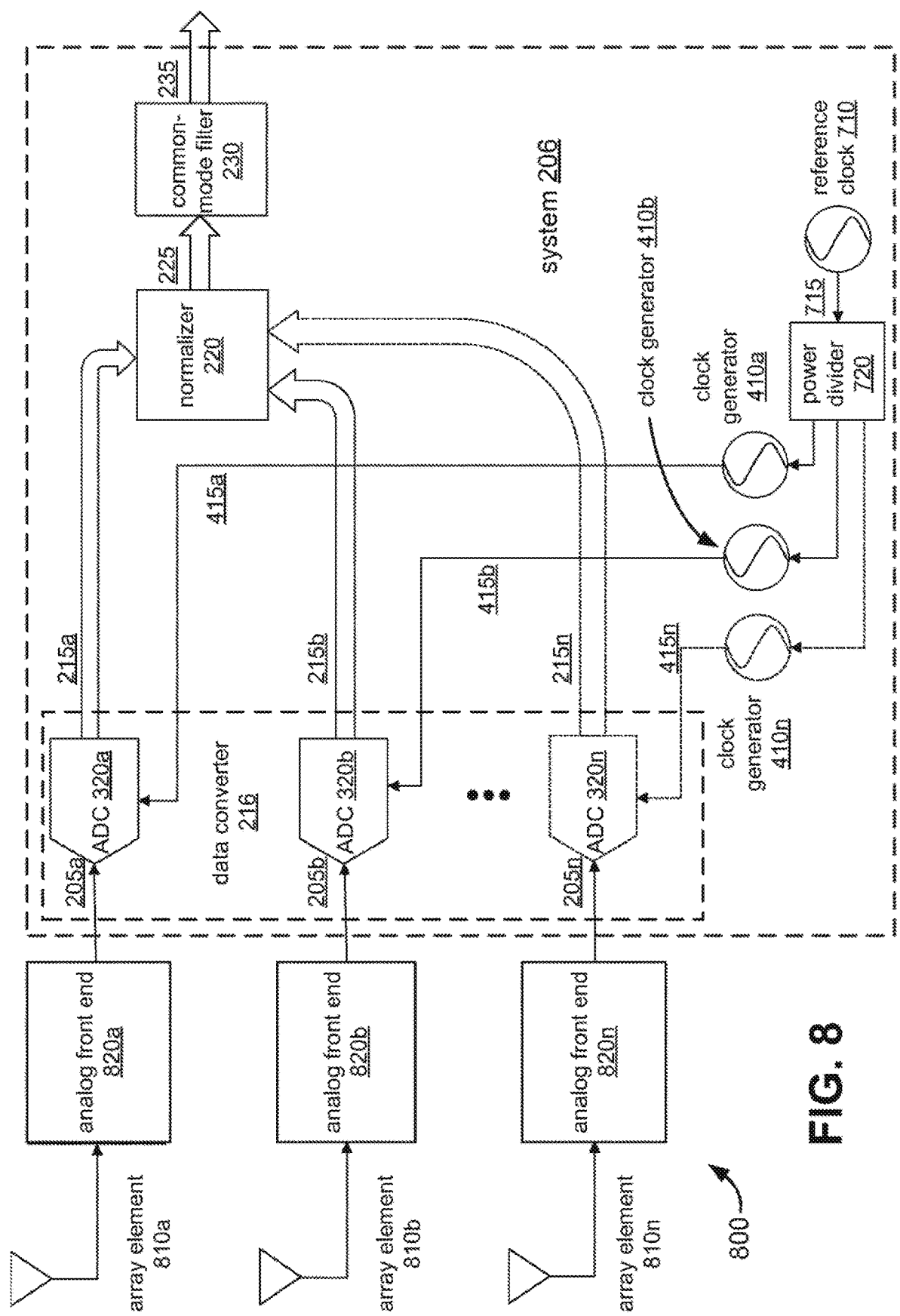
FIG. 8 shows a block diagram of a receiving system 800 that includes an illustrative implementation 206 of spurious information reduction system 204, according to various embodiments.

FIG. 8 shows a block diagram of a receiving system 800 that includes an illustrative implementation 206 of spurious information reduction system 204, according to various embodiments. System 800 includes antennas 810a-n, each coupled to a respective one of analog front ends 820a-n that receives the antenna feed and produces a corresponding one of instances 205a-n of data signal 205, and an implementation 214 of data converter 210 in which each instance 205a-n of the data signal 205 is coupled with the input of a corresponding one of the ADCs 320a-n. In this example, each of antennas 810a-n is an element of an antenna array, such as a phased array. Each of analog front ends 820a-n may include a low-noise amplifier (LNA) and/or one or more filters (e.g., a passband filter) and/or one or more other analog receiver processing components (e.g., one or more mixers, and/or one or more oscillators, and/or one or more compressive receivers, etc.).

A phased array includes several or many elements, each separated from neighboring elements of the array by some factor of a wavelength of the signal (or signals) of interest. In a two-element phased array, for example, the elements are typically separated by half of the wavelength of interest, which corresponds to a phase difference of 180 degrees. Computer processing may be used to support separating elements of a phased array by multiple wavelengths, thereby creating a larger aperture. Phased arrays come in many forms (e.g., linear arrays, planar arrays, arrays in which the elements are evenly spaced, arrays in which the elements are unevenly (e.g., logarithmically) spaced, etc.) and have proliferated even into the commercial market to the extent that all modern WiFi routers, as well as computers and cell phones, include at least one such array. In one typical form, the elements of a phased array are separated across a flat panel, but such a configuration is not a necessary feature of a phased array. One example of a flat plane phased array can easily be seen in cellular communications towers having three plane triangular base with three-antenna phased arrays. Defense implementations utilize many phased arrays, with the most complicated phased arrays currently having thousands of (e.g., more than 4000) channels.

For a signal that arrives from a direction perpendicular to the face of a planar phased array, each element of the array will receive the signal at approximately the same time. For a signal that arrives from a different direction, each element will receive the signal at a different time, depending on the signal's angle of arrival (AOA) with respect to the array, with typically only minimal differences in the amplitude of the signal as received by different elements. Because the incoming frequency is the same on each of the antenna feeds, the corresponding time shift on each respective instance 205a-n of the data signal can be thought of as a phase shift. The general formula for angle of arrival (AOA) for two elements spaced a half-wavelength apart is AOA=arctan($\phi_1-\phi_2$), where $\phi_1$ and $\phi_2$ indicate the phase angles observed at each element.

Direction finding is one use for phased arrays, and another use is beamforming, which is used in cellular towers, WiFi routers and radar. Beamforming is a way of enhancing signals that arrive from a certain direction. Enhancement comes from phase-shifting elements to be in phase for signals coming from the direction the operator desires, so that when the received power is combined, signals from the desired direction add fully to the power of the received signals and signals from other directions are not in phase. In this way, power of the desired signal from different elements accumulates and power of other signals from different elements cancels, resulting in an attenuation of those other signals.

One approach to implementing system 200 with a phased array includes implementing, for each antenna feed, at least two ADCs to sample the feed at different sampling frequencies as described herein. This approach may be used to identify and eliminate bogus signals (e.g., spurs) on a single channel, but the added complexity in SWAP (Size, Weight and Power) may not balance with the resulting performance improvements. The alternate approach shown in FIG. 8—clocking ADCs on the channels of different elements of the phased array at different sampling frequencies—does not increase the number of ADCs in the system and therefore adds little to SWAP other than the processing of the algorithm (e.g., by normalizer 220 and common-mode filter 230) and any resources which may be needed for processing.

It may be desired to preserve the phase data from each of the instances 205a-n of the data signal, which may be required to support angle of arrival (AOA) measurements on the incoming signal or beamforming. For the spur cancellation algorithm, the data may be converted by an FFT (e.g., within normalizer 220) or other frequency transform (e.g., a discrete Fourier transform (DFT), a periodogram, etc.) to get the frequency response. From the frequency responses of two (or more) different channels, common-mode filter 230 may be used to distinguish what was actually received by the antenna from noise components that were internally generated by the conversion process.

It is noted that, due to the ADC acquisition technique duration being the same, yet different clocks being used by each ADC 320, the number of acquisition data points can be different. For example, if the acquisition clock for a first one of ADCs 320a-n is 100M Hz, and the acquisition clock for a second one of ADCs 320a-n is 105 MHz, there will be 5% more data points collected for the second ADC than for the first ADC over the given time window. By digitally filtering and digitally decimating or interpolating the signal of the second ADC by a factor of 105/100, or by truncating the frequency-domain output of the higher rate (second ADC) of acquisition or zero-padding or otherwise extending the frequency-domain output of the lower rate (first ADC) of acquisition, the bandwidth of the two signals can be effectively equilibrated (e.g., so that each sample of the signal from one ADC represents the same interval of time as a sample of the signal from the other ADC, rather than a greater or lesser interval of time). However, since the respective spur frequencies of the two ADCs are a function of the acquisition clock (the ADC-specific clock), and not of the overall clock used to designate the time window (sometimes called the "relative wall clock"), the respective spurs will not line up as the respective bandwidths do. As such, embodiments can perform particular algorithms (such as what the inventors call a Common Mode Acceptance algorithm, or CMA) to allow only those frequencies in common to pass through, which can allow the desired bandwidth frequencies to pass unchanged, while blocking the spur frequencies.

Turning to FIG. 3B, an implementation 214 of digital converter subsystem 210 is illustrated as including a power divider 310 (e.g., a power splitter), which may be active or passive; multiple ADCs 320a-m; and one or more spectral analyzers 350. As in the embodiment of FIG. 3A, an analog data signal 205 is received at an input to the power divider 310. In FIG. 3B, the power divider 310 is shown as outputting M substantially identical instances 205a-m of the data signal 205, and each instance of the data signal 205 is coupled with the input of a corresponding one of M ADCs 320a-m. Embodiments can use different ADC 320 implementations to generate digital input signals 215a-m in any suitable way, such that the digital input signals 215a-m have different noise profiles. For example, as described with reference to FIG. 3A, the ADCs 320a-m can be implemented substantially identically, but clocked with different clock frequencies. Alternatively, the ADCs 320a-m can be implemented using different components, different gain, and/or other differences so as to generate signals with different noise profiles.

As illustrated, at least a portion of the ADC 320 outputs are passed to the one or more spectral analyzers 350a-b. The spectral analyzers 350a-b can apply any suitable spectral analysis technique to effectively combine the M ADC 320 output signals into a smaller number of (n) digital input signals 215 that can preserve (e.g., and/or enhance) frequency components of the ADC 320 output signals. In some embodiments, the spectral analyzers 350a-b apply a least-squares spectral analysis (LSSA) algorithm, such as the Lomb-Scargle method, which can estimate frequency information from unevenly sampled data. According to such a method, output signals from different ADCs 320 (each essentially a large set of samples spaced in time according to the respective sampling rate, or otherwise unevenly rate-sampled) can be combined to produce a large superset of unevenly spaced samples; and the LSSA algorithm can be used to generate a single corresponding digital input signal 215 with combined spectral information (i.e., combined estimated frequency components) from the combined ADC 320 output signals.

Generally, the embodiments of FIGS. 3A and 3B, and other embodiments of the digital converter subsystem 210, are used to convert the analog data signal 205 into N digital input signals 215, each having different noise profiles. It can also generally be assumed that the different manners of generating the digital input signals 215 (e.g., whether by using different sample clocks, by running combinations of signals through spectral analyzers 350), result in the digital input signals 215 having different bandwidths. Thus, the digital input signals 215 can be passed to the normalizer subsystem 220 for normalization to a common bandwidth (and possibly to a common amplitude and/or phase, as disclosed herein).

Figure 9A:
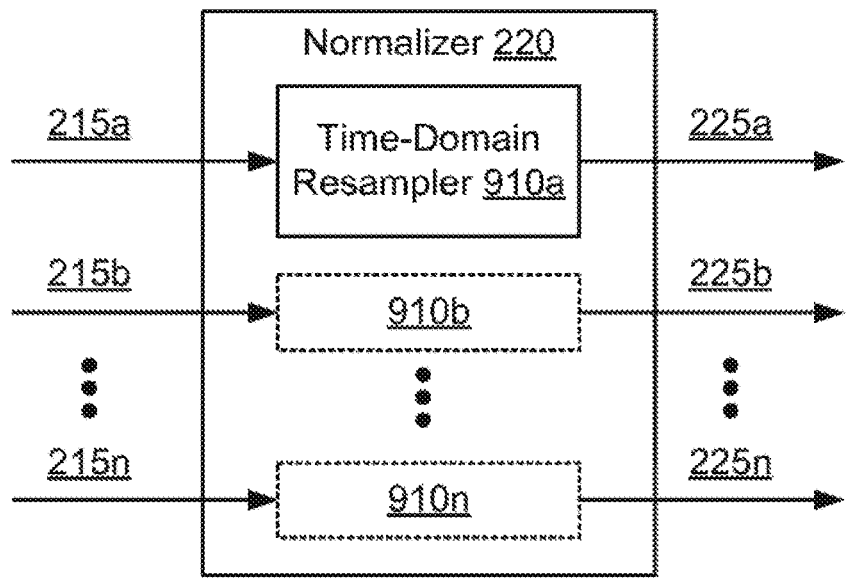
FIGS. 9A-9F show block diagrams of illustrative implementations of normalizer subsystems 220, according to various embodiments.
Figure 9B:
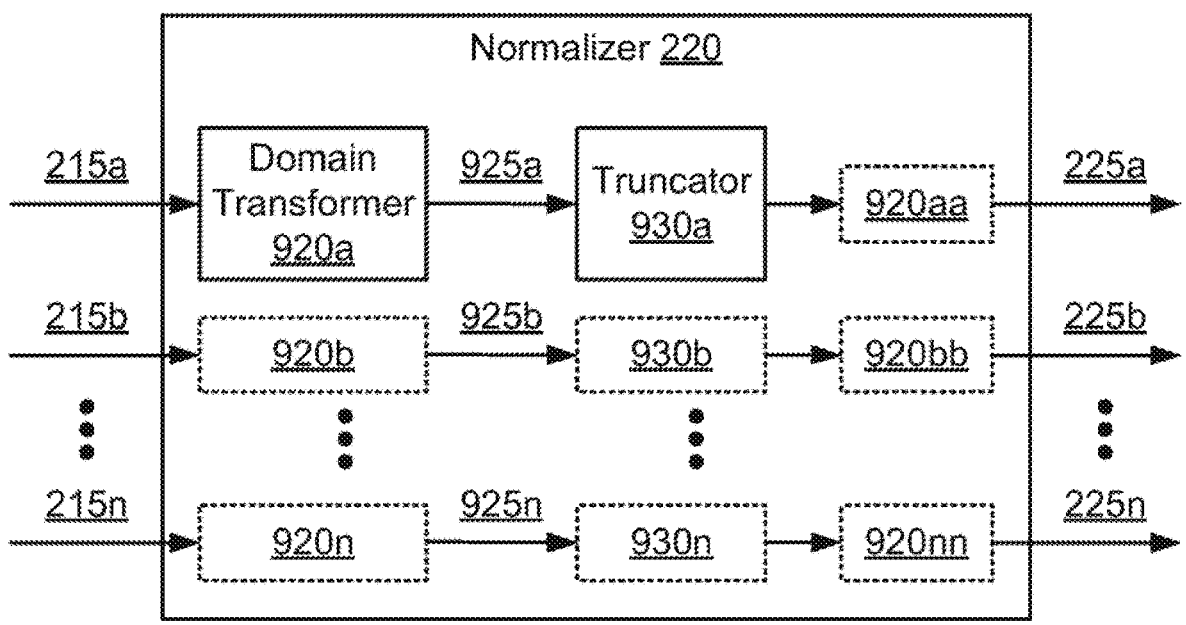

FIGS. 9A and 9B show block diagrams of illustrative implementations of normalizer subsystem 220, according to various embodiments. As described above, embodiments of the normalizer subsystem 220 compute common-bandwidth signals 225 as a function of the digital input signals 215, such that each common-bandwidth signal 225 includes the same data-related frequency components (with complex signal information, preserving phase and amplitude) and the different respective spur-related frequency components, normalized to the common bandwidth (e.g., to the same sampling rate in the time-domain, and/or to the same bandwidth per frequency bin in the frequency domain). For example, a first digital input signal 215a has a first bandwidth, a second digital input signal 215b has a second bandwidth that is different from the first bandwidth, and the normalizer subsystem 220 computes the plurality of common-bandwidth signals by resampling the first digital input signal 215a and/or the second digital input signal 215b to the common bandwidth (e.g., so that each sample of signal 225a represents the same interval of time as a corresponding sample of signal 225b, rather than a greater or lesser interval of time).

Turning first to FIG. 9A, the normalizer subsystem 220 is illustrated as including one or more time-domain resamplers 910 (i.e., some implementations can include a single time-domain resampler 910; other implementations can include multiple, but fewer than N time-domain resamplers 910; and other implementations can include N time-domain resamplers 910). In some embodiments, some or all of the time-domain resamplers 910 are interpolators, which add interpolated time-domain samples to the digital input signal 215 to effectively increase the bandwidth of the digital input signal 215. In some embodiments, some or all of the time-domain resamplers 910 remove time-domain samples from the digital input signal 215 to effectively decrease the bandwidth of the digital input signal 215. For example, if a first bandwidth of the first digital input signal 215a is smaller than a second bandwidth of the second digital input signal 215b, the first digital input signal 215a may be passed to a time-domain resampler 910 configured as an interpolator to increase the bandwidth of the first digital input signal 215a to that of the second digital input signal 215b. In this way, the normalizer subsystem's 220 computation of the common-bandwidth signals 225 involves resampling the first digital input signal 215a to the second bandwidth by time-domain interpolating the first digital input signal 215a, such that the second bandwidth is the common bandwidth.

Some implementations of the normalizer subsystem 220 apply normalization to all the digital input signals 215. For example, all the digital input signals 215 are normalized to have a common bandwidth that may be different from the bandwidths of all the digital input signals 215. Other implementations of the normalizer subsystem 220 apply normalization to fewer than all (e.g., a single one of) the digital input signals 215. In such embodiments, for any digital input signal 215 to which no normalization was applied, the corresponding common-bandwidth signal 225 may be substantially identical to the digital input signal 215. For example, some of the digital input signals 215 are normalized to the bandwidth of (e.g., re-sampled to the clock rate of) one or more others of the digital input signals 215, and those others of the digital input signals 215 are effectively left alone.

Turning to FIG. 9B, the normalizer subsystem 220 is illustrated as including one or more domain transformers 920 and one or more truncators 930. It is generally assumed that the digital input signals 215 are received as time-domain signals (i.e., a sequence of time-domain samples), and the truncators 930 operate in the frequency domain. As such, the one or more domain transformers 920 are used to transform the signals to and/or from the frequency domain, as needed or desired to support use of the truncators 930. In some implementations, fewer than all of the digital input signals 215 are converted to the frequency domain and processed in the frequency domain. In some such implementations, the processed signals are converted back to the time domain to match the domain of the unprocessed signals. For example, a single digital input signal 215a is passed to a single domain transformer 920a, which generates a corresponding single frequency-domain signal 925a; the frequency-domain signal 925a is passed to a single truncator 930a; and the output of the truncator 930a is passed through another domain transformer 920aa to generate a corresponding one of the common-bandwidth signals 225a back in the time domain (i.e., matching the domain of the other common-bandwidth signals 225). In other such implementations, the processed signals are kept in the frequency domain, and the unprocessed signals are converted to the frequency domain to match the domain of the processed signals. For example, all the digital input signals 215 are passed to corresponding domain transformers 920, which generate corresponding frequency-domain signals 925; and one of the frequency-domain signals 925a is passed to a corresponding truncator 930a (i.e., all the common-bandwidth signals 225 being output in the frequency domain). Because one ADC may produce more time-domain samples from signal 205 than another ADC over the same time interval, it may be desired to implement one or more of the domain transformers 920 to perform an FFT having a length that is not a power of two (e.g., an FFT having a radix other than 2).

In other implementations, all the digital input signals 215 are converted to the frequency domain and processed in the frequency domain (e.g., as ordered sequences of values that each indicate information (e.g., amplitude and phase) of the signal 205 for a corresponding frequency interval or "bin"). For example, all the digital input signals 215 are passed to corresponding domain transformers 920, which generate corresponding frequency-domain signals 925; and the frequency-domain signal 925 are all passed to corresponding truncators 930. In some such implementations, the signals are left in the frequency domain; the common-bandwidth signals 225 are the outputs of the truncators 930. In other such implementations, the signals are returned to the time domain; the outputs of the truncators 930 are passed through other corresponding domain transformers 920 to generate a corresponding ones of the common-bandwidth signals 225 in the time domain.

As noted above, because one ADC may produce more time-domain samples from signal 205 than another ADC over the same time interval, the corresponding signals 925a,b may have different lengths in the frequency domain as well. Embodiments of the truncators 930 operate to increase or decrease the bandwidths of one or more of the digital input signals 215, in the frequency domain, to the common bandwidth. For example, some implementations of the truncators 930 can truncate all spectral information outside of a defined range of frequencies, thereby effectively reducing the bandwidth of a signal (e.g., by increasing the width of each frequency bin). Though referred to as a "truncator," other implementations of the truncators 930 can expand the spectral information to effectively increase the bandwidth of a signal. For example, such a truncator 930 can extrapolate frequency information, generate random frequency information (e.g., low-power information to effectively extend the noise spectrum of the signal), and/or otherwise expand the spectral range. In one example, a first bandwidth of the first digital input signal 215a is larger than a second bandwidth of the second digital input signal 215b, and the first digital input signal 215a is passed to a truncator 930 configured to truncate the spectral range of the first digital input signal 215a, thereby decreasing the bandwidth of the first digital input signal 215a (e.g., by increasing the width of each frequency bin) to match that of the second digital input signal 215b (e.g., so that each value of signal 225a represents the same frequency bin as a corresponding value of signal 225b, rather than a bin that is wider or more narrow). In this way, the normalizer subsystem's 220 computation of the common-bandwidth signals 225 involves resampling the first digital input signal 215a to the second bandwidth by frequency-domain truncating the first digital input signal 215a, such that the second bandwidth is the common bandwidth.

As described above, each of the common-bandwidth signals 225 computed by the normalizer subsystem 220 has a common bandwidth, includes the same data-related frequency components (i.e., corresponding to those originating in the data signal 205), and different respective spur-related frequency components (i.e., corresponding to the spurious information from corresponding digital input signals 215). Embodiments can produce a digital output signal 235 by applying common-mode filtering to the common-bandwidth signals 225, such that the data-related frequency components are at respective power levels that exceed a floor level, and the spur-related (and other noise-related) frequency components are at respective power levels below the floor level.

It may be desired for the plurality of common-bandwidth signals 225a-n to also be normalized with respect to a reference phase and/or amplitude (e.g., a phase and amplitude of a reference channel, or of an unnormalized one of the plurality of common-bandwidth signals), so that each of the plurality of common-bandwidth signals also has the same phase and amplitude. Such normalization may be performed, for example, as part of a calibration process to compensate for differences among channels in the system or apparatus.

In one example, a phase of one or more signals is calibrated to compensate for one or more differences between channels that may cause a relative phase shift between the signals, such as a difference in propagation delay (as may be caused by, e.g., line lengths between different paths in the system or apparatus). In another example, an amplitude of one or more signals is calibrated to compensate for different gain responses of ADCs 320a-n, to compensate for amplitude differences among outputs of power divider 310, and/or to compensate for differences in the frequency responses of different paths in the system or apparatus (which may be frequency-dependent)

Additionally or alternatively, it may be desired to normalize phase and/or amplitude in a phased-array system, as differences among the antenna elements and/or analog front ends may introduce respective phase and/or amplitude differences among the channels. In another example, signal power may be expected to decrease as the incoming signal moves outside of the main lobe of the array response, and it may be desired to amplitude-normalize to compensate for this decrease (which may be frequency-dependent).

Figure 9C:
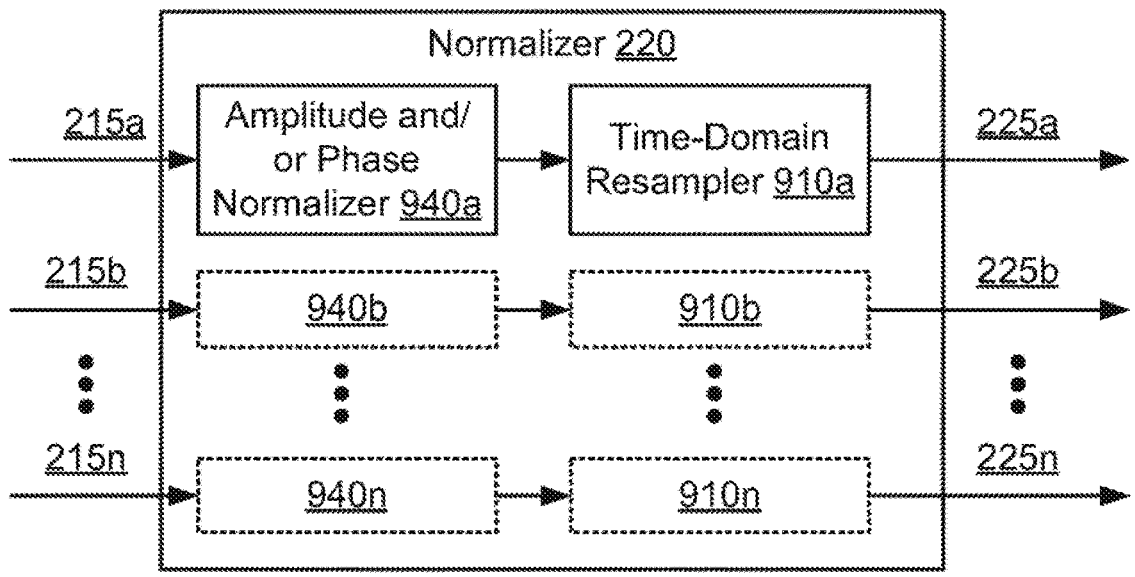
Figure 9D:
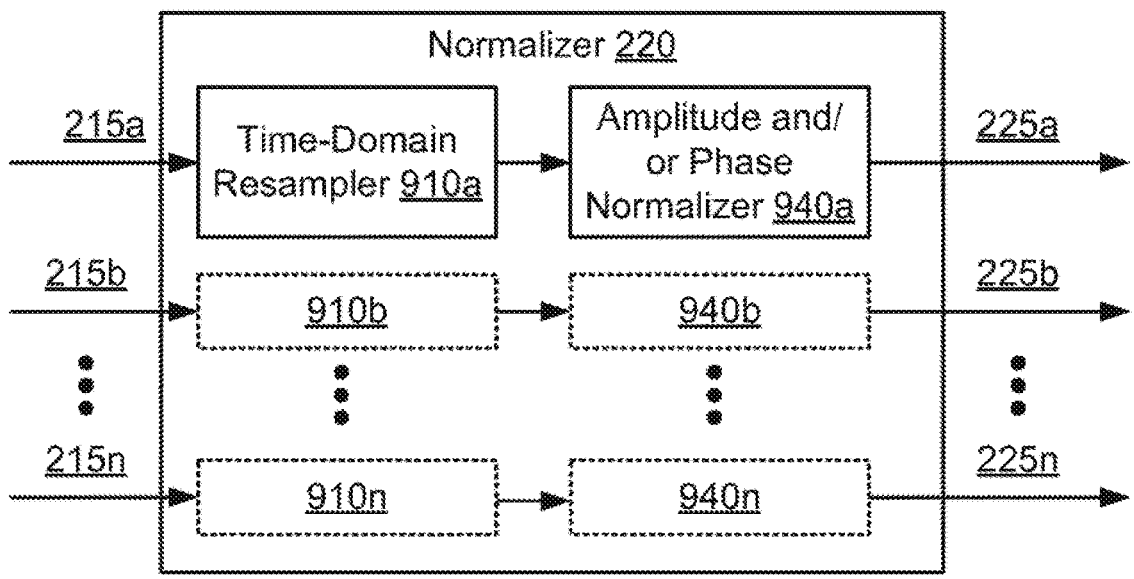

Turning now to FIGS. 9C and 9D, the implementations of normalizer subsystem 220 are illustrated as including one or more amplitude and/or phase normalizers 940 (i.e., some implementations can include a single amplitude and/or phase normalizers 940; other implementations can include multiple, but fewer than N amplitude and/or phase normalizers 940; and other implementations can include N amplitude and/or phase normalizers 940). In FIG. 9C, the one or more amplitude and/or phase normalizers 940 are arranged to compensate a phase and/or amplitude of the corresponding digital input signal 215 before time-domain resampling, and in FIG. 9D, the one or more amplitude and/or phase normalizers 940 are arranged to compensate a phase and/or amplitude of the corresponding common-bandwidth signal 225 after time-domain resampling. In some embodiments, some or all of the amplitude and/or phase normalizers 940 are configured to apply a digital gain to the corresponding signal to compensate the signal amplitude. In some embodiments, some or all of the amplitude and/or phase normalizers 940 are configured to vary a relation between the I and Q components of the corresponding signal to compensate the signal phase. Further implementations of normalizer subsystem 220 in which one channel is time-domain resampled and is not normalized in amplitude and/or in phase, and another channel is normalized in amplitude and/or in phase and is not time-domain resampled, are also possible.

Figure 9E:
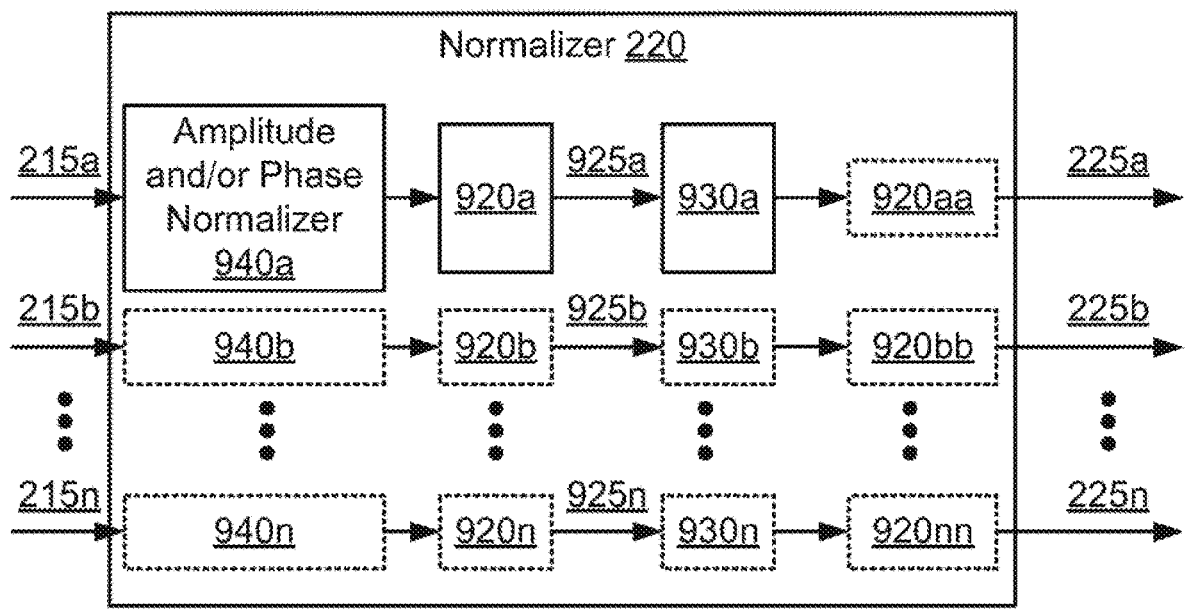
Figure 9F:
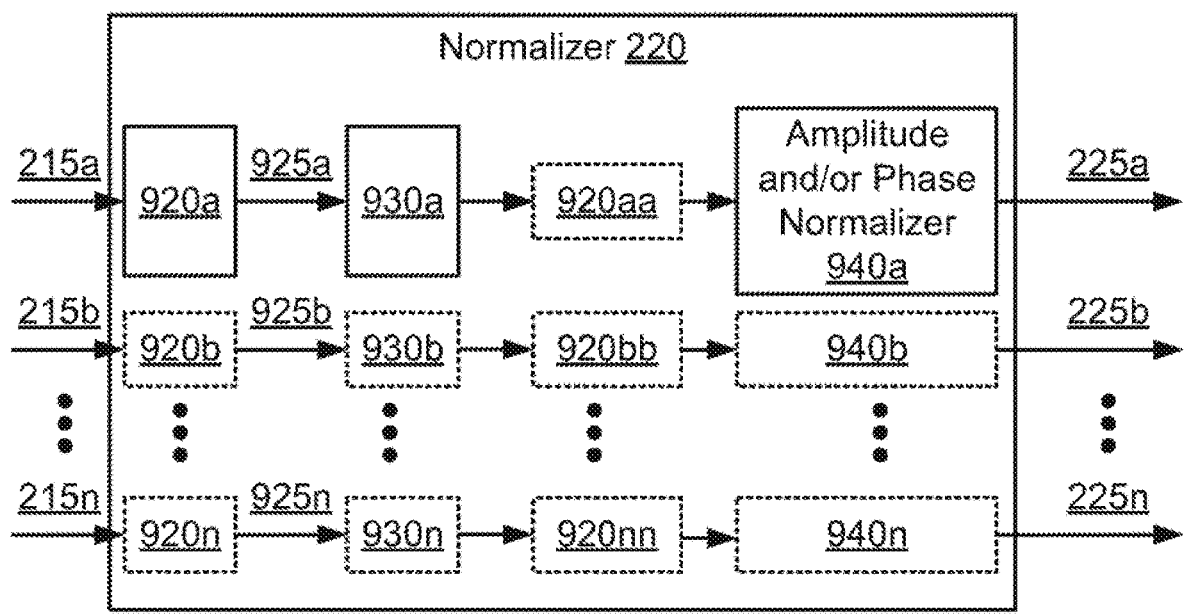

Turning now to FIGS. 9E and 9F, the implementations of normalizer subsystem 220 are illustrated as including one or more amplitude and/or phase normalizers 940 (i.e., some implementations can include a single amplitude and/or phase normalizers 940; other implementations can include multiple, but fewer than N amplitude and/or phase normalizers 940; and other implementations can include N amplitude and/or phase normalizers 940). In FIG. 9E, the one or more amplitude and/or phase normalizers 940 are arranged to compensate a phase and/or amplitude of the corresponding digital input signal 215 before domain transformation, and in FIG. 9F, the one or more amplitude and/or phase normalizers 940 are arranged to compensate a phase and/or amplitude of the corresponding common-bandwidth signal 225 after transformation back to the original domain (e.g., the time domain). In some embodiments, some or all of the amplitude and/or phase normalizers 940 are configured to apply a digital gain to the corresponding signal to compensate the signal amplitude. In some embodiments, some or all of the amplitude and/or phase normalizers 940 are configured to vary a relation between the I and Q components of the corresponding signal to compensate the signal phase. Further implementations of normalizer subsystem 220 in which one channel is truncated and is not normalized in amplitude and/or in phase, and another channel is normalized in amplitude and/or in phase and is not truncated, are also possible.

In further embodiments, the one or more amplitude and/or phase normalizers 940 are arranged to compensate a phase and/or amplitude of the corresponding transformed signal 925 in the transform domain (e.g., before and/or after truncation). In order to support phase-shifting operations, such as phase normalization as described herein, it may be desired to preserve the complex nature of analog data signal 205 (i.e., the distinction between the I (real) and Q (imaginary) components of the signal). It may be desired, for example, to implement the one or more domain transformers 920 to use an appropriate frequency transform, such as a complex FFT.

FIGS. 10A, 10B, 11A, and 11B show block diagrams of illustrative implementations of common mode filter subsystem 230, according to various embodiments. As described with reference to FIGS. 9A and 9B, different embodiments of the normalizer subsystem 220 can output the common-bandwidth signals 225 in the time domain or in the frequency domain. Further, various embodiments of the common mode filter subsystem 230 can operate in the time domain or in the frequency domain. As such, some implementations can be domain-matched, such that time-domain common-bandwidth signals 225 are generated by the normalizer subsystem 220 to be inputs to embodiments of the common mode filter subsystem 230 that operate in the time domain, and/or frequency-domain common-bandwidth signals 225 are generated by the normalizer subsystem 220 to be inputs to embodiments of the common mode filter subsystem 230 that operate in the frequency domain. Other implementations can be domain-unmatched, such that common-bandwidth signals 225 are generated by the normalizer subsystem 220 in a different domain than the operating domain of the common mode filter subsystem 230. Still other implementations may be partially domain-unmatched, where the outputs of the normalizer subsystem 220 include some common-bandwidth signals 225 generated to be in the time domain and others generated to be in the frequency domain. In any such domain-unmatched, or partially domain-unmatched, implementations, one or more domain transformers 920 can be provided at one or more corresponding inputs of the common mode filter subsystem 230 to effectively ensure that the received signals match the operating domain of the common mode filter subsystem 230. Similarly, though not explicitly shown, some embodiments of the common mode filter subsystem 230 can include a domain transformer 920 at the output of the common mode filter subsystem 230, such that the digital output signal 235 is output in a desired domain (e.g., or in both time and frequency domains).

The class of CMA algorithms, both parametric and non-parametric, can involve decimating or interpolating one of the ADC time-series signal (S2) so that it matches the other ADC time-series signal (S1), although the class also includes algorithms for which such matching is not required. In one embodiment, a cross-correlation analysis or cross-power spectra (e.g., but not limited to, a biased cross-correlation) can be applied, and the output of the cross-correlation becomes a new digital signal. The new digital signal (S1×S2) is a time series that is a hybrid of S1 and S2 from a frequency perspective, represented in the time series. Performing an FFT on S1×S2 yields a new frequency domain data set that does not have the spurs of S1 and S2 represented, but does maintain the signal for S1 and S2 (which should be identical to the digital limits of the system).

In another example of the class of CMA algorithms, we include applying a voting algorithm to the ADC output signals in an FFT domain (e.g., passing only bins that are determined to have signal energy in all ADC outputs, or in a predetermined majority of the ADC outputs; passing the minimum ADC output for each bin; etc.). Domains of periodogram-based techniques other than FFT may be used as well. In other examples, the CMA algorithms use different methods of spectral analysis to determine frequency content in each of the ADC outputs. Examples of such methods include the maximum-entropy method of Burg, the Blackman-Tukey method, Capon, EigenVector, MUSIC, and methods of autoregressive modeling with moving-average terms (e.g., ARMA, ARIMA).

Figure 10A:
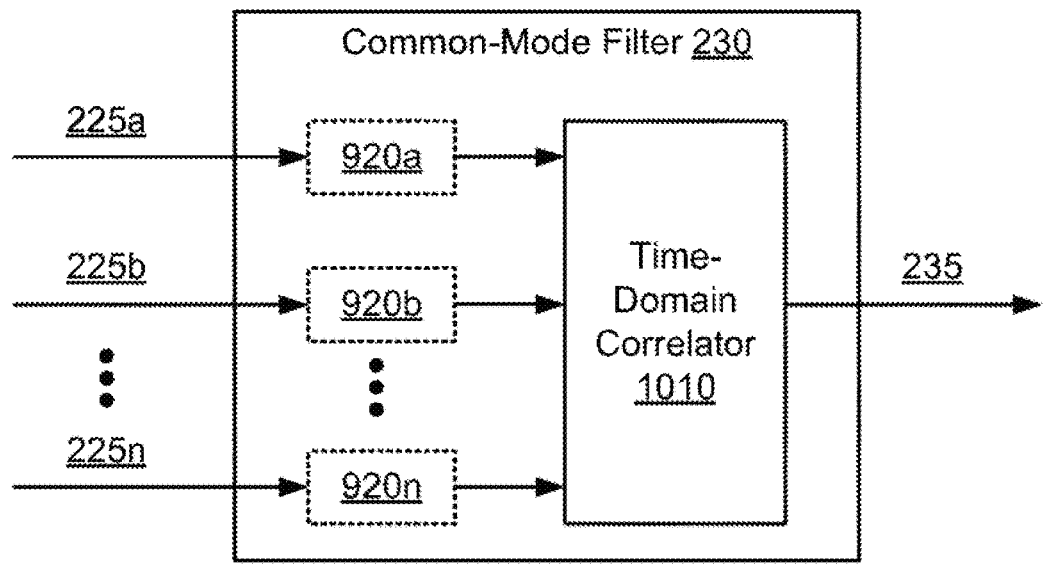
FIGS. 10A, 10B, 11A, 11B, 12A, and 12B show block diagrams of illustrative implementations of common mode filter subsystem 230, according to various embodiments.

Turning first to FIG. 10A, the common mode filter subsystem 230 is illustrated to include a time-domain correlator 1010. The time-domain correlator 1010 can use any suitable technique to cross-correlate some or all of the common-bandwidth signals 225 in the time domain. Because the common-bandwidth signals 225 encode substantially the same data and substantially different non-data (i.e., spurious information and other noise), the common-bandwidth signals 225 will tend to correlate appreciably more strongly around data-related information than otherwise.

For the sake of added clarity, FIGS. 19A-23C illustrate an example use case of the embodiment illustrated by FIG. 10A. The example use case assumes an implementation of the digital converter subsystem 210 having only two ADCs 320. A first ADC 320a is sampled at 1.0 GHz, and a second ADC 320b is sampled at 1.01 GHz (i.e., a one-percent difference in sampling rate). The data signal 205 is assumed to have data-related frequency components at 300 MHz, 200 MHz, and 450 MHz.

Figure 19A:
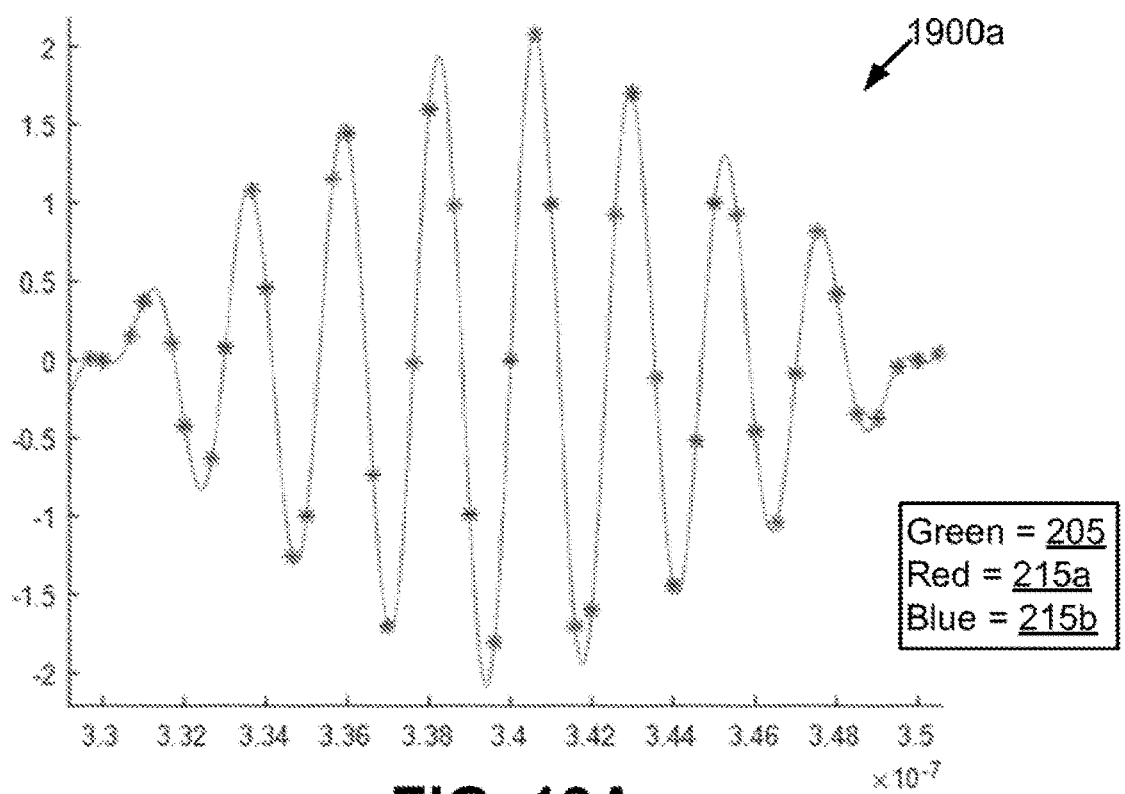
FIGS. 19A and 19B show illustrative plots 1100 of a data signal, a first digital input signal, and a second digital input signal.
Figure 19B:
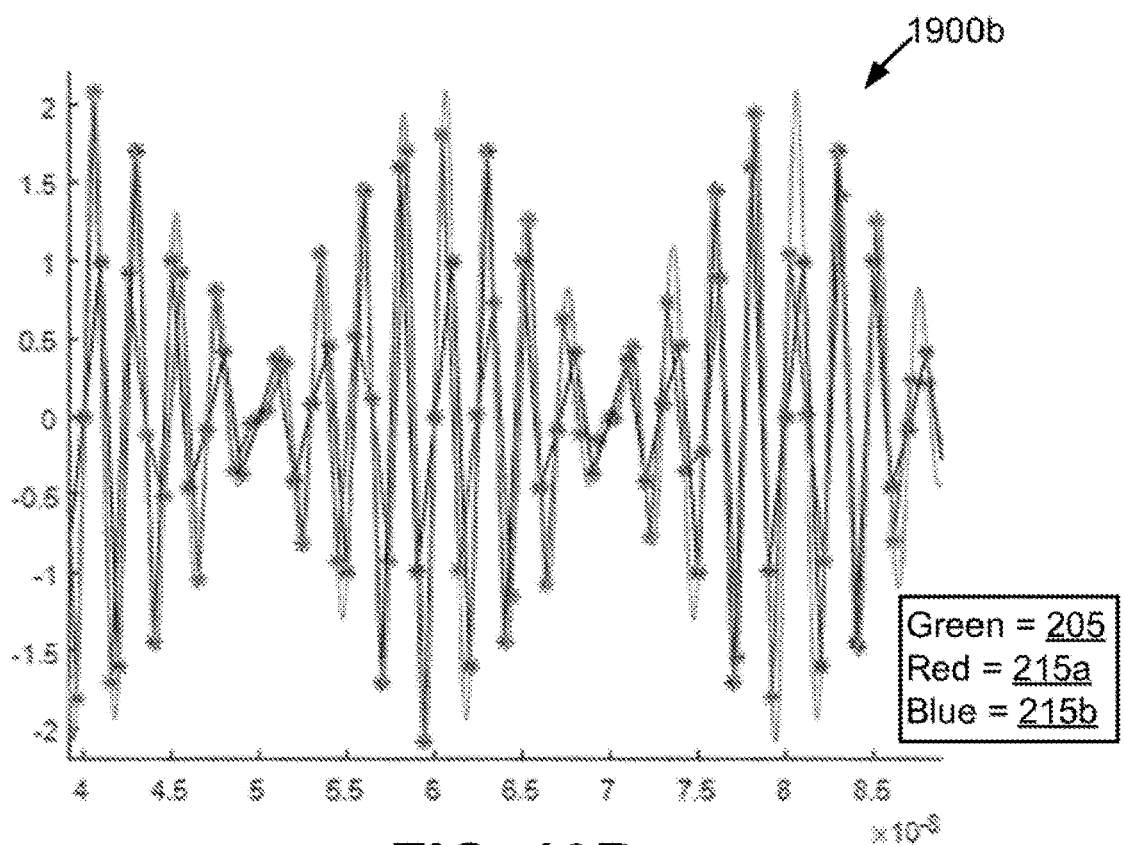

FIGS. 19A and 19B show illustrative plots 1900a,b of the illustrative data signal 205, an illustrative first digital input signal 215a, and an illustrative second digital input signal 215b. In FIG. 19A, the green data shows the analog data signal 205 as an ideal signal (i.e., no analog noise), the red points represent samples corresponding to the first digital input signal 215a output by the first ADC 320a at 1.0 GHz, and the blue points represent samples corresponding to the second digital input signal 215b output by the second ADC 320b at 1.01 GHz. FIG. 19B shows the same data as in FIG. 19A, but the digital input signals 215 are shown with lines connecting the respective sample sets.

Figure 20A:
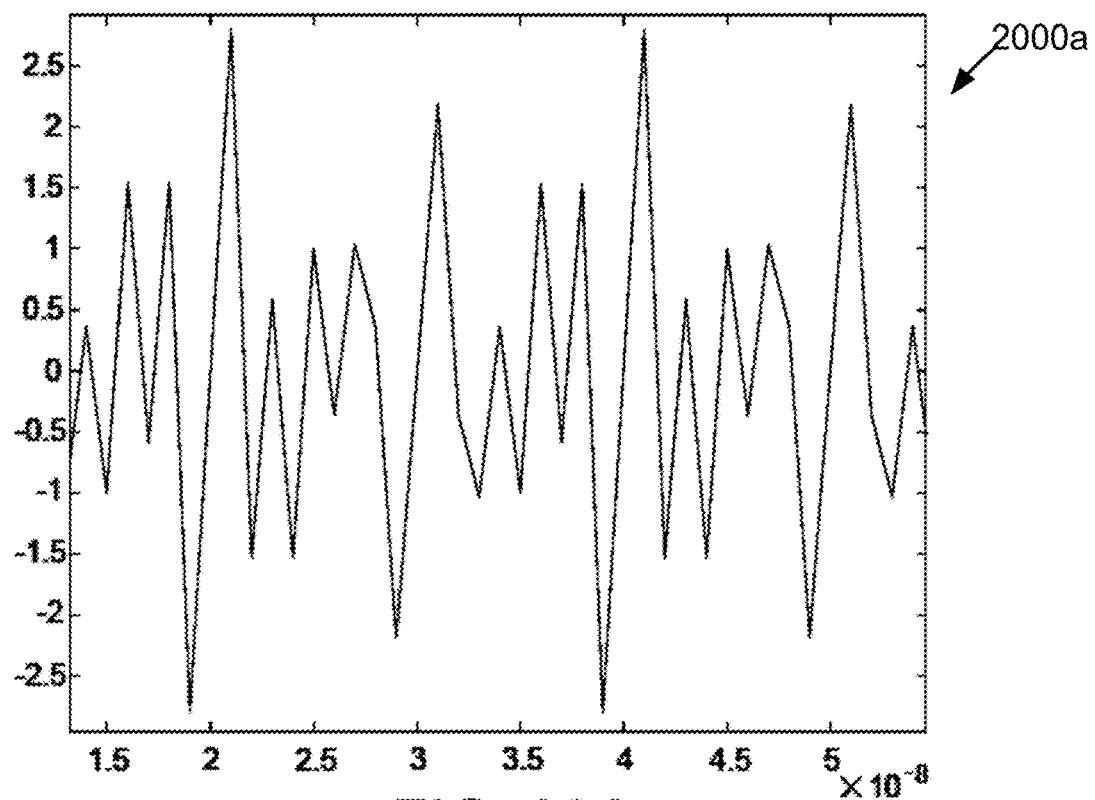
FIGS. 20A and 20B show plots 1200a, 1200b of a digital input signal in the time domain and the frequency domain, respectively.
Figure 20B:
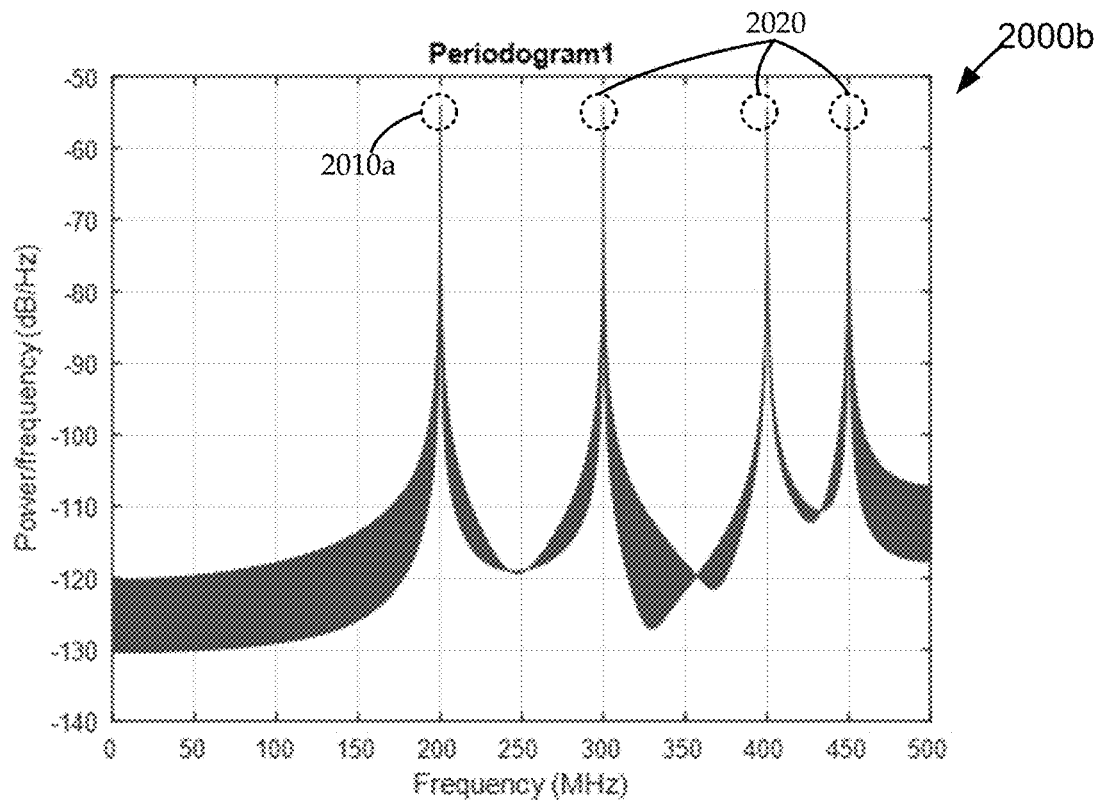
Figure 21A:
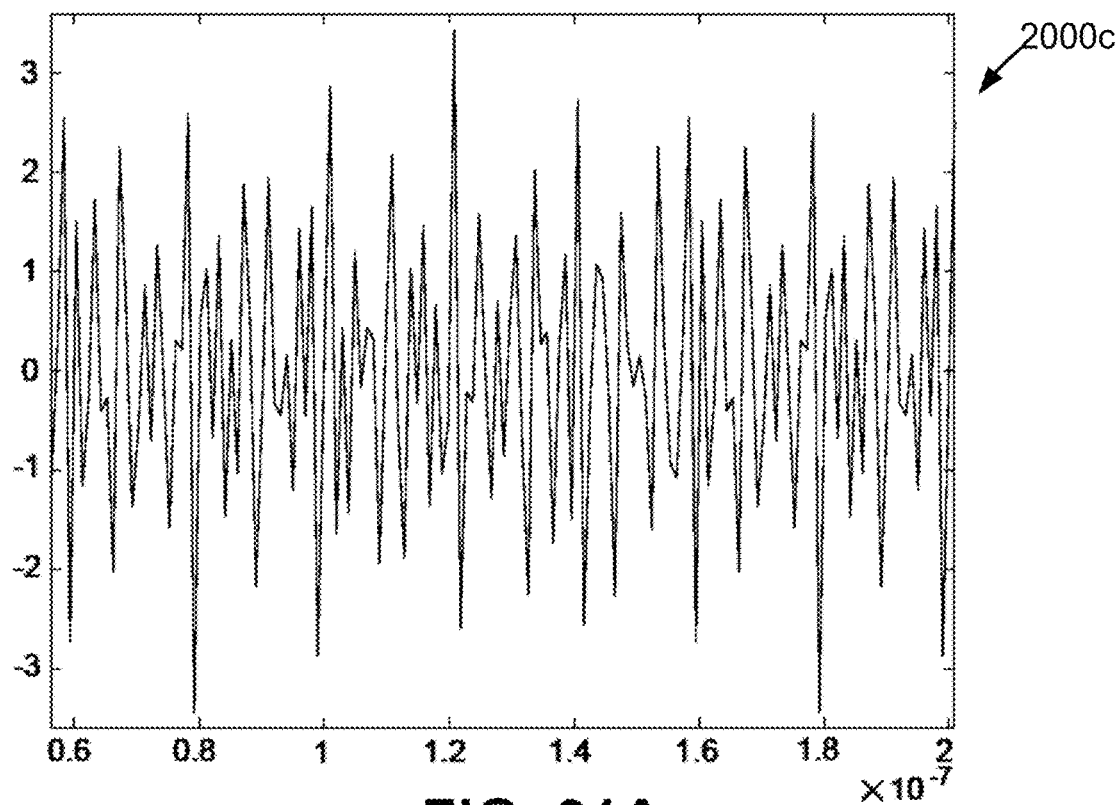
FIGS. 21A and 21B show plots 1200c, 1200d of a second digital input signal in the time domain and the frequency domain, respectively.
Figure 21B:
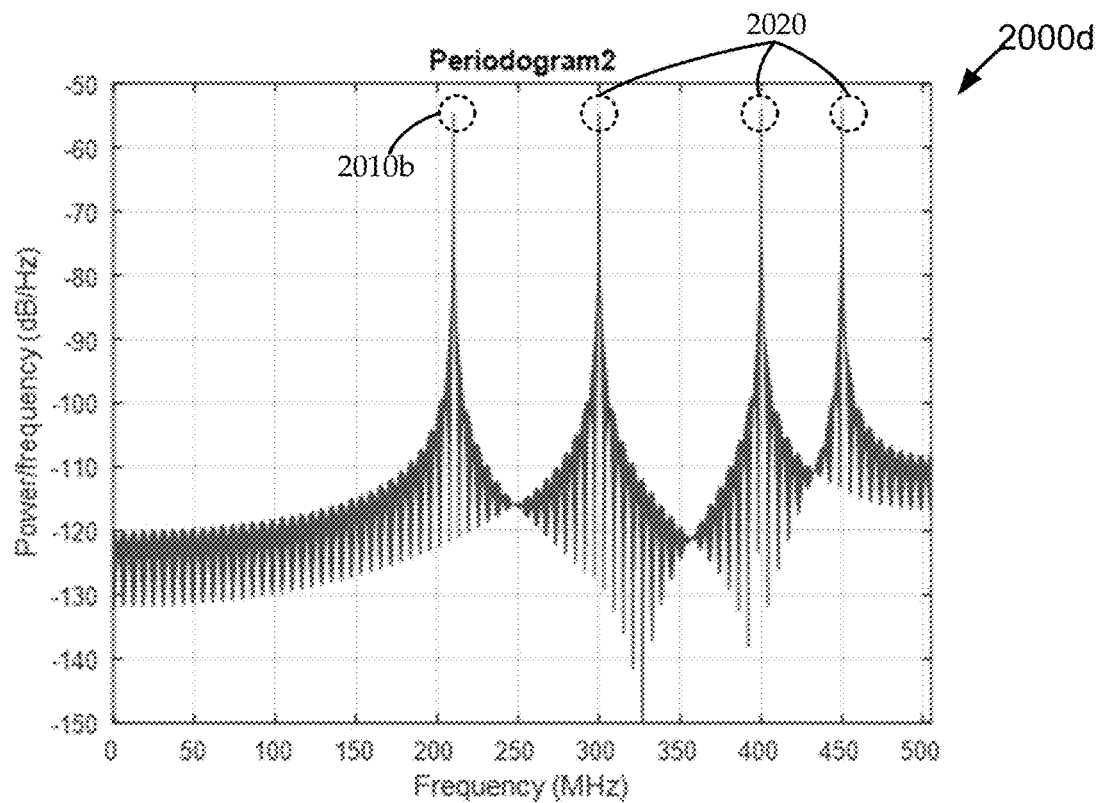

FIGS. 20A and 20B show plots 2000a, 2000b of the first digital input signal 215a in the time domain (vertical axis showing amplitude from −2.5 to 2.5 in increments of 1, horizontal axis showing time from 1.5 to 5 ($\times 10^{-7}$) in increments of 0.2) and the frequency domain, respectively; and FIGS. 21A and 21B show plots 2000c, 2000d of the second digital input signal 215b in the time domain (vertical axis showing amplitude from −3 to 3 in increments of 1, horizontal axis showing time from 0.6 to 2 ($\times 10^{-8}$) in increments of 0.5) and the frequency domain, respectively. For example, plots 2000b and 2000d can represent plots 2000a and 2000c, respectively, after application of any suitable domain-transforming periodogram (e.g., a fast-Fourier transform (FFT), discrete-time Fourier transform (DTFT), etc.), such as by a domain transformer 920. FIG. 20B clearly shows the data-related frequency components 2020 at 300 MHz, 200 MHz, and 450 MHz; and a spur-related frequency component 2010a at 200 MHz (representing a harmonic of the 1.0 GHz sampling rate, folded back into the common bandwidth due to aliasing). Similarly, FIG. 21B clearly shows the same data-related frequency components 2020 at 300 MHz, 200 MHz, and 450 MHz; and a different spur-related frequency component 2010b at 210 MHz (representing a harmonic of the 1.01 GHz sampling rate, folded back into the common bandwidth due to aliasing). No additional noise is intentionally added in this example; the artifact in FIG. 21B is a natural artifact caused by uneven frequency binning.

The example use case assumes that bandwidth normalization is accomplished by time-domain interpolation (such as described with reference to FIG. 9A). The interpolation can effectively low-pass filter the data from both digital input signals 215 signals to 0.95 BW, thereby establishing an aligned time base (i.e., generating corresponding common-bandwidth signals 225). For example, a so-called "cross-power spectrum" computation of two digital input signals 215 can be applied as follows:

$$S_{ADC1,2}(f) = \frac{FFT(ADC1) \times FFT^*(ADC2)}{N^2}$$

The resultant spectrum is indicated by "S" and is calculated by multiplying the FFT of the first digital input signal "ADC1" with the complex conjugate of the FFT of the second digital input signal "ADC2", and dividing the result by the square of the FFT length "N." The asterisk superscript denotes the complex conjugate. Similarly, a so-called "auto power spectrum" computation can be applied as follows, where A is a digital input signal 215 (e.g., ADC1 or ADC2):

$$S(f) = \frac{FFT(A) \times FFT^*(A)}{N^2}$$

Frequency-based implementations tend to be biased and to involve circular convolution. In some cases, it is desirable to use an approach that is unbiased and involves linear convolution, for example, where there is a wide sense stationary set of data and the variance and mean are known. For the sake of illustration, the above auto power spectrum can be adapted to an auto correlation formula in the time domain for a single vector ($\widehat{ADC1}$) from the first digital input signal 215a (ADC1) as follows:

$$\sigma_{xx}(T) = \frac{1}{N-1} \sum_{t=1}^{N} \widehat{ADC1}_{t-T} \widehat{ADC1}_t$$

where N indicates the length of the vector $\widehat{ADC1}$ and T indicates an offset in time. The resulting autocorrelation function is a time-series function, and any suitable domain-transforming periodogram (e.g., an FFT or DTFT) may be taken of the autocorrelation function for the frequency domain. For example, according to the Wiener-Khinchin theorem, the power spectral density is the Fourier transform of the autocorrelation. The above computation can be extended (e.g., extending the Wiener-Khinchin theorem to the cross-power spectrum), referring to a vector from the second digital input signal 215b (ADC2) as ($\widehat{ADC2}$), as follows:

$$\sigma_{xy}(T) = \frac{1}{N-1} \sum_{t=1}^{N} \widehat{ADC1}_{t-T} \widehat{ADC2}_t$$

The cross-correlation function for the two digital input signals 215 can thus be derived as follows, where τ indicates an offset in time:

$$R_{xy}(\tau) = \sum_{t=0}^{T-\tau-1} \widehat{ADC1}_{t+\tau} \widehat{ADC2}_t^*$$

Figure 22A:
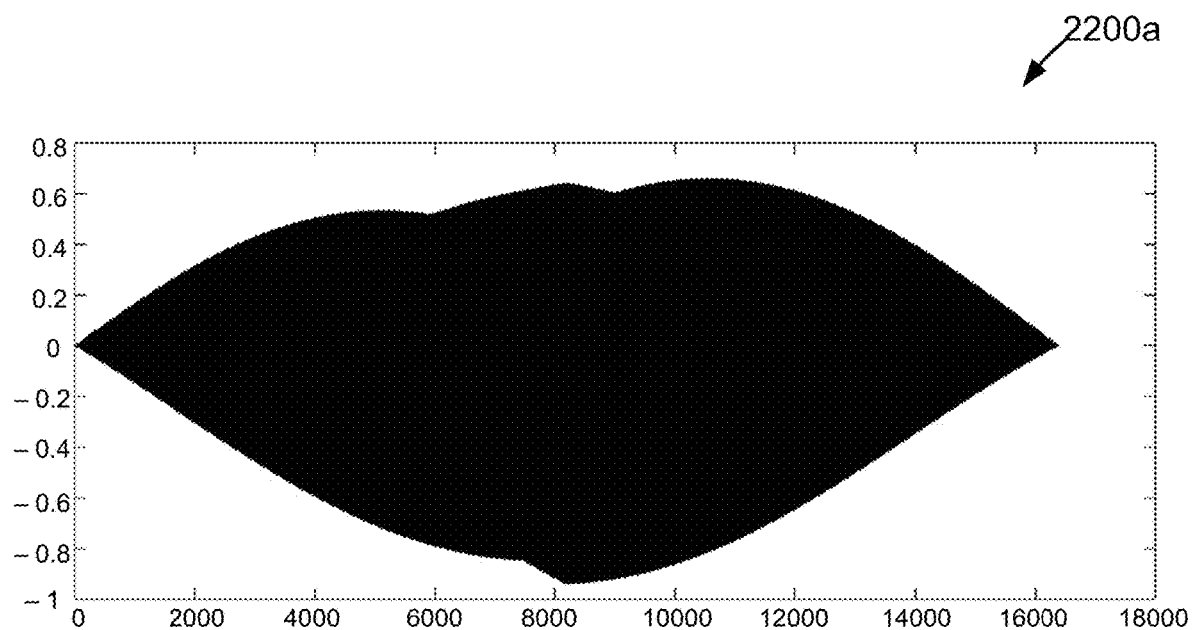
FIGS. 22A and 22B show plots 1300 of an illustrative output of a cross-correlation in the time domain and the frequency domain, respectively.
Figure 22B:
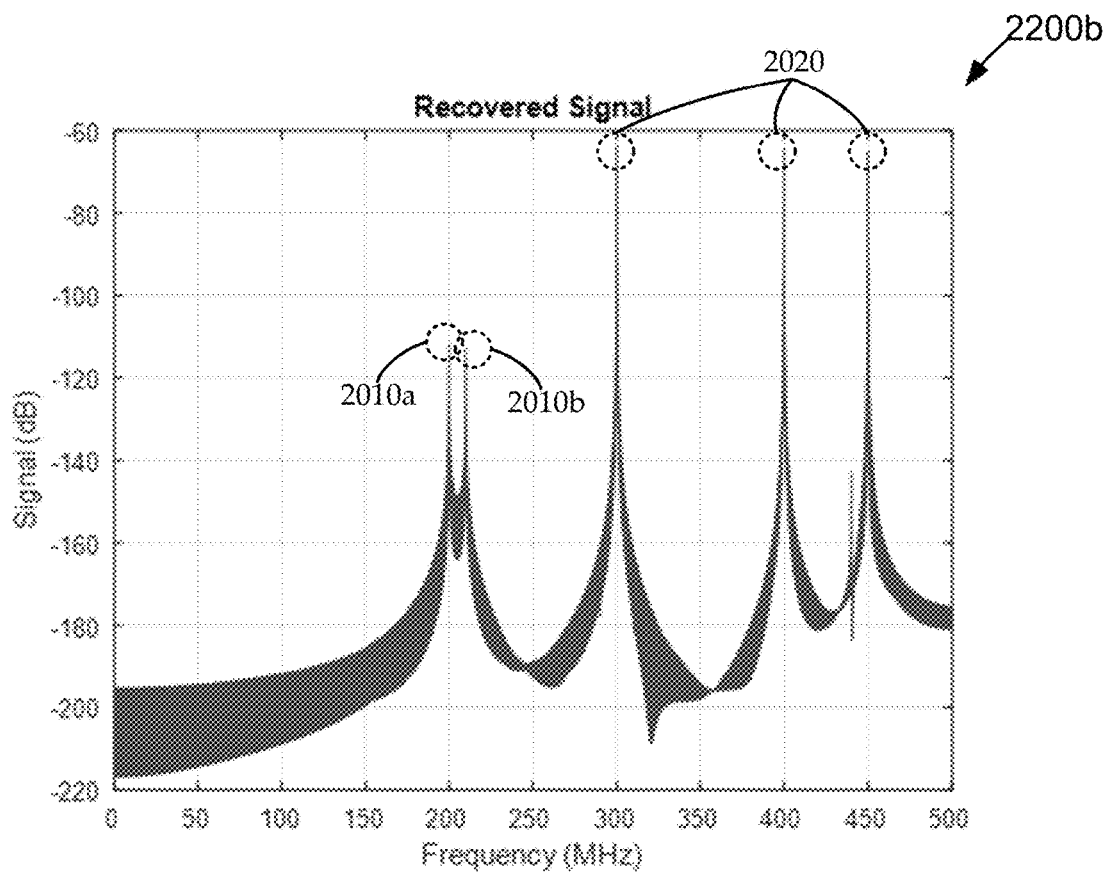

As described above, the digital input signals 215 are processed by the normalizer subsystem 220 to generate corresponding common-bandwidth signals 225 set to have a common bandwidth. As illustrated in FIG. 10A, the time-domain correlator 1010 can cross-correlate the common-bandwidth signals 225, for example, in accordance with the above cross-correlation function. FIGS. 22A and 22B show plots 2200a,b of an illustrative output of the cross-correlation in the time domain (vertical axis showing amplitude from −1 to 0.8 in increments of 0.2, horizontal axis showing time from 0 to 18,000 in increments of 2,000) and the frequency domain, respectively. The resulting plot 2200b of FIG. 22B clearly shows the same data-related frequency components 2020 from FIGS. 20B and 21B at 300 MHz, 200 MHz, and 450 MHz. The resulting plot 2200b of FIG. 22B also clearly shows the spur-related frequency component 2010a at 200 MHz from FIG. 20B, and the spur-related frequency component 2010b at 210 MHz from FIG. 21B. Notably, the result of applying the cross-correlation is that the spur-related frequency components 2010 are approximately 50 dB lower power than they were prior to the cross-correlation (i.e., comparing the magnitudes of the spur-related frequency components 2010 in FIGS. 20B and 21B to the corresponding magnitudes in FIG. 22B).

The example use case described above used ideal signals with no noise for the sake of added clarity. For the sake of further illustration, a second example use case is illustrated by FIGS. 23A-23C. The second use case is intended to be substantially the same as the first use case, except that noise is added, and both the data-related frequency components 2020 and the spur-related frequency components 2010 are at magnitudes only about 15 dB above the noise floor. FIG. 23A shows a plot 2300a of a frequency-domain representation (vertical axis showing power/frequency in dB/Hz from −120 to −50 in increments of 10, horizontal axis showing frequency in MHz from 0 to 500 in increments of 50) of a first digital input signal 215a corresponding to an output of a first ADC 320a, including the data-related frequency components 2020 at 300 MHz, 200 MHz, and 450 MHz; a spur-related frequency component 2010a at 200 MHz; and noise. FIG. 23B shows a plot 2300b of a frequency-domain representation (vertical axis showing power/frequency in dB/Hz from −130 to −50 in increments of 10, horizontal axis showing frequency in MHz from 0 to 500 in increments of 50) of a second digital input signal 215b corresponding to an output of a second ADC 320b, including the same data-related frequency components 2020; a different spur-related frequency component 2010b at 210 MHz'; and different noise. FIG. 23C shows a plot 2300c of a frequency-domain representation of an output of the common mode filter subsystem 230 of FIG. 10A after application of the above cross-correlation function. The resulting plot 2300c of FIG. 23C clearly shows the same data-related frequency components 2020 from FIGS. 23A and 23B at 300 MHz, 200 MHz, and 450 MHz; spur-related frequency components 2010a at 200 MHz from FIG. 23A; and spur-related frequency component 2010b at 210 MHz from FIG. 23B; and noise-related components from FIGS. 23A and 23B. Consistent with FIG. 22B, the result of applying the cross-correlation shown in FIG. 23C is that the data-related frequency components 2020 are now around 35 dB above the noise floor, and the spur-related frequency components 2010 are only around 15 dB above the noise floor, such that the data-related frequency components 2020 have magnitudes approximately 20 dB higher than all the non-data-related components.

Turning back to FIG. 10A, the output of the time-domain correlator 1010 can be the digital output signal 235. For example, some applications can be coupled with the time-domain output of the time-domain correlator 1010. This digital output signal 235 represents a digitally converted signal with higher signal-to-noise ratio than would be achieved by directly using the output of any of the ADCs 320.

Figure 10B:
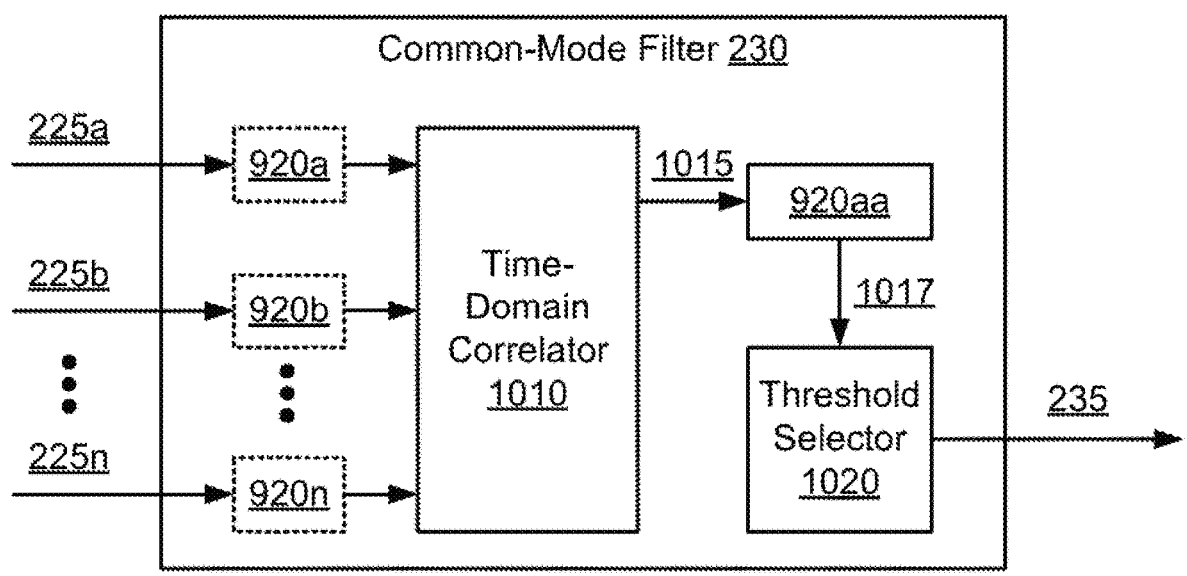

Other embodiments do not use the output from the time-domain correlator 1010 as the digital output signal 235, performing further processing instead. For example, FIG. 10B shows another embodiment of the common mode filter subsystem 230 that is similar to that of FIG. 10A with added threshold selection. As illustrated, the output of the time-domain correlator 1010 (a time-domain correlated signal 1015) can be converted to frequency domain by a domain transformer 620aa. For example, the domain transformers 920 can apply any domain-transforming periodogram to the time-domain correlated signal 1015 to produce a corresponding frequency-domain correlated signal 1017. As illustrated by example in FIGS. 22B and 23C, the frequency-domain correlated signal 1017 output from the time-domain correlator 1010 has an appreciable spread in magnitude between data-related frequency components and all other frequency components.

A threshold selector 1020 can process the frequency-domain correlated signal 1017 by discriminating between those frequency components having magnitudes above a threshold level (i.e., the data-related frequency components) and those frequency components having magnitudes below the threshold level (i.e., the non-data-related frequency components). In some embodiments, the discriminating involves accepting those frequency components having magnitudes above the threshold level and rejecting some or all other frequency components, thereby accepting the data-related frequency components and rejecting at least some of the spurious information and other noise. In other embodiments, the discriminating involves rejecting those frequency components having magnitudes above the threshold level and accepting some or all other frequency components, thereby rejecting the data-related frequency components and accepting at least some of the spurious information and other noise. Some implementations of the threshold selector 1020 use a pre-set (e.g., hard-coded) threshold level. Other implementations of the threshold selector 1020 use a programmable (e.g., software-programmable, hardware-selectable, tunable, etc.) threshold level. Other implementations of the threshold selector 1020 use a dynamic threshold level (e.g., that automatically adjusts based on a feedback control loop, or the like).

Figure 11A:
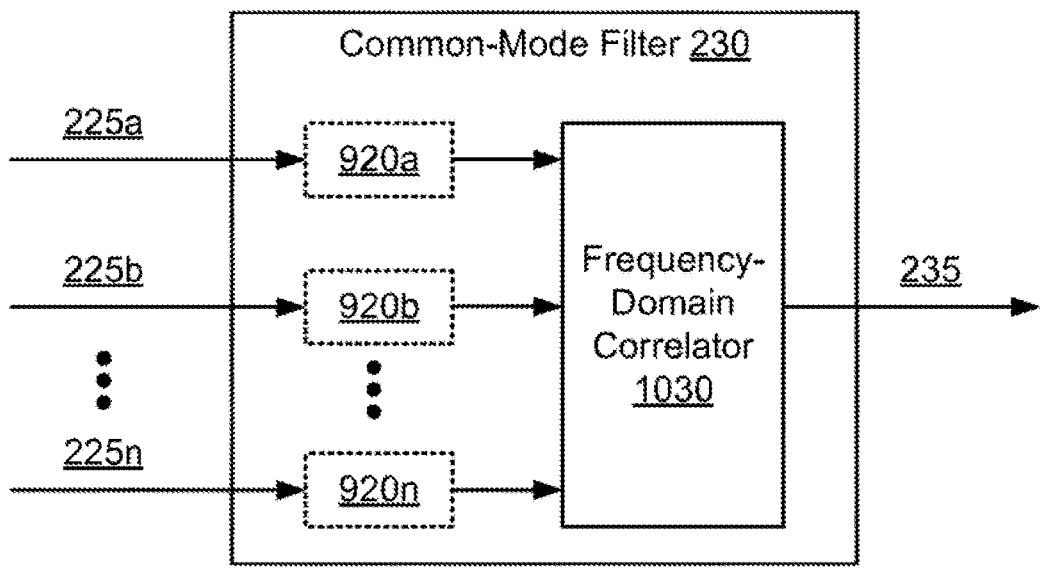
Figure 11B:
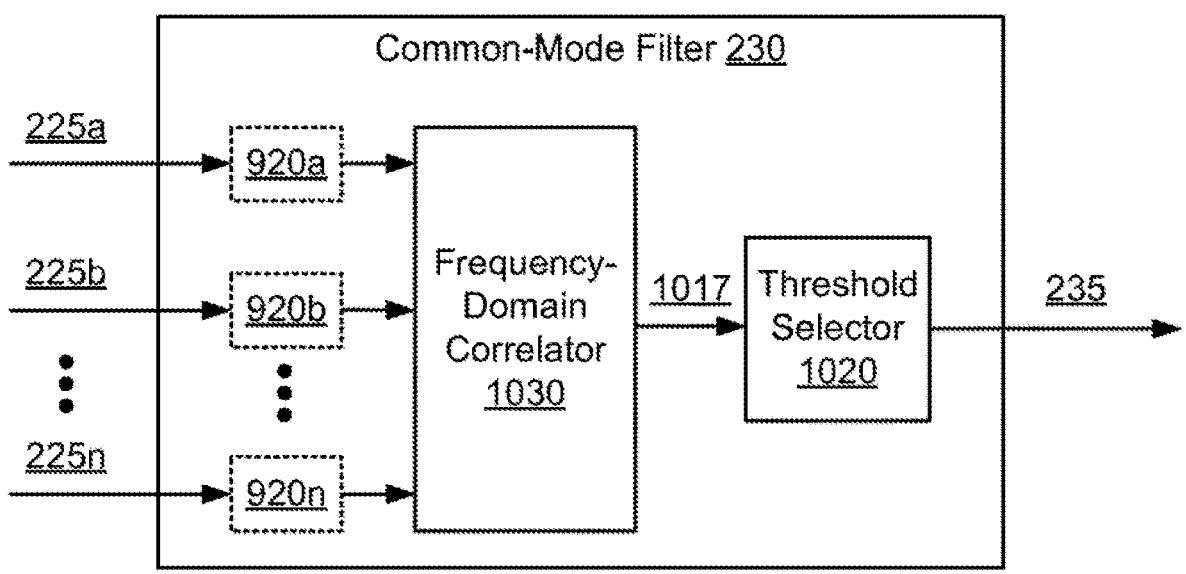

Turning to FIG. 11A, the common mode filter subsystem 230 is illustrated to include a frequency-domain correlator 1030. The frequency-domain correlator 1030 can use any suitable technique to cross-correlate some or all of the common-bandwidth signals 225 in the frequency domain. Because the common-bandwidth signals 225 have substantially the same data-related frequency components and substantially different non-data-related frequency components, the common-bandwidth signals 225 will tend to correlate appreciably more strongly around the data-related frequency components than otherwise. Similar to the time-domain implementation of FIG. 10A, the output of the frequency-domain correlator 730 can be used directly as the digital output signal 235. Additionally or alternatively, similar to the time-domain implementation of FIG. 10B, the digital output signal 235 can be generated with added threshold selection. For example, as illustrated in FIG. 11B, the output of the frequency-domain correlator 1030 (already a frequency-domain correlated signal 1017) can be processed by a threshold selector 1020, which can discriminate between those frequency components having magnitudes above a threshold level (i.e., the data-related frequency components) and those frequency components having magnitudes below the threshold level (i.e., the non-data-related frequency components). As described above, some embodiments can apply the discriminating to accept the data-related frequency components, and other embodiments can apply the discriminating rejecting the data-related frequency components.

Figure 12A:
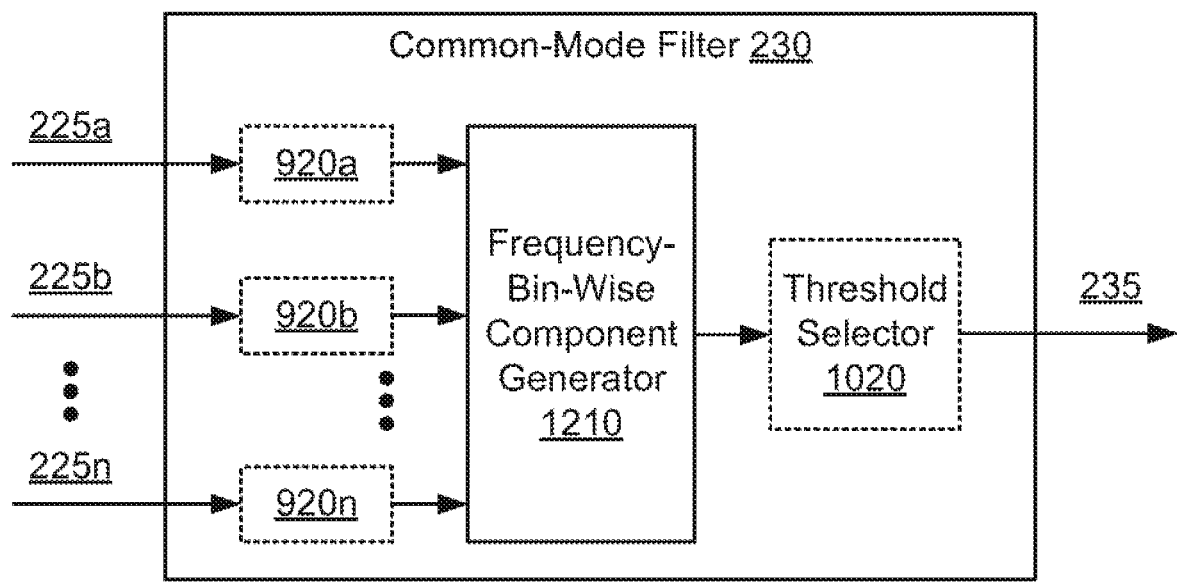
Figure 12B:
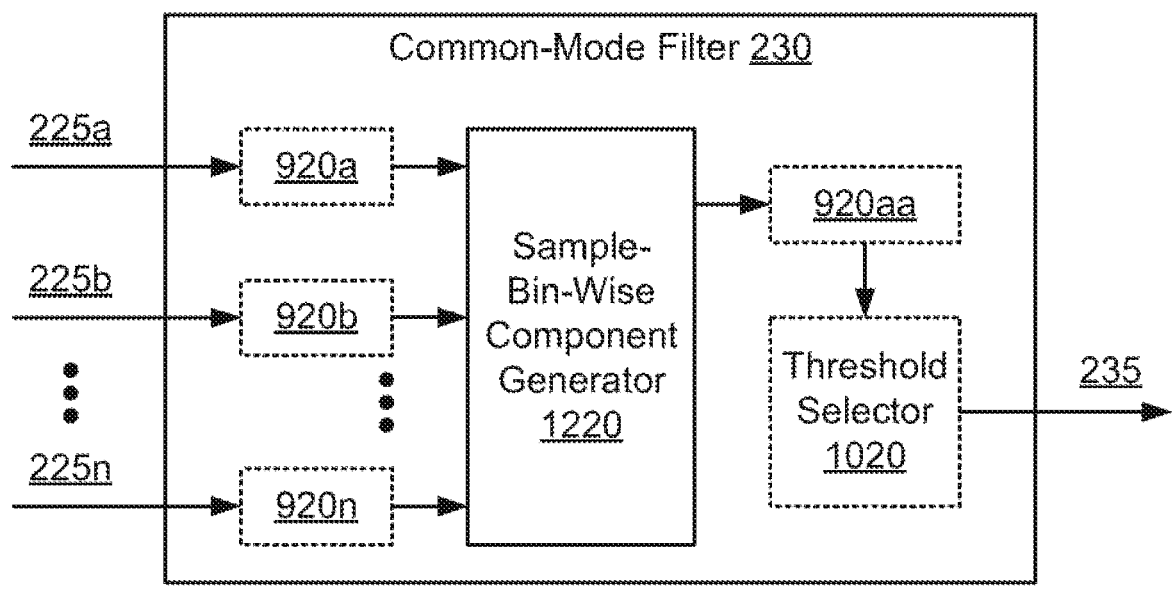

FIGS. 12A and 12B show block diagrams of other illustrative implementations of common mode filter subsystem 230 that use bin-wise component generation in the frequency domain and the time domain, respectively, according to various embodiments. Turning first to FIG. 12A, the common mode filter subsystem 230 is illustrated as including a frequency-bin-wise component generator 1210. Embodiments of the frequency-bin-wise component generator 1210 segregate each of the common-bandwidth signals 225 into a same set of frequency bins. Any suitable number and spacing of frequency bins can be used. For example, frequency bins can be defined in a linear or non-linear manner. At each frequency bin (e.g. of all, or a portion of the frequency bins), the frequency-bin-wise component generator 1210 can compute a corresponding output frequency component. The frequency-bin-wise component generator 1210 can then generate its output (e.g., which may be the digital output signal 235) based on the computed output components.

For example, each common-bandwidth signal 225 can have a respective frequency vector at each frequency bin, and each respective frequency vector can have an associated magnitude. In one implementation, at each frequency bin, the frequency-bin-wise component generator 1210 selects the frequency vector having the lowest magnitude for that frequency bin from across the common-bandwidth signals 225. For example, frequency bins at frequencies corresponding to data will tend to have higher-magnitude frequency vectors in all common-bandwidth signals 225, frequency bins at frequencies not corresponding to data will tend to have low-magnitude frequency vectors in at least some of the common-bandwidth signals 225; such an implementation tends to generate an output with reduced vector magnitudes at non-data-related frequencies (i.e., thereby reducing spurious information and other noise).

In some cases, it is possible for more than one of the common-bandwidth signals 225 to include spurious content at the same frequency. In a crowded spectral environment, for example, there is an increased risk that spurious responses from differently clocked ADCs 320 could end up on top of each other. In some implementations, frequency-bin-wise component generator 1210 may also be configured to determine whether the magnitude and/or phase of the lowest-magnitude vector is acceptable at each frequency bin (e.g., is within a predetermined window). If the vector's amplitude, phase, or a combination of both (e.g., an IQ value) is not acceptable, such an implementation of generator 1210 selects a substitute value for the frequency bin (e.g., as if neither signal were present at that frequency). In one example, the substitute value is the lowest-magnitude vector in the adjacent lower (and/or adjacent higher) frequency bin.

In another implementation, at each frequency bin, the frequency-bin-wise component generator 1210 selects the frequency vector having the highest magnitude for that frequency bin from across the common-bandwidth signals 225. Such an implementation can tend to emphasize spurious information and other noise. In another implementation, at each frequency bin, the frequency-bin-wise component generator 1210 computes an average (e.g., mean, median (or other moment), geometric mean, etc.) or other suitable function of the magnitudes of the frequency vectors for that frequency bin from across the common-bandwidth signals 225. Such an implementation can tend to de-emphasize (reduce the magnitude of) spurious information and other noise.

Similar to the implementations described with reference to FIGS. 9A and 9C, the output of the frequency-bin-wise component generator 1210 can be used directly as the digital output signal 235. Additionally or alternatively, similar to the implementations described with reference to FIGS. 9B and 9D, the digital output signal 235 can be generated with added threshold selection after the frequency-bin-wise component generator 1210. For example, as illustrated in FIG. 12A, the output of the frequency-bin-wise component generator 1210 (already a frequency-domain signal) can be processed by a threshold selector 1020, which can discriminate between those frequency components having magnitudes above a threshold level (i.e., the data-related frequency components) and those frequency components having magnitudes below the threshold level (i.e., the non-data-related frequency components). As described above, some embodiments can apply the discriminating to accept the data-related frequency components, and other embodiments can apply the discriminating rejecting the data-related frequency components.

Turning first to FIG. 12B, the common mode filter subsystem 230 is illustrated as including a sample-bin-wise component generator 1220. Embodiments of the sample-bin-wise component generator 1220 segregate each of the common-bandwidth signals 225 into a same set of time-domain sample bins. Any suitable number and spacing of time-domain sample bins can be used. For example, time-domain sample bins can be defined in a linear or non-linear manner. At each time-domain sample bins (e.g. of all, or a portion of the time-domain sample bins), the sample-bin-wise component generator 1220 can compute a corresponding output time-domain sample (i.e., as the output component at that time-domain sample bin). Similar to the frequency-domain implementations of FIG. 12A, each common-bandwidth signal 225 can have a respective sample vector at each time-domain sample bins, and each respective sample vector can have an associated magnitude. Accordingly, implementations of the sample-bin-wise component generator 1220 can compute the corresponding output time-domain sample for each time-domain sample bin by selecting a minimum sample vector magnitude from across the common-bandwidth signals 225, by selecting a maximum sample vector magnitude from across the common-bandwidth signals 225, by computing an average sample vector magnitude from across the common-bandwidth signals 225, etc.

The sample-bin-wise component generator 1220 can then generate its output based on the computed output components. As discussed with reference to the frequency-domain implementation of FIG. 12A, some embodiments can use the output of the sample-bin-wise component generator 1220 directly as the digital output signal 235. Additionally or alternatively, the digital output signal 235 can be generated with added threshold selection after the sample-bin-wise component generator 1220. For example, as illustrated in FIG. 12B, the output of the sample-bin-wise component generator 1220 (a time-domain signal) can be converted to a frequency-domain signal by a domain transformer 920aa and processed by a threshold selector 1020. The threshold selector 1020 can discriminate between those frequency components having magnitudes above a threshold level (i.e., the data-related frequency components) and those frequency components having magnitudes below the threshold level (i.e., the non-data-related frequency components). As described above, some embodiments can apply the discriminating to accept the data-related frequency components, and other embodiments can apply the discriminating rejecting the data-related frequency components.

Common-mode filter 230 may also be configured to determine whether signals at particular frequency components are true (i.e., present in data signal 205) or artifacts of the digitizing process. For example, common-mode filter 230 may be configured to determine, within output signal 235 and/or within one or more of common-bandwidth signals 225, whether a signal at a particular frequency component meets certain parameters, such as whether the signal is within a predetermined window of amplitude, or of phase, or of a combination of amplitude and normalized phase.

Further information may be gleaned by changing the amplitude and/or phase of data signal 205 as presented to the different ADCs 320. For example, spurious responses generated by the digitizing process are subject to the formula N*RF± or N*Input±N*(sampling clock). If the input to an ADC 320 is lowered by 1 dB, the amplitude of a 2-by spur will go down by 2 dB, the amplitude of a 3-by spur will go down by 3 dB, and so on. Such an approach may include switching in attenuators in the input path of an ADC while monitoring the output of the ADC, to watch the spurs change in order to identify them as not real. Such an approach may also be used to identify second, third, and/or higher harmonics of the input signal. Such information may also be used in a grading system algorithm, in machine learning, etc.

As described above, embodiments generate multiple digital input signals 215 with different bandwidths. For example, with different sampling frequencies (Fs), the bandwidth (Fs/2) associated with each digital input signal 215 (e.g., and/or with each ADC 320) can be different. The difference in bandwidth can be exploited for Nyquist tuning. In some embodiments, each Nyquist zone can be uniquely encoded, so that for the performance of an ADC 320, complete frequency information can be extracted without being limited to the Nyquist formula Fs/2 as a bandwidth of the acquired signal. For example, when sampling data at two constant, coherent, yet unrelated frequencies, we can determine the Nyquist zone, whereby a unique frequency is measured in its primary harmonic without aliasing. A Nyquist tuner can be provided by frequency-shifting (e.g., in either time or frequency domain) based on the delta of the Fs/2 difference between signals multiplied by a Nyquist zone number. Such an approach can provide the unique frequency spectrum (e.g., spur web and folded-over frequencies) that can be exploited by embodiments herein to cancel and/or minimize spurious and/or other out-of-band information.

It may be desired to sample a signal just often enough to be able to uniquely characterize it. Applications for such an operation are plentiful in the digital world, from music being digitally processed and/or reproduced, to pixel values for display on a screen, to radio astronomy. For the general case of an arbitrary signal for which additional information (e.g., sparseness) may not be available, this well-posed question has a definitive answer: the sampling rate ($f_s$) must be more than twice the bandwidth of the spectrum of the signal. In most applications, this rule is interpreted to require the sampling rate ($f_s$) to be more than twice the maximum frequency in the spectrum of the signal ($f_{max}$). The rate $f_s$ is called the Nyquist rate, and a data signal which is sampled at a rate above the Nyquist rate (also called "Nyquist sampling" the signal) can be reconstructed from the samples.

If the sampling rate is not above the Nyquist rate, then aliasing will occur. As a general rule, for a sampling rate $f_s$ that is below the Nyquist rate and for a given frequency $\Delta f \le f_s$, sine waves in the original signal that have frequencies $$N\frac{f_s}{2} \pm \Delta f$$

(where N is any nonzero integer) will no longer be differentiable in the sampled signal, and all signal power for these frequencies will pile up ("alias") at the frequency $$\frac{f_s}{2} - \Delta f.$$

Figure 13A:
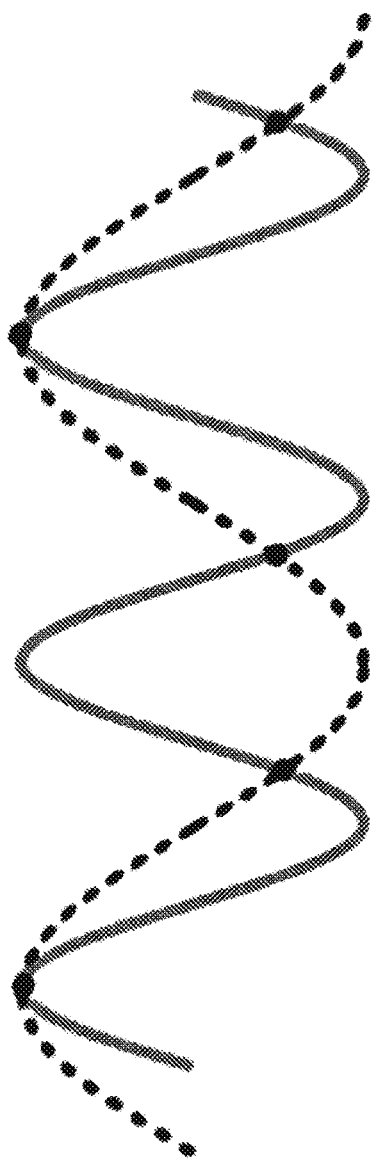
FIG. 13A shows an example of an undersampled signal.

If the input signal has power, for example, at both of the frequencies $$\frac{f_s}{2} + \Delta f$$

and $$\frac{f_s}{2} - \Delta f,$$

then aliasing becomes problematic. Because the information needed to distinguish these components is lost in the sampling process, these formerly distinct signal components now appear at a single frequency, with no way to discern how much of the power came from each component. FIG. 13A shows an example of a sampled signal having two sine waves that cannot be differentiated because the signal is not sampled at the necessary Nyquist rate.

However, if, for each such $\Delta f$, the input signal has power at only one of the aliasing frequencies, the sampling process does not irrevocably destroy the signal, and the measurements needed to reconstruct the signal may still be available, if the original frequencies occupied by the components that alias to $$\frac{f_s}{2} - \Delta f$$

are known. In these cases, aliasing can be intentionally exploited in a useful manner, as described below for example.

Figure 13B:
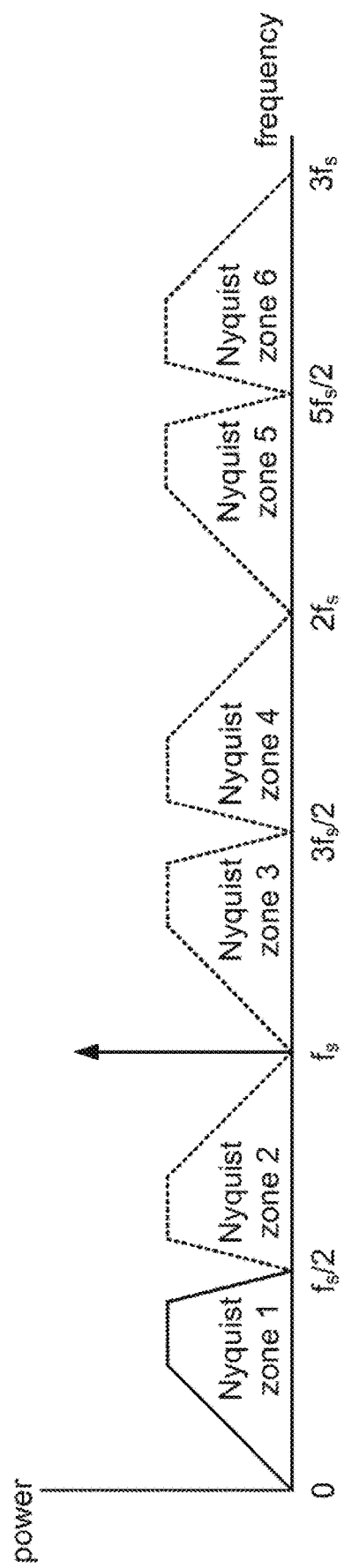
FIG. 13B shows an example of Nyquist zones.

For a given sampling frequency $f_s$, various zones may be identified within a signal to be sampled such that, if the signal is band-limited to that zone, the full original spectrum can be recovered. As shown in the example of FIG. 13B, zones relative to a sampling frequency $f_s$ may be identified such that a band-limited signal in a higher Nyquist zone will alias down into the first Nyquist zone. For even-numbered Nyquist zones, the imaged spectrum will appear in reversed order, and for odd-numbered zones, the imaged spectrum appears in original order. Under this principle, a signal which is band-limited to the 100-MHz band ranging from 700-800 MHz, for example, need only be sampled at 200 MHz to characterize it. If the Nyquist zone occupied by the signal power can be identified, it is possible to reconstruct the original signal perfectly.

One difficulty that arises with purposely aliasing signals in this manner is that the boundaries of the Nyquist zones are fundamentally tied to the sample rate, which also dictates the bandwidth that a signal can have within a Nyquist zone. While a 200-MHz sampling clock may be used to sample a 100-MHz band from 700-800 MHz under this principle, as in the example above, it may not be possible to use the 200-MHz sampling clock to sample a 100-MHz band from 720-820 MHz in the same manner, because components in the range of 780-800 MHz will alias to the same 20-MHz range of the first Nyquist zone as components in the range of 800-820 MHz.

Figure 14A:
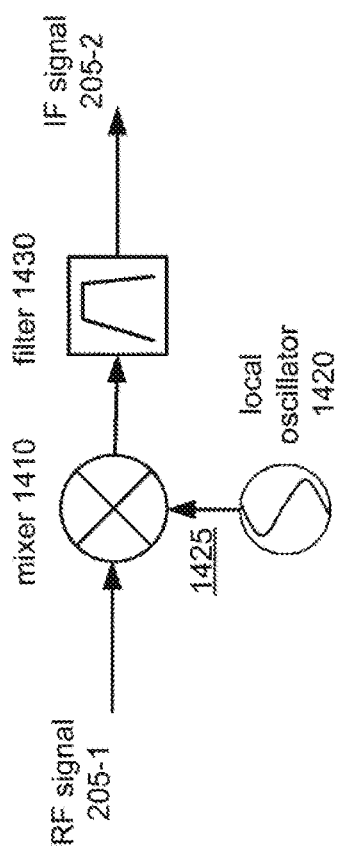
FIG. 14A shows an example of sampling a signal at intermediate frequency (IF).
Figure 14B:
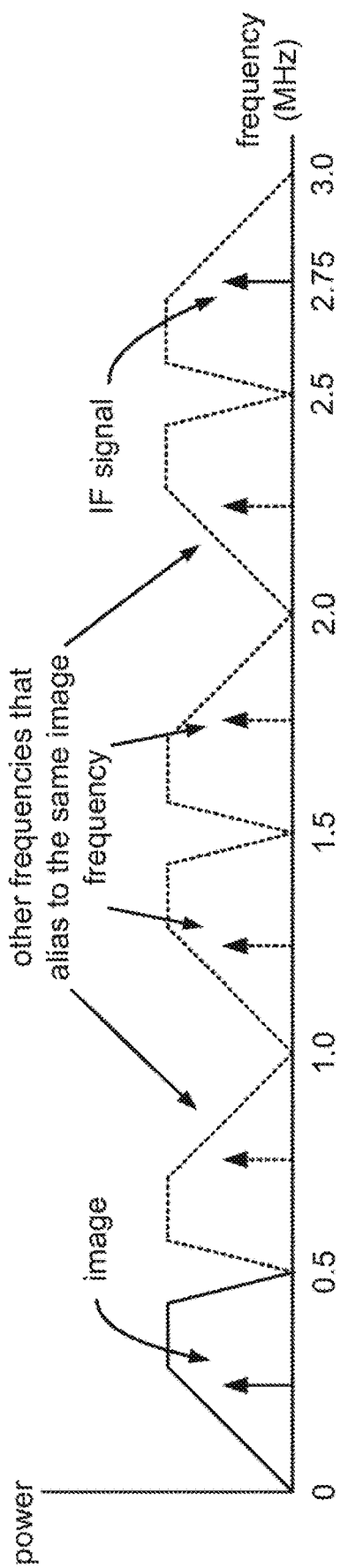
FIG. 14B shows an example of Nyquist zone folding with reference to the example of FIG. 14A.

An example of Nyquist zone folding is discussed with reference to sampling a signal at intermediate frequency (IF) as shown in FIGS. 14A and 14B. In this example, the signal source has a symbol rate of 0.125 MHz and the simulation sampling rate is set to 8 MHz, yielding an oversampling rate of 64 samples per symbol. As shown in FIG. 14A, data signal 205 is received at radio-frequency (RF) (e.g., via an antenna) as RF signal 205-1 and mixed down to IF (before analog-to-digital conversion as described herein) as IF signal 205-2. Mixer 1410 mixes RF signal 205-1 with a signal 1425 from local oscillator 1420 to produce images at the sum and the difference of the frequencies of signals 205-1 and 1420. Image rejection filter 1430 passes only a desired one of the two images as IF signal 205-2. In this particular example, the IF is 2.75 MHz and the sampling rate is 1 MHz, so that the ADC is subsampling IF signal 205-2.

We can take advantage of the fact that higher Nyquist zones fold into the first Nyquist zone when subsampling occurs (i.e., when sampling is performed at a rate below the Nyquist rate, so that an alias of the signal is sampled). In this example, the IF frequency is defined by variable IF, the ADC sampling frequency is denoted as Fs, and the subsampling design uses the following relationship between IF frequency and ADC sampling rate: IF=(2n+1)Fs/4, where Fs=1 MHz (1 MSPS), n=5, and IF=2.75 MHz=11/4 Fs. As shown in FIG. 14B, the IF frequency 11/4 Fs falls in the sixth Nyquist zone, where the first zone corresponds to Fs/2 (n=0).

Current theory assumes that signals from different Nyquist zones cannot be differentiated after subsampling, and that a desired Nyquist zone must be selected before sampling by placing a filter around it. In the scenario as shown in FIG. 14B, for example, the particular 2.5-3.0-MHz band that includes the IF signal at 2.75 MHz may be selected by using an analog passband filter on the data signal to pass only this band to the ADC, preventing frequency components of other Nyquist zones from aliasing down to the first Nyquist zone.

For a case in which two or more ADCs are used to sample the same data signal at different clock frequencies, the added information about the data signal may be used to place the signal into a Nyquist zone. It becomes possible, therefore, to perform Nyquist zone selection digitally and without using an analog filter. Such a Nyquist filter or tuner may be implemented to filter out Nyquist zones other than the desired zone without the use of an analog filter, thus putting less requirements on the prefiltering of signals presented to the ADC. Potential advantages of such an approach may include reducing the tight requirements of phase noise on the sampling clock (sometimes described as jitter).

Figure 14C:
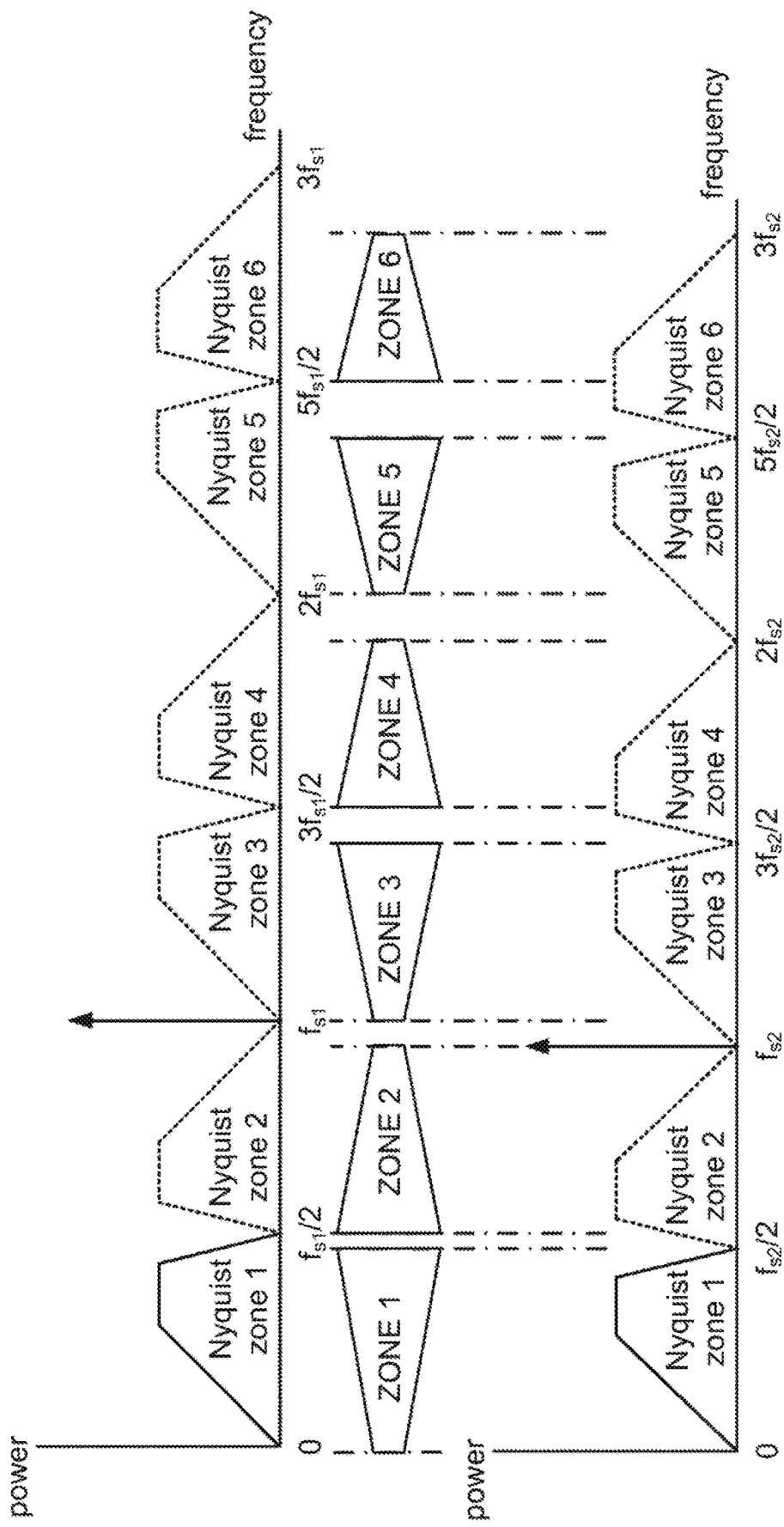
FIG. 14C shows an extension of zonal selectivity to other Nyquist zones.

A frequency component of the data signal that is within the first Nyquist zone appears at the same frequency in both ADC outputs after sampling. A frequency component of the data signal that is within any other Nyquist zone appears at different frequencies in the two ADC outputs after sampling, because the sampling clocks are at a different frequency. When frequency components within other Nyquist zones are aliased back to the first Nyquist zone, they are aliased at different frequencies in the two ADC outputs. When a cross-correlation is done on the normalized ADC outputs, frequency components of the data signal that are within the other Nyquist zone frequencies will drop out: not only signal components in the other Nyquist zones, but noise components in the other Nyquist zones are canceled as well. As shown in FIG. 14C and discussed below, this zonal selectivity can also be extended to Nyquist zones other than the first Nyquist zone.

An example of Nyquist filtering by sampling respective instances of a data signal 205 with ADCs 320a,b clocked at different respective sampling frequencies is discussed with reference to FIGS. 15A, 15B, and 16A-D. In this example, data signal 205 is a sine wave at 501 MHz, ADC 320a is clocked at 1000 MHz and ADC 320b is clocked at 990 MHz, and instances of signal 205 are presented to ADCs 320a,b simultaneously. As shown in FIG. 15A, the first Nyquist zone of ADC 320a is from 0 to 500 MHz, so that the 501-MHz data signal is aliased back to an image at 499 MHz. As shown in FIG. 15B, the first Nyquist zone of ADC 320b is from 0 to 495 MHz, so that the 501-MHz data signal is aliased back to an image at 489 MHz.

If the corresponding outputs of the ADCs 320a,b were normalized and cross-correlated as described herein, the images at 489 and 499 MHz would not correlate and would therefore drop out. In this case, only normalized ADC outputs from a signal originating in the first Nyquist zone would correlate. But if the normalized output of ADC 320b were shifted upward by 10 MHz (i.e., by the difference between the two sampling clocks) as shown in FIG. 16A, only normalized ADC outputs from a signal originating in the second Nyquist zone (in this example, 500-990 MHz) would correlate, and ADC outputs from signals originating in the other Nyquist zones would drop out. In other words, the system would be tuned to the second Nyquist zone (specifically, to the region of overlap between the second Nyquist zones of the two clock domains). It may be seen that the same result would be achieved by shifting the normalized output of ADC 320a instead (in this case, downward by 10 MHz).

In order to tune the system to the third Nyquist zone (in this example, 1000-1485 MHz), the normalized output of ADC 320a may be shifted upward by 10 MHz as shown in FIG. 16B or, alternatively, the normalized output of ADC 320b may be shifted downward by 10 MHz. In this case, only normalized ADC outputs from a signal originating in the third Nyquist zone (specifically, in the region of overlap between the third Nyquist zones of the two clock domains) would correlate, and ADC outputs from signals originating in the other Nyquist zones would drop out.

If the normalized output of ADC 320b were shifted upward by 20 MHz (i.e., by twice the difference between the two sampling clocks) as shown in FIG. 16C, only normalized ADC outputs from a signal originating in the fourth Nyquist zone (in this example, 1500-1980 MHz) would correlate, and ADC outputs from signals originating in the other Nyquist zones would drop out. In other words, the system would be tuned to the fourth Nyquist zone (specifically, to the region of overlap between the fourth Nyquist zones of the two clock domains). It may be seen that the same result would be achieved by shifting the normalized output of ADC 320a instead (in this case, downward by 20 MHz).

In order to tune the system to the fifth Nyquist zone (in this example, 2000-2475 MHz), the normalized output of ADC 320a may be shifted upward by 20 MHz as shown in FIG. 16D or, alternatively, the normalized output of ADC 320b may be shifted downward by 20 MHz. In this case, only normalized ADC outputs from a signal originating in the fifth Nyquist zone (specifically, in the region of overlap between the fifth Nyquist zones of the two clock domains) would correlate, and ADC outputs from signals originating in the other Nyquist zones would drop out. The same principles may be extended to tune the system to any other arbitrary Nyquist zone, provided, for example, that the operating bandwidths of the ADCs are wide enough to include that Nyquist zone. It is noted that although the various Nyquist zones in the examples above are identified by frequency ranges whose boundaries are indicated by the respective sampling rates, one of skill in the art will recognize that aliases appearing at those boundaries may behave differently than other aliased values, and that in many cases such boundary values are not relied upon for further processing.

In general, in order to select ("tune the system to") a desired Nyquist zone in a system having two ADCs clocked at different sampling frequencies, the sampled output of one of the ADCs is shifted in frequency, according to a function of the number of the desired Nyquist zone and the difference between the sampling clocks, in order to make signals components from the desired Nyquist zone line up. (As may be seen in FIG. 14C, it may be desired to select sampling clocks that are relatively close together (e.g., within ten percent, five percent, two percent, or one percent or less), as the width of the tunable band decreases according to the difference between these clocks as the Nyquist zone number increases.) To tune to the second Nyquist zone, for example, the output of the ADC having the lowest sampling frequency is shifted upward in frequency by the absolute difference between the two sampling frequencies. This frequency shift causes images of frequency components for only the second Nyquist zone to be aligned in the two ADC outputs, while also causing frequency components for the first Nyquist zone to become misaligned. In such manner, even signals and noise from the first Nyquist zone may be cancelled by common-mode filtering (e.g., by cross-correlation). Signals and noise from all the other Nyquist zones will fail to correlate and drop out as well.

To tune to the third Nyquist zone, the output of the ADC having the highest sampling frequency is shifted upward in frequency by the absolute difference between the two sampling frequencies. This frequency shift causes images of frequency components for only the third Nyquist zone to be aligned in the two ADC outputs, such that only data from these components will correlate, and components from all other Nyquist zones will drop out. In general, such a system can be tuned to a desired even-numbered Nyquist zone by multiplying one-half of the number of the desired Nyquist zone by the absolute difference between the two sampling frequencies, and shifting the output of the ADC having the lowest sampling frequency upward (or equivalently, shifting the output of the ADC having the highest sampling frequency downward) before common-mode filtering (e.g., correlation). In general, such a system can be tuned to a desired odd-numbered Nyquist zone by subtracting one from the number of the desired Nyquist zone, multiplying one-half of this result by the absolute difference between the two sampling frequencies, and shifting the output of the ADC having the highest sampling frequency upward (or equivalently, shifting the output of the ADC having the lowest sampling frequency downward) before common-mode filtering (e.g., correlation).

Figure 17A:
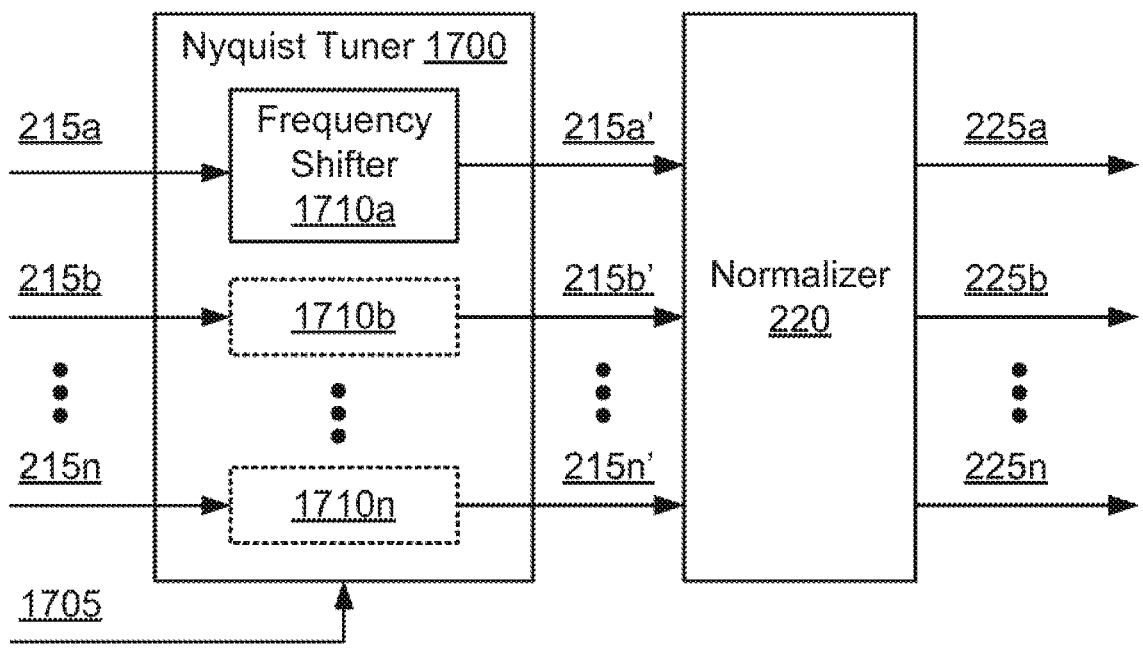
FIGS. 17A and 17B show block diagrams of Nyquist tuners 1700, according to various embodiments.
Figure 17B:
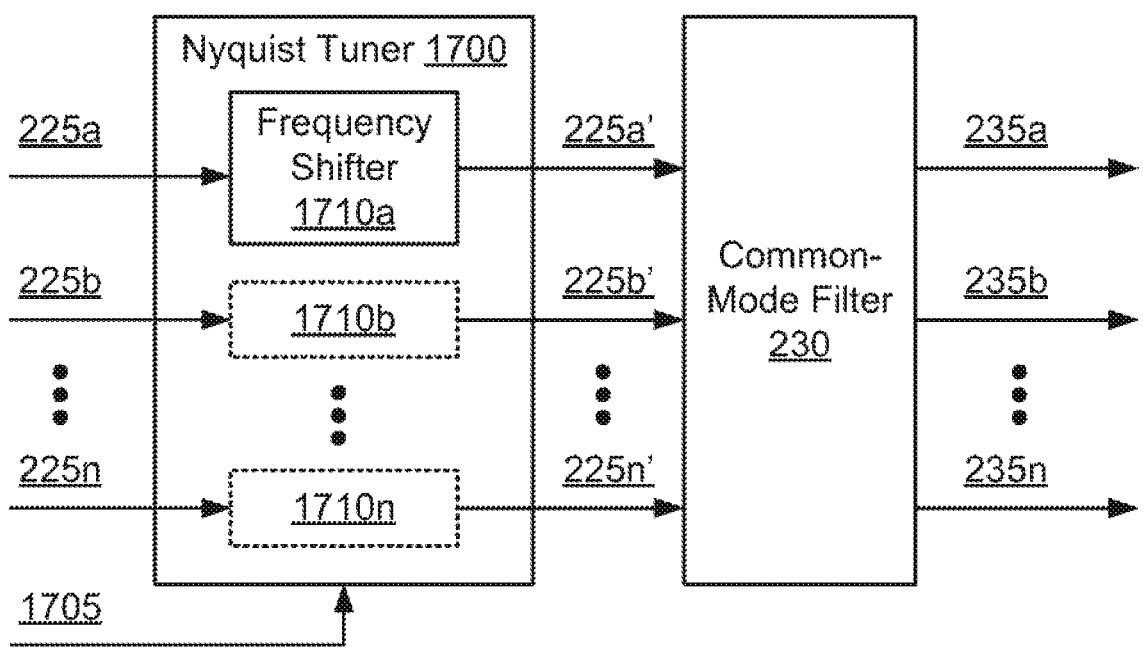

FIGS. 17A and 17B show block diagrams of Nyquist tuners 1700, according to various embodiments. In FIG. 17A, the Nyquist tuner 1700 is illustrated as including one or more frequency shifters 1710 implemented before the normalizer subsystem 220. Accordingly, each frequency shifter 1710 receives one of the digital input signals 215 and outputs a corresponding shifted digital input signal 215'. In FIG. 17B, the Nyquist tuner 1700 is illustrated as including one or more frequency shifters 1710 implemented before the common mode filter subsystem 230. Accordingly, each frequency shifter 1710 receives one of the common-bandwidth signals 225 and outputs a corresponding shifted common-bandwidth signal 225'. Each of the one or more frequency shifters 1710 (in FIG. 17A or 17B) can perform frequency shifting in the time domain and/or in the frequency domain, as desired. For example, though not shown, one or more domain transformers 620 can be used (before and/or after any or all frequency shifters 1710) to match the domain of any particular signal with the operating domain of a corresponding frequency shifter 1710, and/or to match the output of any frequency shifter 1710 with the operating domain of a downstream component (e.g., a component of the normalizer subsystem 220 in FIG. 17A, or a component of the common mode filter subsystem 230 in FIG. 17B).

Some embodiments can introduce frequency shifting to all signals (e.g., the digital input signals 215 in FIG. 17A, or the common-bandwidth signals 225 in FIG. 17B). Other embodiments can introduce frequency shifting to fewer than all signals (e.g., one or more digital input signals 215 in FIG. 17A, or one or more common-bandwidth signals 225 in FIG. 17B). Some embodiments introduce a same amount of frequency shifting to all shifted signals. Other embodiments introduce a different amount of frequency shifting to some or all of the shifted signals (e.g., all signals are shifted, but by different amounts, etc.).

The amount of frequency shifting applied to any signals can be a function of the Nyquist zones, which can be a function of one or more sampling frequencies, as discussed above. In some embodiments, the amount of frequency shifting introduced by some or all of the frequency shifters 1710 is pre-set (e.g., hard-coded). In some embodiments, the amount of frequency shifting introduced by some or all of the frequency shifters 1710 is dynamic (e.g., automatically adjusting based on a feedback control loop, or the like). In some embodiments, the amount of frequency shifting introduced by some or all of the frequency shifters 1710 is programmable (e.g., software-programmable, hardware-selectable, tunable, etc.). For example, as illustrated, some embodiments further include a tuning input signal 1705 as an input to the Nyquist tuner 1700. Such embodiments can receive the tuning input signal 1705 in a manner that indicates a selected Nyquist zone, and the frequency shifting is performed responsive to the tuning input signal 1705. In one implementation, the tuning input signal 1705 directly indicates or controls an amount of frequency shifting to apply. In another implementation, the tuning input signal 1705 indicates a Nyquist zone number, or otherwise indirectly indicates or controls an amount of frequency shifting to apply. For example, the frequency shifters 1710 can be implemented to convert an indicated Nyquist zone number to an amount of frequency shifting (e.g., based on a lookup table, or any other suitable approach). Such conversion may also be based on one or more of the sampling frequencies of ADCs 320a-n (e.g., as discussed herein with reference to FIGS. 16A-16D).

Figure 24A:
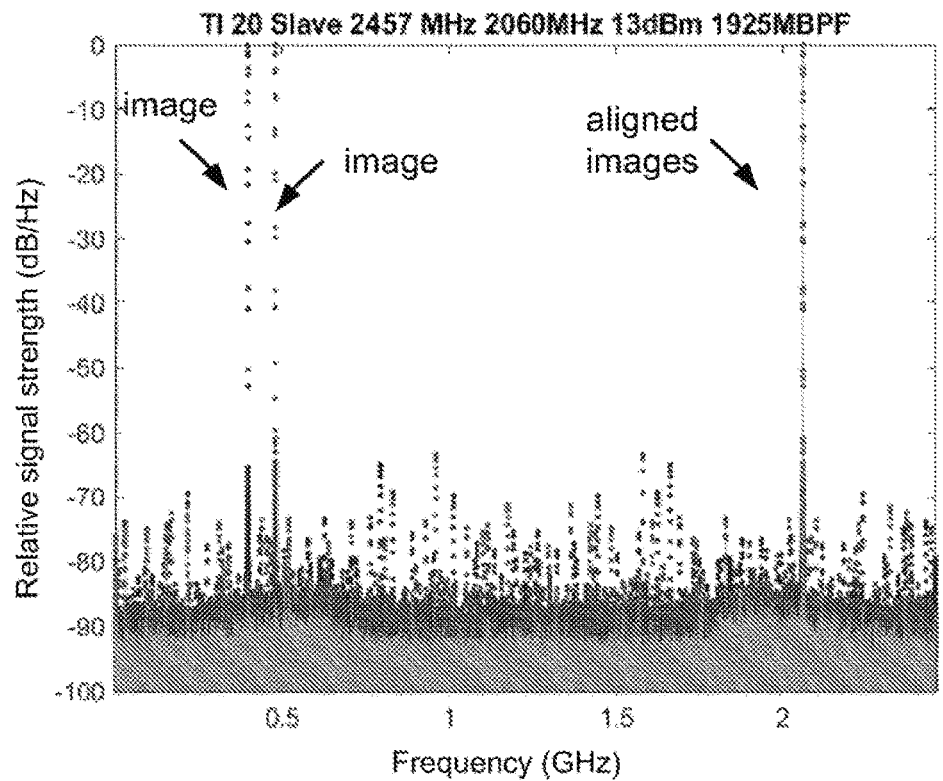
FIGS. 24A and 24B show frequency-domain outputs for an example of using a two-ADC implementation of system 202 for Nyquist tuning.
Figure 24B:
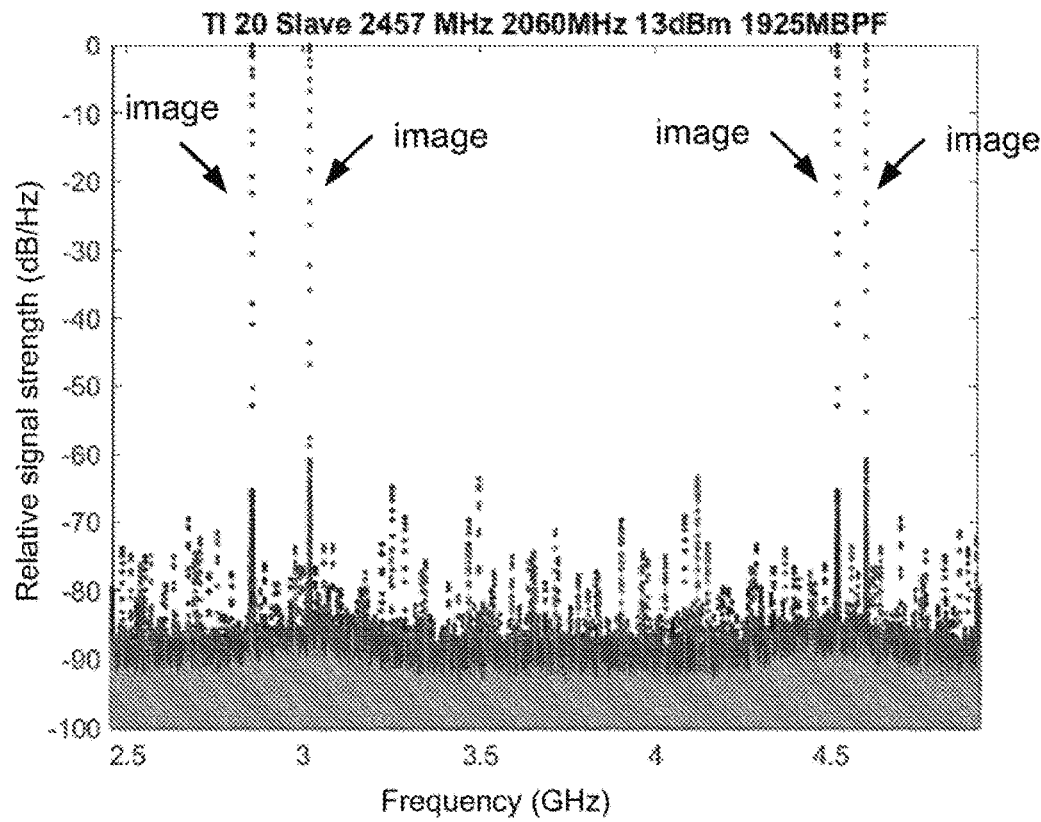

FIGS. 24A and 24B show frequency-domain outputs (frequency in GHz vs. relative signal strength in dB/Hz) for an example of using a two-ADC implementation of system 202 for tuning to the second Nyquist zone. In this example, the first ADC 320a is clocked at a frequency of 2539 MHz (master clock), with the corresponding sampled signal 215a being shown in blue; and the second ADC 320b is clocked at a frequency of 2457 MHz (slave clock), with the corresponding sampled signal 215b being shown in red. Output signal 235 is shown in green. FIG. 24A shows the first and second Nyquist zones, and FIG. 24B shows the third and fourth Nyquist zones.

In this example, data signal 205 has a signal component at 2060 MHz. The images of this signal component are clearly visible in these figures for each of the four Nyquist zones, and it may also be seen that the second Nyquist zone (1269.5-2457 MHz) is the only one in which the images align to produce a corresponding output on output signal 235.

Figure 18:
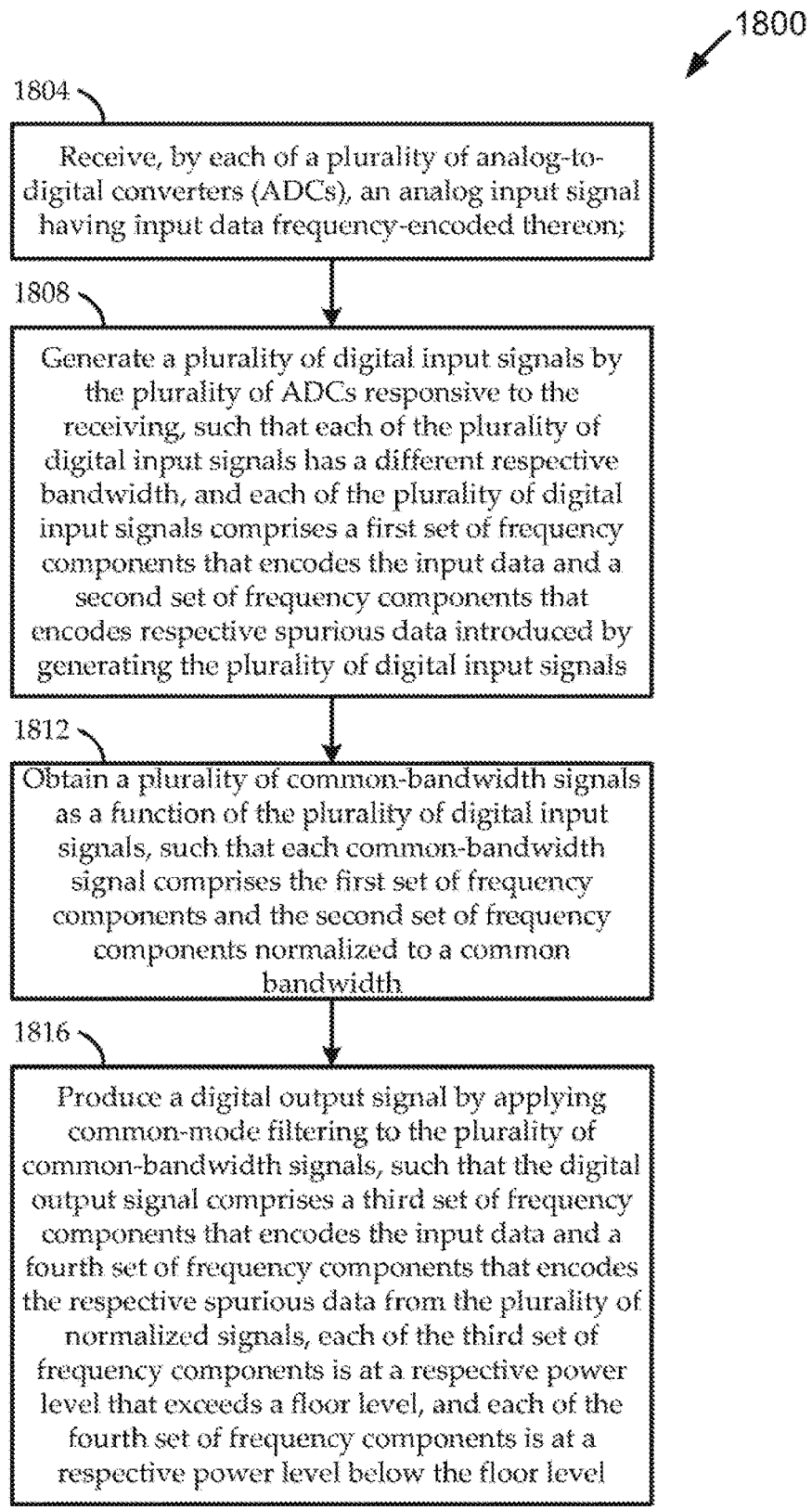
FIG. 18 shows a flow diagram of an illustrative method 1000 for spurious information reduction in a data signal, according to various embodiments.

The systems described above can perform various methods. For example, FIG. 18 shows a flow diagram of an illustrative method 1800 for spurious information reduction in a data signal, according to various embodiments. Embodiments of the method 1800 can begin at stage 1804 by receiving, by each of multiple ADCs, an analog input signal having input data frequency-encoded thereon. At stage 1808, embodiments can generate digital input signals by the ADCs responsive to the receiving, such that each digital input signal has a different respective bandwidth, and each of the digital input signals has a first set of frequency components that encodes the input data and a second set of frequency components that encodes respective spurious information introduced by generating the digital input signals.

At stage 1812, embodiments can obtain common-bandwidth signals as a function of the digital input signals. One or more of the common-bandwidth signals is computed at stage 1812, such that it is normalized to have a common bandwidth and includes the first set of frequency components and the second set of frequency components. At stage 1816, embodiments can produce a digital output signal by applying common-mode filtering to the common-bandwidth signals. As a result of the common-mode filtering, the digital output signal includes a third set of frequency components that encodes the input data and a fourth set of frequency components that encodes the respective spurious information from the common-bandwidth signals. In the digital output signal, each of the third set of frequency components is at a respective power level that exceeds a floor level, and each of the fourth set of frequency components is at a respective power level below the floor level.

The various techniques can be implemented with any suitable hardware and/or software component(s) and/or module(s), including, but not limited to circuits, application-specific integrated circuits (ASICs), optical processing techniques, general-purpose processors, digital signal processors (DSPs), field-programmable gate arrays (FPGAs), programmable logic devices (PLD), discrete gates, transistor logic devices (e.g., emitter-coupled logic (ECL)), discrete hardware components, or combinations thereof. For example, steps of methods or algorithms, or other functionality described in connection with embodiments, can be embodied directly in hardware, in a software module executed by a processor, or in a combination of the two. A software module may reside in any form of tangible storage medium. Some examples of storage media that may be used include random-access memory (RAM), read-only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer-readable tangible medium having instructions stored (and/or encoded) thereon, the instructions being executable by one or more processors to perform the operations described herein (e.g., a method for spurious information reduction in a data signal as disclosed herein). The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

The methods disclosed herein include one or more actions for achieving the described method. The method and/or actions can be interchanged with one another without departing from the scope of the claims. In other words, unless a specific order of actions is specified, the order and/or use of specific actions can be modified without departing from the scope of the claims. The various operations of methods and functions of certain system components described above can be performed by any suitable means capable of performing the corresponding functions.

Other examples and implementations are within the scope and spirit of the disclosure and appended claims. For example, features implementing functions can also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB (i.e., A and B) or AC or BC or ABC (i.e., A and B and C). Further, the term "exemplary" does not mean that the described example is preferred or better than other examples.

Unless expressly limited by its context, the term "signal" is used herein to indicate any of its ordinary meanings, including a state of a memory location (or set of memory locations) as expressed on a wire, bus, or other transmission medium. Unless expressly limited by its context, the term "generating" is used herein to indicate any of its ordinary meanings, such as computing or otherwise producing. Unless expressly limited by its context, the term "calculating" is used herein to indicate any of its ordinary meanings, such as computing, evaluating, estimating, and/or selecting from a plurality of values. Unless expressly limited by its context, the term "obtaining" is used to indicate any of its ordinary meanings, such as calculating, deriving, receiving (e.g., from another element or device), and/or retrieving (e.g., from an array of storage elements). Unless expressly limited by its context, the term "selecting" is used to indicate any of its ordinary meanings, such as identifying, indicating, applying, and/or using at least one, and fewer than all, of a set of two or more. Unless expressly limited by its context, the term "determining" is used to indicate any of its ordinary meanings, such as deciding, establishing, concluding, calculating, selecting, and/or evaluating. Where the term "comprising" is used in the present description and claims, it does not exclude other elements or operations. The term "based on" (as in "A is based on B") is used to indicate any of its ordinary meanings, including the cases (i) "derived from" (e.g., "B is a precursor of A"), (ii) "based on at least" (e.g., "A is based on at least B") and, if appropriate in the particular context, (iii) "the same as" or "equal to" (e.g., "A is the same as B," "A is equal to B"). Similarly, the term "in response to" is used to indicate any of its ordinary meanings, including "in response to at least." Unless otherwise indicated, the terms "at least one of A, B, and C," "one or more of A, B, and C," "at least one among A, B, and C," and "one or more among A, B, and C" indicate "A and/or B and/or C." Unless otherwise indicated, the terms "each of A, B, and C" and "each among A, B, and C" indicate "A and B and C."

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The term "configuration" may be used in reference to a method, apparatus, and/or system as indicated by its particular context. The terms "method," "process," "procedure," and "technique" are used generically and interchangeably unless otherwise indicated by the particular context. A "task" having multiple subtasks is also a method. The terms "apparatus" and "device" are also used generically and interchangeably unless otherwise indicated by the particular context. The terms "element" and "module" are typically used to indicate a portion of a greater configuration. Unless expressly limited by its context, the term "system" is used herein to indicate any of its ordinary meanings, including "a group of elements that interact to serve a common purpose."

Unless initially introduced by a definite article, an ordinal term (e.g., "first," "second," "third," etc.) used to modify a claim element does not by itself indicate any priority or order of the claim element with respect to another, but rather merely distinguishes the claim element from another claim element having a same name (but for use of the ordinal term). Unless expressly limited by its context, each of the terms "plurality" and "set" is used herein to indicate an integer quantity that is greater than one.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein can be utilized. Accordingly, the appended claims

What is claimed is:

1. An apparatus for spurious information reduction in a data signal, the apparatus comprising:
 a data converter including a plurality of analog-to-digital converters (ADCs), each of the plurality of ADCs being arranged to receive a corresponding one of a plurality of instances of an analog input signal,
  wherein each of the plurality of ADCs is configured to generate a corresponding one of a plurality of sampled signals, and
  wherein a first of the plurality of ADCs is configured to generate a first of the plurality of sampled signals by sampling a first of the plurality of instances of the analog input signal at a first sampling rate according to a first clock frequency, and
  wherein a second of the plurality of ADCs is configured to generate a second of the plurality of sampled signals by sampling a second of the plurality of instances of the analog input signal at a second sampling rate that is different than the first sampling rate according to a second clock frequency that is different than the first clock frequency;
 a normalizer configured to normalize at least one signal that is based on at least one of the plurality of sampled signals to obtain, from at least the plurality of sampled signals, a plurality of common-bandwidth signals, wherein each of the plurality of common-bandwidth signals is based on at least a corresponding one of the plurality of sampled signals, and
 a common-mode filter configured to perform a common-mode filtering operation, based on information from the plurality of common-bandwidth signals, to produce a digital output signal.

2. The apparatus according to claim 1, wherein each of the plurality of common-bandwidth signals is based on at least a corresponding one of the plurality of sampled signals and comprises an ordered sequence of values, and
 wherein each value of the ordered sequence of values of a first of the plurality of common-bandwidth signals represents a same interval of a domain of the analog input signal as a corresponding value of the ordered sequence of values of a second of the plurality of common-bandwidth signals.

3. The apparatus according to claim 2, wherein the data converter comprises a power divider configured to receive the analog input signal and to produce the plurality of instances of the analog input signal.

4. The apparatus according to claim 2, wherein the data converter is configured to receive each of the plurality of instances of the analog input signal from a corresponding one of a plurality of elements of an antenna array.

5. The apparatus according to claim 2, wherein the first clock frequency is mutually phase-coherent with the second clock frequency.

6. The apparatus according to claim 2, wherein the first of the plurality of sampled signals has a first bandwidth, and
 wherein the second of the plurality of sampled signals has a second bandwidth that is different than the first bandwidth, and
 wherein the normalizer is configured to resample the first of the plurality of sampled signals to the second bandwidth.

7. The apparatus according to claim 2, wherein the common-mode filtering operation is a common mode acceptance algorithm.

8. The apparatus according to claim 2, wherein the common-mode filter is configured to perform the common-mode filtering operation by performing a spectral analysis to determine frequency content in each of the plurality of common-bandwidth signals.

9. The apparatus according to claim 2, wherein the apparatus comprises a frequency shifter configured to produce the at least one signal by applying a frequency shift to at least one of the plurality of sampled signals to produce at least one frequency-shifted sampled signal, and
 wherein, for each respective one of the at least one frequency-shifted sampled signal, at least one of the plurality of common-bandwidth signals is based on the respective one of the at least one frequency-shifted sampled signal.

10. The apparatus according to claim 9, wherein the amount of the frequency shift is based on an indication that identifies a Nyquist zone among a plurality of Nyquist zones.

11. The apparatus according to claim 2, wherein the common-mode filter is configured to perform the common-mode filtering operation by:
 segregating each of the plurality of common-bandwidth signals into a same plurality of bins; and
 at each bin of at least a portion of the plurality of bins, computing a corresponding one of a plurality of output components based on a minimum magnitude for the bin as selected across the plurality of common-bandwidth signals, and
 wherein the digital output signal is based on the plurality of output components.

12. A method for spurious information reduction in a data signal, the method comprising:
 receiving, by each of a plurality of analog-to-digital converters (ADCs), a corresponding one of a plurality of instances of an analog input signal;
 generating, by each of the plurality of ADCs and responsive to the receiving, a corresponding one of a plurality of sampled signals, wherein the generating comprises:
  sampling a first of the plurality of instances of the analog input signal by a first of the plurality of ADCs at a first sampling rate according to a first clock frequency to generate a first of the plurality of sampled signals, and
  sampling a second of the plurality of instances of the analog input signal by a second of the plurality of ADCs at a second sampling rate that is different than the first sampling rate according to a second clock frequency that is different than the first clock frequency to generate a second of the plurality of sampled signals;
 normalizing at least one signal that is based on at least one of the plurality of sampled signals to obtain, from at least the plurality of sampled signals, a plurality of common-bandwidth signals, wherein each of the plurality of common-bandwidth signals is based on at least a corresponding one of the plurality of sampled signals, and
 performing a common-mode filtering operation, based on information from the plurality of common-bandwidth signals, to produce a digital output signal.

13. The method according to claim 12, wherein each of the plurality of common-bandwidth signals is based on at least a corresponding one of the plurality of sampled signals and comprises an ordered sequence of values, and
 wherein each value of the ordered sequence of values of a first of the plurality of common-bandwidth signals represents a same interval of a domain of the analog input signal as a corresponding value of the ordered sequence of values of a second of the plurality of common-bandwidth signals.

14. The method according to claim 13, wherein the receiving comprises receiving each of the plurality of instances of the analog input signal from a corresponding one of a plurality of elements of an antenna array.

15. The method according to claim 13, wherein the first of the plurality of sampled signals has a first bandwidth, and
wherein the second of the plurality of sampled signals has a second bandwidth that is different than the first bandwidth, and
wherein the normalizing comprises resampling the first of the plurality of sampled signals to the second bandwidth.

16. The method according to any one of claim 15, wherein the normalizing comprises resampling the first of the plurality of sampled signals to the second bandwidth by time-domain interpolating the first of the plurality of sampled signals.

17. The method according to claim 15, wherein the normalizing comprises resampling the first of the plurality of sampled signals to the second bandwidth by frequency-domain truncating the first of the plurality of sampled signals.

18. The method according to claim 13, wherein the normalizing comprises modifying an amplitude of at least one of the plurality of sampled signals relative to another of the plurality of sampled signals.

19. The method according to claim 13, wherein the method comprises producing the at least one signal by applying a frequency shift to at least one of the plurality of sampled signals to produce at least one frequency-shifted sampled signal, and
wherein, for each respective one of the at least one frequency-shifted sampled signal, at least one of the plurality of common-bandwidth signals is based on the respective one of the at least one frequency-shifted sampled signal.

20. The method according to claim 19, wherein the amount of the frequency shift is based on an indication that identifies a Nyquist zone among a plurality of Nyquist zones.

21. The method according to claim 13, wherein the common-mode filtering operation includes:
segregating each of the plurality of common-bandwidth signals into a same plurality of bins; and
at each bin of at least a portion of the plurality of bins, computing a corresponding one of a plurality of output components based on a minimum magnitude for the bin as selected across the plurality of common-bandwidth signals, and wherein the digital output signal is based on the plurality of output components.

22. A system for spurious information reduction in a data signal, the system comprising:
a data converter including a plurality of analog-to-digital converters (ADCs), each of the plurality of ADCs being arranged to receive a corresponding one of a plurality of instances of an analog input signal,
wherein each of the plurality of ADCs is configured to generate a corresponding one of a plurality of sampled signals, and
wherein a first of the plurality of ADCs is configured to generate a first of the plurality of sampled signals by sampling a first of the plurality of instances of the analog input signal at a first sampling rate according to a first clock frequency, and
wherein a second of the plurality of ADCs is configured to generate a second of the plurality of sampled signals by sampling a second of the plurality of instances of the analog input signal at a second sampling rate that is different than the first sampling rate according to a second clock frequency that is different than the first clock frequency, and
processing circuitry coupled to the data converter, the processing circuitry to:
normalize at least one signal that is based on at least one of the plurality of sampled signals to obtain, from at least the plurality of sampled signals, a plurality of common-bandwidth signals, wherein each of the plurality of common-bandwidth signals is based on at least a corresponding one of the plurality of sampled signals; and
perform a common-mode filtering operation, based on information from the plurality of common-bandwidth signals, to produce a digital output signal.

23. The system according to claim 22, wherein the first of the plurality of sampled signals has a first bandwidth, and
wherein the second of the plurality of sampled signals has a second bandwidth that is different than the first bandwidth, and
wherein the normalizer is configured to resample the first of the plurality of sampled signals to the second bandwidth.

* * * * *